US012787509B2

(12) United States Patent
Reinert et al.

(10) Patent No.: US 12,787,509 B2
(45) Date of Patent: Nov. 3, 2026

(54) METHOD FOR MANUFACTURING A CAP SUBSTRATE, METHOD FOR MANUFACTURING A HERMETICALLY HOUSED OPTOELECTRONIC DEVICE, AND HERMETICALLY HOUSED OPTOELECTRONIC DEVICE

(71) Applicant: Fraunhofer-Gesellschaft zur Foerderung der angewandten Forschung e.V., Munich (DE)

(72) Inventors: Wolfgang Reinert, Itzehoe (DE); Vanessa Stenchly, Itzehoe (DE); Hans-Joachim Quenzer, Itzehoe (DE); Dirk Kaehler, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 584 days.

(21) Appl. No.: 18/235,670

(22) Filed: Aug. 18, 2023

(65) Prior Publication Data

US 2024/0105883 A1 Mar. 28, 2024

Related U.S. Application Data

(63) Continuation of application No. PCT/EP2022/054057, filed on Feb. 18, 2022.

(30) Foreign Application Priority Data

Feb. 19, 2021 (EP) .................................... 21158288

(51) Int. Cl.
*H10F 71/00* (2025.01)
*C03B 23/035* (2006.01)
(Continued)

(52) U.S. Cl.
CPC ..... *H10H 20/8506* (2025.01); *C03B 23/0355* (2013.01); *C03B 23/0357* (2013.01);
(Continued)

(58) Field of Classification Search
None
See application file for complete search history.

(56) References Cited

U.S. PATENT DOCUMENTS

2005/0239228 A1 10/2005 Quenzer et al.
2006/0096321 A1 5/2006 Quenzer et al.
(Continued)

FOREIGN PATENT DOCUMENTS

DE 2524731 A1 1/1976
DE 19956654 A1 6/2001
(Continued)

*Primary Examiner* — Sarah K Salerno
(74) *Attorney, Agent, or Firm* — Perkins Coie LLP; Michael A. Glenn

(57) ABSTRACT

A method includes the steps of: providing a mold substrate and a cover substrate that are bonded to each other, wherein a surface region of the mold substrate and/or of the cover substrate is structured so as to form an enclosed cavity between the cover substrate and the mold substrate; tempering the cover substrate and the mold substrate so as to decrease the viscosity of the glass material of the cover substrate, and providing an overpressure in the enclosed cavity compared to the surrounding atmosphere so as to cause, on the basis of the decreased viscosity of the glass material of the cover substrate and the overpressure in the enclosed cavity compared to the surrounding atmosphere, bulging of the glass material of the cover substrate starting from the enclosed cavity up to a stop area, spaced apart from the cover substrate, of a stop element so as to acquire a
(Continued)

molded cover substrate with a cap element; and removing the stop element and the mold substrate from the molded cover substrate.

31 Claims, 31 Drawing Sheets

(51) Int. Cl.

| | |
|---|---|
| ***C03B 25/02*** | (2006.01) |
| ***C03C 27/00*** | (2006.01) |
| ***H01S 5/0222*** | (2021.01) |
| ***H01S 5/02234*** | (2021.01) |
| ***H01S 5/02257*** | (2021.01) |
| ***H10F 77/50*** | (2025.01) |
| ***H10H 20/85*** | (2025.01) |
| *C03C 17/00* | (2006.01) |
| *H01S 5/028* | (2006.01) |
| *H10H 20/01* | (2025.01) |

(52) U.S. Cl.
CPC ............ *C03B 25/025* (2013.01); *C03C 27/00* (2013.01); *H01S 5/0222* (2013.01); *H01S 5/02234* (2021.01); *H01S 5/02257* (2021.01); *H10F 71/00* (2025.01); *H10F 77/50* (2025.01); *C03C 17/00* (2013.01); *H01S 5/028* (2013.01); *H10H 20/036* (2025.01)

(56) References Cited

U.S. PATENT DOCUMENTS

| | | | |
|---|---|---|---|
| 2006/0219653 | A1 | 10/2006 | Quenzer et al. |
| 2010/0330332 | A1 | 12/2010 | Quenzer et al. |

FOREIGN PATENT DOCUMENTS

| | | | |
|---|---|---|---|
| DE | 10118529 | C1 | 10/2002 |
| DE | 10241390 | B3 | 4/2004 |
| DE | 10259890 | A1 | 7/2004 |
| DE | 10313889 | B3 | 8/2004 |
| DE | 102008012384 | A1 | 9/2009 |
| IL | 45035 | A | 7/1977 |
| WO | 2013079131 | A1 | 6/2013 |
| WO | 2019020708 | A1 | 1/2019 |

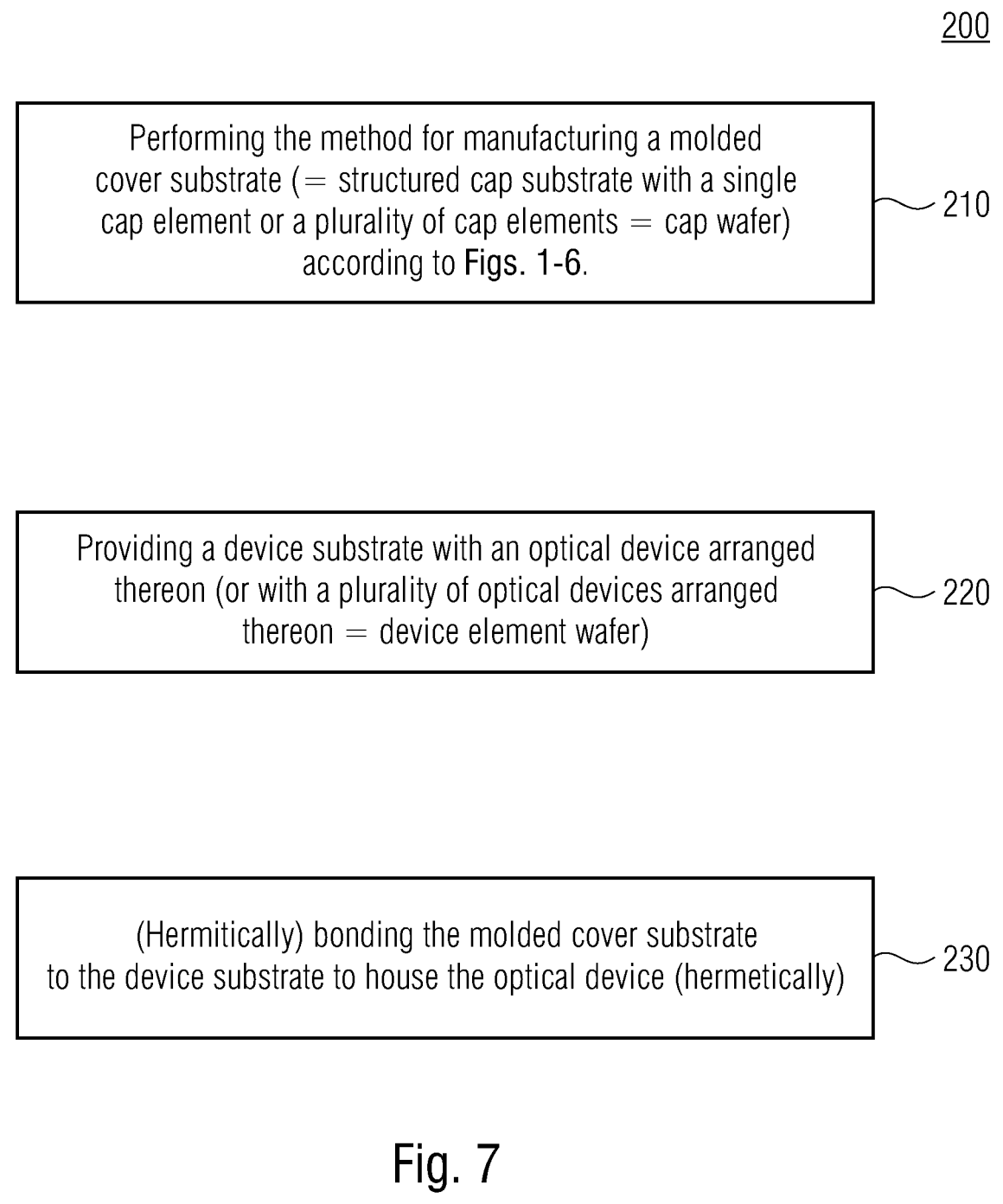

200

Performing the method for manufacturing a molded cover substrate (= structured cap substrate with a single cap element or a plurality of cap elements = cap wafer) according to Figs. 1-6. — 210

Providing a device substrate with an optical device arranged thereon (or with a plurality of optical devices arranged thereon = device element wafer) — 220

(Hermitically) bonding the molded cover substrate to the device substrate to house the optical device (hermetically) — 230

Fig. 7

METHOD FOR MANUFACTURING A CAP SUBSTRATE, METHOD FOR MANUFACTURING A HERMETICALLY HOUSED OPTOELECTRONIC DEVICE, AND HERMETICALLY HOUSED OPTOELECTRONIC DEVICE

CROSS-REFERENCES TO RELATED APPLICATIONS

This application is a continuation of copending International Application No. PCT/EP2022/054057, filed Feb. 18, 2022, which is incorporated herein by reference in its entirety, and additionally claims priority from European Application No. EP 21 158 288.7, filed Feb. 19, 2021, which is incorporated herein by reference in its entirety.

BACKGROUND OF THE INVENTION

The present invention relates to a method for manufacturing a cap substrate, such as for manufacturing a cap substrate for housing (=accommodating in a housing) one or a plurality of optical or optoelectronic devices, wherein a cover substrate molded in the manufacturing method forms the cap substrate with at least one cap element. The present invention further relates to a method for manufacturing a hermetically housed optical or optoelectronic device, wherein the manufacturing may be performed individually (on the individual substrate level) or on the wafer level. The present invention further relates to a hermetically housed optical or optoelectronic device that is manufactured, or housed, with this manufacturing method.

For example, a capping concept for optical or optoelectronic devices, such as LEDs or laser diodes, is provided, wherein the manufacturing method may be performed on the wafer level and/or the individual substrate level so as to house the optoelectronic devices with a cap substrate with optically passive (=optically neutral) lateral window regions.

Currently, for example, blue and green laser diodes find broader and broader fields of use. The use of blue laser diodes as decisive device in reading-out high density optical storage mediums, such as Blu-ray, is established and broadly employed. Meanwhile, manifold further applications of high performance blue and green laser diodes are emerging, for example as RGB sources in mobile image and video projections (projectors). Both green and blue laser diodes should be packed (housed) within a housing in a hermetically sealed manner. It is possible to cap such laser diodes with a capping technology with special TO headers (e.g. TO 38) comprising integrated optical windows and a copper seat sink.

In addition to the mentioned consumer applications, in the field of medical and industrial spectroscopy, there is also a need for hermetically capped semiconductor-based light sources with a particularly high level of heat dissipation and organics-free housing so as to guarantee the required long service lives.

It is therefore the underlying object of the present invention to provide an improved method for manufacturing a cap substrate, e.g. for capping optoelectronic (radiation-emitting or radiation-sensitive) devices, and to further provide an improved method for manufacturing a hermetically housed optoelectronic device, accordingly resulting in housed optoelectronic devices with improved properties.

SUMMARY

An embodiment may have a method, comprising: providing a mold substrate and a cover substrate that are bonded to each other, wherein a surface region of the mold substrate and/or of the cover substrate is structured so as to form an enclosed cavity between the cover substrate and the mold substrate, tempering the cover substrate and the mold substrate so as to decrease the viscosity of the glass material of the cover substrate, and providing an overpressure in the enclosed cavity compared to the surrounding atmosphere so as to cause, on the basis of the decreased viscosity of the glass material of the cover substrate and the overpressure in the enclosed cavity compared to the surrounding atmosphere, bulging of the glass material of the cover substrate starting from the enclosed cavity up to a stop area, spaced apart from the cover substrate, of a stop element so as to acquire a molded cover substrate with a cap element; and removing the stop element and the mold substrate from the molded cover substrate.

Another embodiment may have a method for manufacturing a hermetically housed optical device, comprising: performing the method for manufacturing a molded cover substrate according to the invention, providing a device substrate with an optical device arranged thereon, and bonding the molded cover substrate with the device substrate so as to house the optical device.

Another embodiment may have a hermetically housed optical device manufactured with the manufacturing method according to the invention, comprising: an optical device arranged on the device substrate; and a molded integral cover substrate providing a hermetically sealed cover for the optical device, within which the optical device is housed, wherein the molded cover substrate comprises a cap element with a bulged sidewall region between a socket region and a ceiling region.

OVERVIEW ON THE INVENTIVE CONCEPT (=METHOD AND APPARATUS)

The present invention is based on the finding that a cap substrate with glass closure cap elements for housing optoelectronic devices may be obtained and provided with the manufacturing methods shown, wherein the cap elements laterally comprise very thin optical (=optically neutral) glass window areas (for lateral radiation). The optical refractive power of very thin optical glass windows is so low that an optically planar area is (often) not required to manufacture a glass closure cap for housing optoelectronic (radiation-emitting or radiation-sensitive) devices (semiconductor devices). These thin-walled window areas behave in an optically passive, or optically neutral way (=they have no optical effect). In particular, planarity is not required when the variations of thickness of the windows are sufficiently small. Since (relevant) laser diodes essentially have a variation in their angular distribution (divergence portion) of the emission, small changes do not play any (essential) role for the optical properties of the housing. If the radiation emitted by the semiconductor emitters (or the radiation received by the semiconductor receivers) is to be collimated, focused, or diverted, this takes place via additional optical devices that are mounted either within the sealed housing or outside on a so-called optical bank.

In addition, a further finding of the present invention is that such a cap substrate for an improved housed optoelectronic (radiation-emitting or radiation-sensitive) device (semiconductor device) may be particularly manufactured advantageously on the wafer level with a significantly decreased effort. Using a mold substrate for molding cap substrates by glass flow methods, window regions that are optically largely neutral may be formed in a cap substrate, enabling to subsequently hermetically-tightly cap sensitive radiation sources or radiation receivers.

For example, a mold substrate is a substrate with a shape, a contour, or a topography, such as a topographically structured substrate.

Thus, according to embodiments, such a cap substrate (=molded cover substrate) may be manufactured for an improved housed (or packaged) optoelectronic device particularly advantageously on the wafer level with significantly reduced effort, since, e.g., only one (a single) glass material is used. Using a mold substrate for molding cap substrates by means of a glass flow method, a large number of glass caps with identically molded optically neutral window areas may be formed in a cap substrate, enabling to subsequently cap in a hermetically sealed manner sensitive optoelectronic devices, such as sensitive radiation sources or reception elements. If required for structural reasons, these molded glass cap substrates may also be diced, and the caps may be used for an individual capping on certain carrier substrates both on the wafer level as well as on the individual substrate level.

Thus, it can be achieved that the housed (or packaged) optoelectronic (radiation-emitting and/or radiation-sensitive) devices (semiconductor devices) have a long service life with consistently good radiation and performance quality. In particular, cloudiness of the outlet window and damage of the laser facets may be decreased or prevented, since an influence of water vapor and/or volatile organic components under the effect of the extremely intensive and high-energy laser radiation may be decreased or prevented. In addition, the heat dissipation out of the housing may be improved. Furthermore, due to a relatively low manufacturing effort, low manufacturing costs may be achieved.

BRIEF DESCRIPTION OF THE DRAWINGS

Embodiments of the present invention will be detailed subsequently referring to the appended drawings, in which:

FIG. 7 shows a schematic flow diagram of the inventive method for manufacturing a hermetically sealed optoelectronic device according to an embodiment;

DETAILED DESCRIPTION OF THE INVENTION

Figure 1:
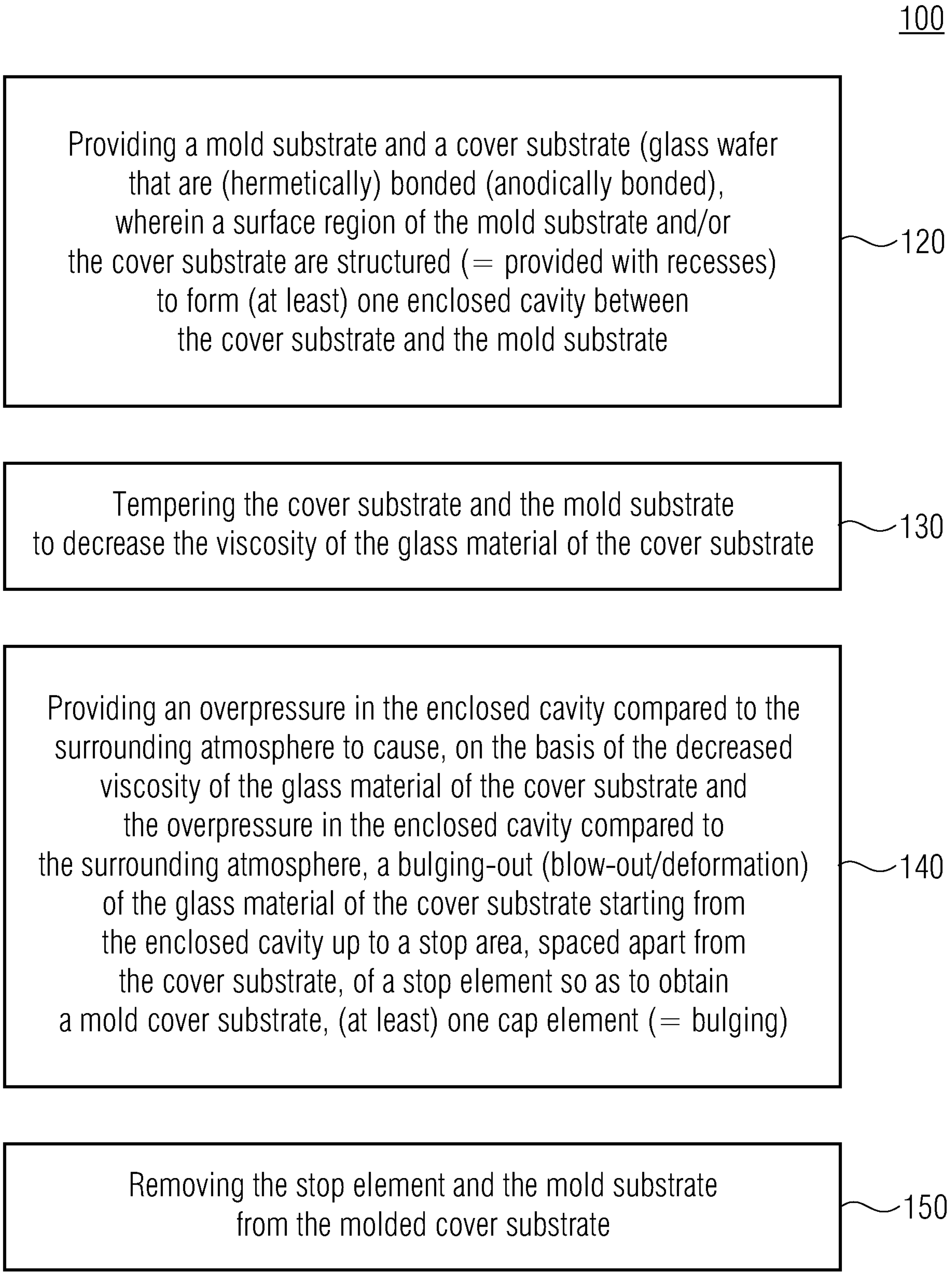
FIG. 1 shows a schematic flow diagram of an inventive manufacturing method according to an embodiment.

Before embodiments of the present invention are subsequently described in detail on the basis of the drawings, it is to be noted that identical or functionally identical elements, objects, functional blocks, and/or method steps, or elements, objects, functional blocks, and/or method steps having the same effect are provided in the different drawings with the same reference numerals so that the description of these elements, objects, functional blocks and/or method steps in the description illustrated in the different embodiments is interchangeable or may be applied to each other (with the same reference numerals).

In the subsequent description, the description that an element is made of a semiconductor material means that the element comprises a semiconductor material, i.e. it is at least partially or fully formed of the semiconductor material. In the subsequent description, the description that an element is made of a glass material means that the element comprises a glass material, i.e. it is at least partially or fully formed of the glass material.

It is to be noted that, if an element is referred to as being "bonded" or "coupled" or "connected" to another element, it may be directly bonded or coupled or connected to the other element or that there may be intermediate elements. On the other hand, if an element is referred to as being "directly bonded" or "directly coupled" or "directly connected" to another element, there are no intermediate elements. Other terms used to describe the relationship between elements are to be interpreted in the same way (e.g. "between" compared to "directly between", "adjacent" compared to "directly adjacent", etc.).

To simplify the description of the different embodiments, at least some of the drawings comprise a Cartesian coordinate system, x, y, z, wherein the directions x, y, z are arranged to be orthogonal to each other. In the embodiments, the x-y plane corresponds to the main surface area of a carrier, or substrate (=reference plane=x-y plane), wherein the direction vertical thereto towards the upside with respect to the reference plane (x-y plane) corresponds to the "+z" direction, and wherein the direction vertically downwards with respect to the reference plane (x-y plane) corresponds to the "−z" direction. In the following description, the term "lateral" refers to a direction in parallel to the x and/or y direction, i.e. in parallel to the x-y plane, wherein the term "vertical" indicates a direction in parallel to the +/−z direction.

In the context of the present description, terms and/or text passages placed in brackets are to be understood as further explanations, exemplary designs, additions and/or exemplary alternatives (to the term of the text passage preceding the bracket).

Now, FIG. 1 exemplarily shows a fundamental flow diagram of the inventive method 100 according to embodiments. For example, the flow diagram of FIG. 1 shows a method 100 for manufacturing a cap substrate for housing one or a plurality of optical or optoelectronic devices (semiconductor devices), wherein the molded cover substrate then forms the cap substrate with the at least one cap element for housing the optoelectronic device. An optoelectronic device (semiconductor device) is a radiation-emitting and/or radiation-sensitive semiconductor device, such as an optoelectronic transmission device and/or reception device.

Since, for the inventive method for manufacturing a cap substrate for housing one or a plurality of optical/optoelectronic devices, e.g. on the wafer level, a mold substrate comprising a semiconductor material, e.g. formed as a preprocessed silicon wafer, is used, reference is made in the following to a silicon mold substrate or silicon wafer. However, it is to be noted that the use of silicon as a material for the mold substrate (semiconductor wafer) is only an example, wherein other suitably processable materials or semiconductor materials may be used for the mold substrate depending on the application case, or manufacturing process.

With reference to method 100 of FIG. 1, at step 120, a mold substrate and a cover substrate that are bonded (or connected) to each other are provided, wherein a surface region of the mold substrate and/or of the cover substrate are (configured to be) structured so as to form (at least) one enclosed cavity between the cover substrate and the mold substrate.

According to an embodiment, the mold substrate may be configured as a semiconductor substrate (semiconductor wafer or silicon wafer) and the cover substrate may be configured as a glass substrate, or glass wafer. According to an embodiment, the mold substrate and the cover substrate are hermetically bonded, or joined (or connected), to each other, wherein, e.g., this may be achieved by means of an anodic bonding process or any other joining process. Furthermore, a surface region of the mold substrate and/or of the cover substrate is provided with a recess, or several recesses, so as to form the enclosed cavity between the cover substrate and the mold substrate.

For example, the cover substrate comprises a single homogenous material, or glass material, so as to form the molded cover substrate as a cap substrate, or glass caps, with the following manufacturing steps.

For example, the mold substrate is a substrate with a shape, contour or topography, such as a topographically structured substrate. For example, the mold substrate may be configured as a semiconductor wafer, such as a silicon wafer, wherein the surface structuring, or the topography of the mold substrate, may be obtained very precisely by means of semiconductor processing process steps (such as silicon processing process steps). Such semiconductor processing processes, e.g. photolithographic processes with wet or dry etching processes, are technically managed very well. Furthermore, mechanical surface processing methods, such as CNC cutting, may be applied for forming the structure in the mold substrate. Furthermore, in addition semiconductor materials such as Si, SiGe, other materials such as AlN, SiC, high-melting glass (e.g. Schott AF 32), may be used for the mold substrate, suitable for photolithographic or mechanical surface processing methods for forming the structure in the mold substrate and further being sufficiently temperature-stable in the tempering processes (temperature processing processes) during the method for manufacturing the cap substrate.

In a (subsequent) step 130, the cover substrate and the mold substrate are now tempered, i.e. they are subjected to temperature treatment, or they are heated (warmed), so as to decrease the viscosity of the glass material of the cover substrate. Furthermore, in a step 140, an overpressure in the (at least one) enclosed cavity, or the enclosed cavities, compared to the surrounding atmosphere is provided so as to cause, on the basis of the decreased viscosity of the glass material of the cover substrate and the overpressure in the enclosed cavity compared to the surrounding atmosphere, a defined bulging, such as blow-out or deformation, of the glass material of the cover substrate starting from the enclosed cavity up to a stop area (or locating surface) of a stop element (or mechanical stop element) spaced apart from the cover substrate. The defined bulging of the glass material due to the overpressure in the enclosed cavity and the decreased viscosity of the glass material may also be referred to as blow-out or deformation of the glass material. By means of the defined bulging of the glass materials of the cover substrate, a molded cover substrate with (at least) one cap element (=bulge or deformation) is therefore obtained. Thus, the obtained bulge or deformation of the molded cover substrate (=cap substrate) is referred to as cap element.

Due to the defined bulging of the glass material of the cover substrate, side areas with high planarity (low variations in thickness of the side windows) are obtained in the resulting cap element of the molded cover substrate, so that "optically passive" side windows are obtained in the respective cap elements of the molded cover substrate. For example, optical window areas are considered to be such regions of the cap wafer whose wall thickness homogeneity does not differ by more than 15% or 10% across the region illuminated by the beam. For example, the wall thickness of the optically passive (=neutral) side windows in the respective cap elements, i.e. in the optically trans-irradiated region of the cap elements, e.g., is configured with the illustrated manufacturing method to be thin and uniform to such an extent that the optical influence on the beam divergence is neglectable, i.e. e.g. a divergence of less than 0.5° or less than 0.3°. To this end, the wall thickness of the side windows in this region is configured to be no thicker than 200 μm, 120 μm or 60 μm, e.g. in a thickness range between 5 and 200 μm, between 5 and 120 μm, or between 5 and 60 μm. In the context of the present description, the expansion or the radiation angle of the incident or outgoing radiation, e.g. of a laser beam and/or LED radiation, is referred to as the divergence of the transmission and/or reception radiation.

An important difference of the optically thin side windows compared to a lens is the fact that a window is optically neutral, as far as possible, or acts only as a very long-focal length lens (=lens with a long focal length). The latter case may be tolerated for lasers (and light sources), since, on the one hand, the emission angles of the lasers themselves have a range of fluctuation and, on the other hand, optical lenses are required for beamforming and adjusted anyway. If, in this case, there is a low refractive power and as large a homogeneity of the window as possible as well, the higher-order optical aberrations (coma, spherical aberrations, etc.) may be below a critical threshold. This may be realized that the wavefronts, due to the summed-up non-global Zernicke coefficients (global: lateral, tilt, global focus; non-global: e.g. coma, spherical aberrations, etc.) do not exceed a size of approximately 150 nm RMS in the wavefront deformation. In the present manufacturing technology, this may be achieved by the window being configured so to be thin, which is why the optical refractive power of the window is reduced and the inner and outer areas of the window become more and more similar for manufacturing reasons. Both effects lead to significantly decreased optical aberrations.

Thus, according to an embodiment, in the step of tempering and providing an overpressure, high planarity of the surfaces and high parallelism of the inner and outer areas of the lateral sidewall regions of the cap elements of the molded cover substrate are achieved.

In a subsequent step 150, the stop elements and the mold substrate are now removed from the molded cover substrate, wherein the molded cover substrate now forms the cap substrate with the at least one cap element. As the subsequent explanations will show, the cap substrate may be used for housing one or a plurality of optical or optoelectronic devices.

As mentioned above, according to an embodiment, the cover substrate comprises a single homogenous material, such as a glass material, so as to form the molded cover substrate, i.e. the cap substrate, or the glass cap, from a single surrounding material. Thus, the individual cap elements are formed as one piece (integral) from a single homogenous material, e.g. the glass material.

In this connection, e.g., reference is made to FIGS. 2A-6C and the associated description of the fundamental process diagrams of possible implementations of the inventive manufacturing method 100 in which the manufacturing steps are shown, or implemented.

According to an embodiment, the step 120 of providing the mold substrate and the cover substrate that are bonded to each other may now comprise the following steps (sub-steps). First, in a step 110, the mold substrate, e.g. a silicon wafer, with the structured (=provided with recesses or trenches) surface region is provided. Furthermore, the cover substrate, e.g. a glass wafer, is provided.

In a step 112, the cover substrate is arranged on the structured surface region of the mold substrate, wherein the cover substrate comprises a glass material. Thus, for example, the surface region, adjacent to the mold substrate (=opposite to the same), of the cover substrate may be configured to be planar (without recesses or trenches).

In a step 114, the cover substrate is now bonded, or joined, to the mold substrate, e.g. hermetically bonded by means of anodic bonding or any other joining technique, so as to form at least one enclosed cavity (or a plurality of enclosed cavities) between the cover substrate and the mold substrate. Here, the recess arranged in the mold substrate, or the recesses arranged in the mold substrate, then each form(s) the at least one enclosed cavity between the cover substrate and the mold substrate.

According to a further embodiment, the step 110 of providing the mold substrate and the cover substrate may further comprise the following steps, or sub-steps. Thus, in a step 112-1, the mold substrate, e.g. a silicon wafer, may be provided. In a step 114-1, the cover substrate, e.g. a glass wafer, comprising a structured (=provided with recesses) surface region may be arranged, or positioned, on the mold substrate. Thus, for example, the surface region of the mold substrate adjacent to the cover substrate, or opposite to the same, may comprise a planar shape.

In the step 114, the cover substrate is now bonded, or joined, to the mold substrate, e.g. hermetically bonded by means of anodic bonding or by means of a joining process, so as to form the at least one enclosed cavity or the plurality of enclosed cavities between the cover substrate and the mold substrate. The at least one enclosed cavity is configured by the recess(es), or structure(s) arranged in the cover substrate, for example.

According to a further alternative embodiment, the mold substrate as well as the cover substrate may comprise a structured surface region provided with recesses so as to together form the at least one enclosed cavity between the cover substrate and the mold substrate. In this case, for example, in (aligned) arranging the cover substrate at the mold substrate, the recesses provided in the cover substrate and the mold substrate may be aligned with respect to each other so as to form, in the step of bonding, e.g. hermetically bonding by means of anodic bonding, the enclosed one or more cavities between the cover substrate and the mold substrate.

According to an embodiment of the method, "hermetically" bonding the cover substrate with the mold substrate is carried out in an atmosphere with a defined atmospheric ambient pressure so as to enclose a defined atmospheric pressure into the enclosed cavities. In this connection, for example, reference is also made to the embodiments illustrated on the basis of FIGS. 2A-6C and the associated description.

According to an embodiment of the method, the cover substrate and/or the mold substrate is/are configured to form the enclosed cavity with a plurality of enclosed cavity regions between the cover substrate and the mold substrate, wherein the enclosed cavity regions are arranged so as to be fluidically separated from each other. According to a further embodiment, gas exchange channels are further provided between the cavity regions enclosed from the ambient atmosphere so as to fluidically couple the same to obtain a common defined atmospheric pressure in the coupled cavity regions compared to the ambient atmosphere. In this connection, for example, reference is also made to FIGS. 2A-6C and the associated description.

According to an embodiment of the method 100, the step of tempering and providing an overpressure is carried out as a glass flow process, for example in a negative-pressure furnace so as to obtain a defined atmospheric overpressure in the enclosed cavity compared to the surrounding atmosphere. In this connection, for example, reference is also made to FIGS. 2A-6C and the associated description.

According to an embodiment, the method 100 further includes the following steps: cooling the stop element, the mold substrate, and the molded cover substrate, and subsequently removing the mold substrate by means of an etching process, e.g. by means of a semiconductor etching process or a silicon etching process of the semiconductor material or the silicon material of the mold substrate. In this connection, for example, reference is also made to FIGS. 2A-6C and the associated description.

According to an embodiment, the method further comprises the following step: subsequently removing the stop element by means of an etching process. In this connection, for example, reference is also made to FIGS. 2A-6C with the associated description.

According to an embodiment of the method, in the step of tempering and providing an overpressure, the cover substrate is bulged, or blown-out, in the region of the enclosed cavity up to a height specified by the vertical distance of the stop area ("planar stop area") to the cover substrate. In this connection, for example, reference is also made to FIGS. 2A-6C and the associated description.

According to an embodiment of the method 100, the region of the stop area, opposite the cavity or the cavity regions, of the stop element is configured to be planar and parallel to the main surface region of the cover substrate (parallel to the reference plane) so as to form a planar ceiling region of the cap element in the step of tempering and providing an overpressure. In this connection, for example, reference is also made to FIGS. 2A-6C and the associated description.

According to an embodiment of the method, in cooling the molded cover substrate in a temperature range above 650° C., e.g. between 650° C. and 950° C., or between 650° C. and 750° C., an atmospheric overpressure in the enclosed cavities compared to the surrounding atmosphere is caused so as to generate a (e.g. convex) bulge of the sidewall regions (=side windows="optically passive" side windows) of the cap element of the formed cover substrate towards the outside.

According to an embodiment of the method 100, the step of tempering and providing an overpressure is carried out in a negative-pressure furnace, wherein the atmospheric overpressure in the enclosed cavities compared to the surrounding atmosphere is achieved by a decreased atmospheric pressure in the negative-pressure furnace. In this connection, for example, reference is also made to FIGS. 2A-6C and the associated description.

According to an embodiment of the method, in cooling the molded cover substrate in a temperature range above 650° C., e.g. between 650° C. and 950° C., or between 650° C. and 750° C., an atmospheric negative pressure in the enclosed cavities compared to the surrounding atmosphere is caused so as to generate a (concave) bulge of the sidewall regions (=side windows) of the cap element of the molded cover substrate towards the inside.

According to an embodiment of the method 100, the step of tempering and providing an overpressure is carried out in a negative-pressure furnace, wherein the atmospheric negative pressure in the enclosed cavities compared to the surrounding atmosphere is further obtained by an increased atmospheric pressure in the negative-pressure furnace. In this connection, for example, reference is also made to FIGS. 2A-6C and the associated description.

According to an embodiment of the method 100, the stop element (=chuck) is configured as a reusable tool and comprises a non-stick coating for the glass material of the cover substrate at least at the region, opposite the cavity, of the stop area or at an entire stop area. In this connection, for example, reference is also made to FIGS. 2A-6C and the associated description.

For example, the stop element may comprise a semiconductor material, such as silicon, or may consist of the same, and may comprise an at least regionally or fully planar stop area opposite the cover substrate. In addition to a semiconductor device, the stop element may also comprise other materials, such as silicon carbide (SiC), graphite or aluminum nitrate (AlN), or may consist thereof.

Figure 5A:
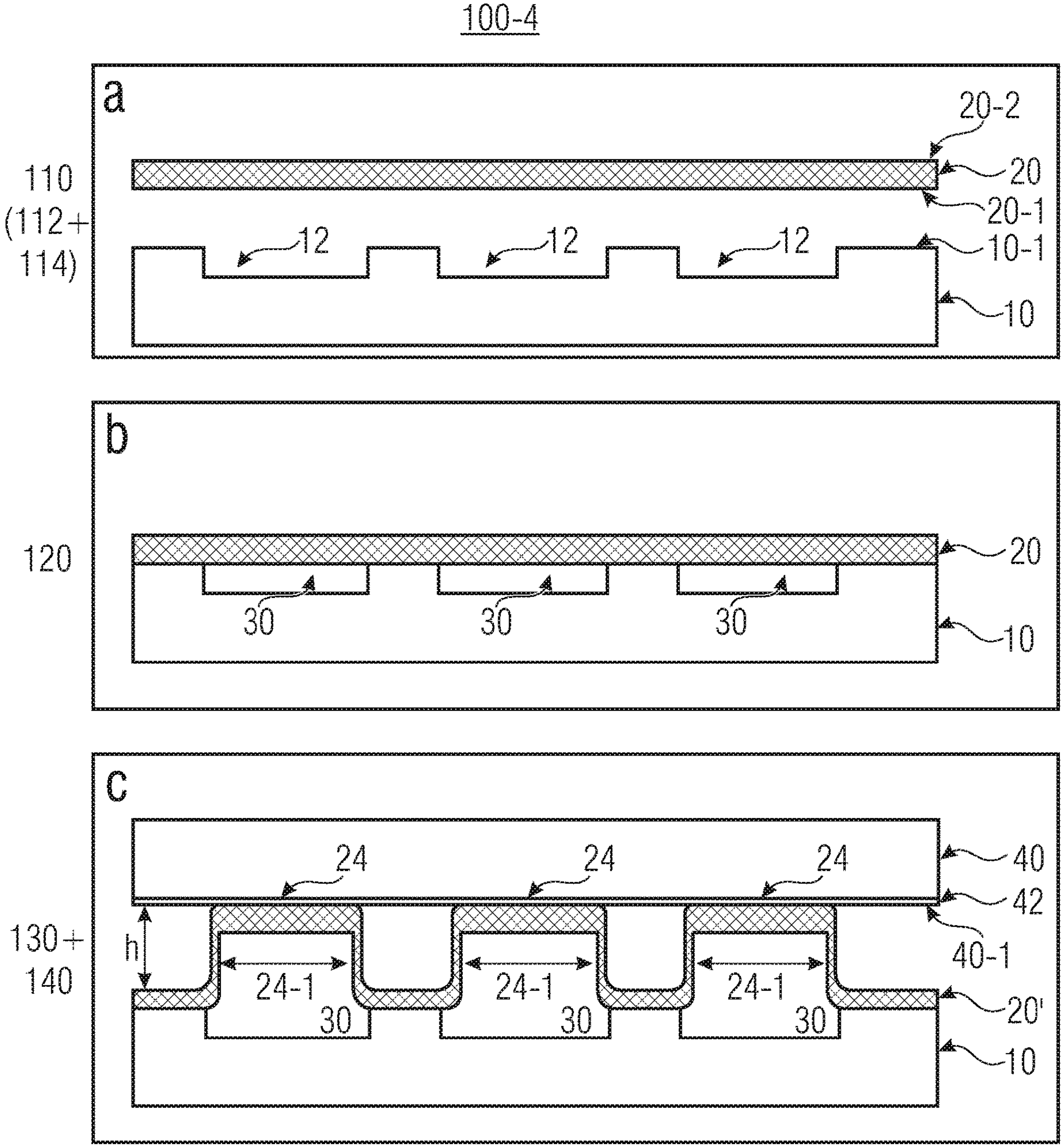
Figure 5B:
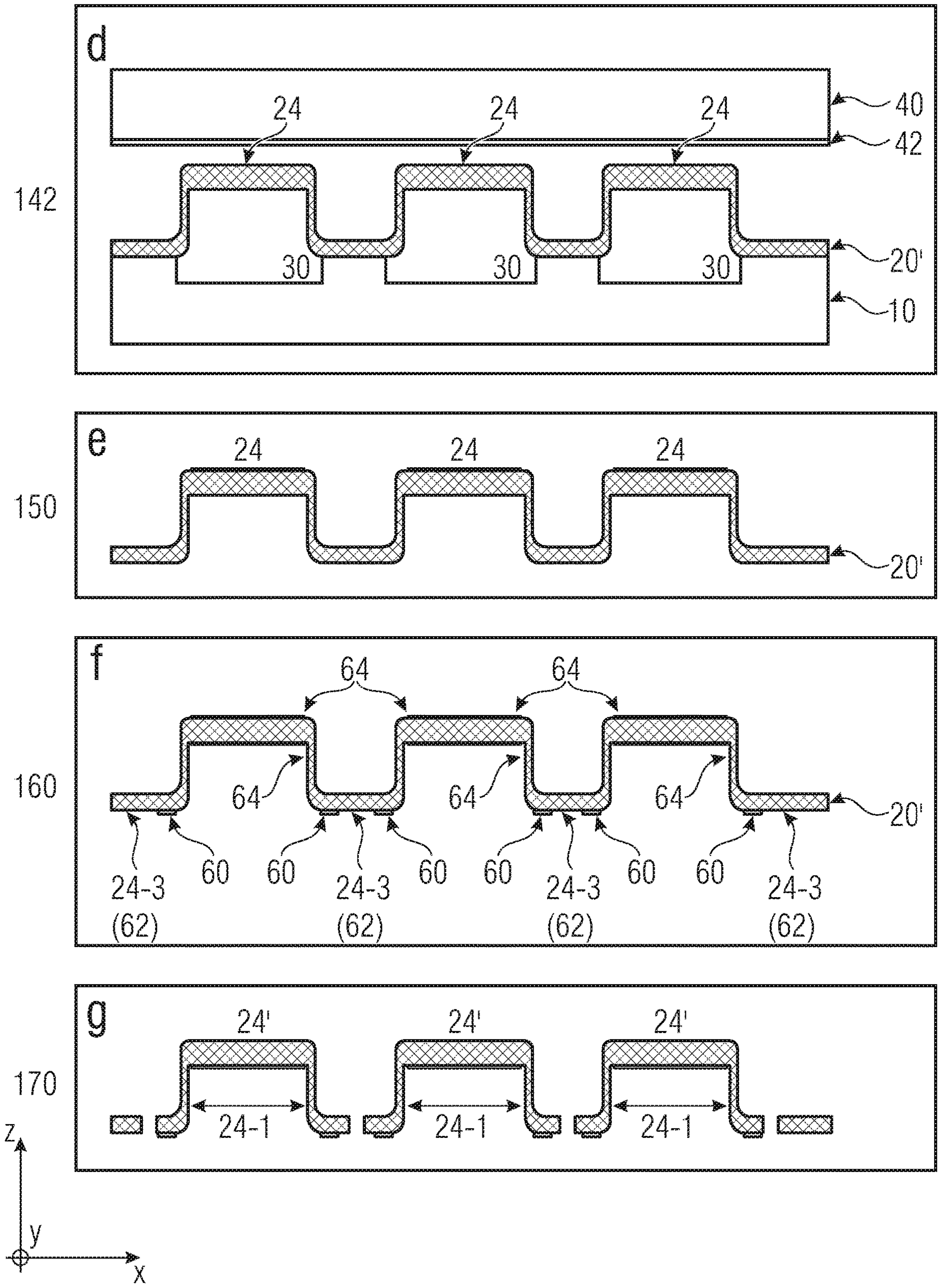
Figure 6A:
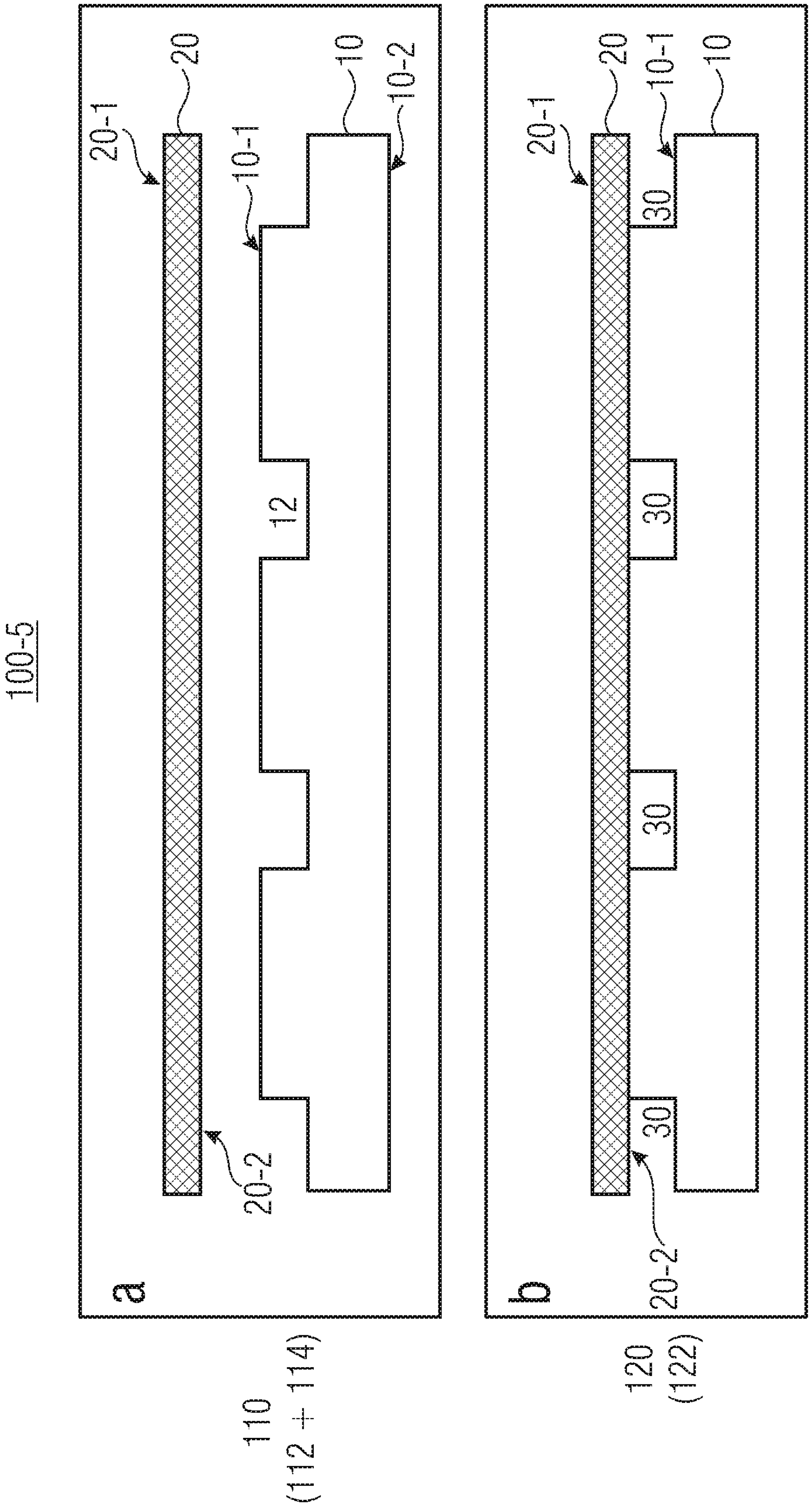
Figure 6B:
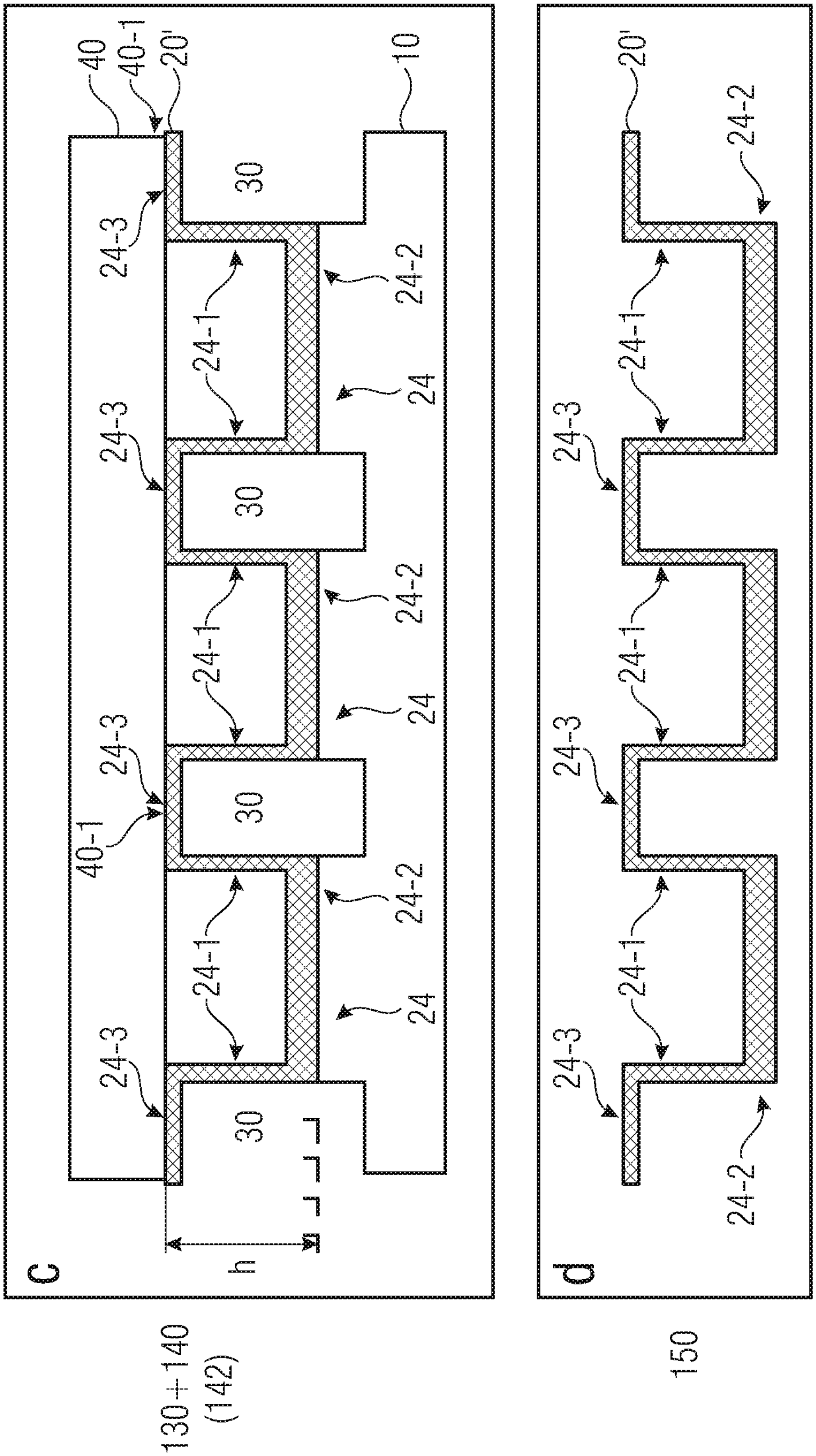
Figure 6C:
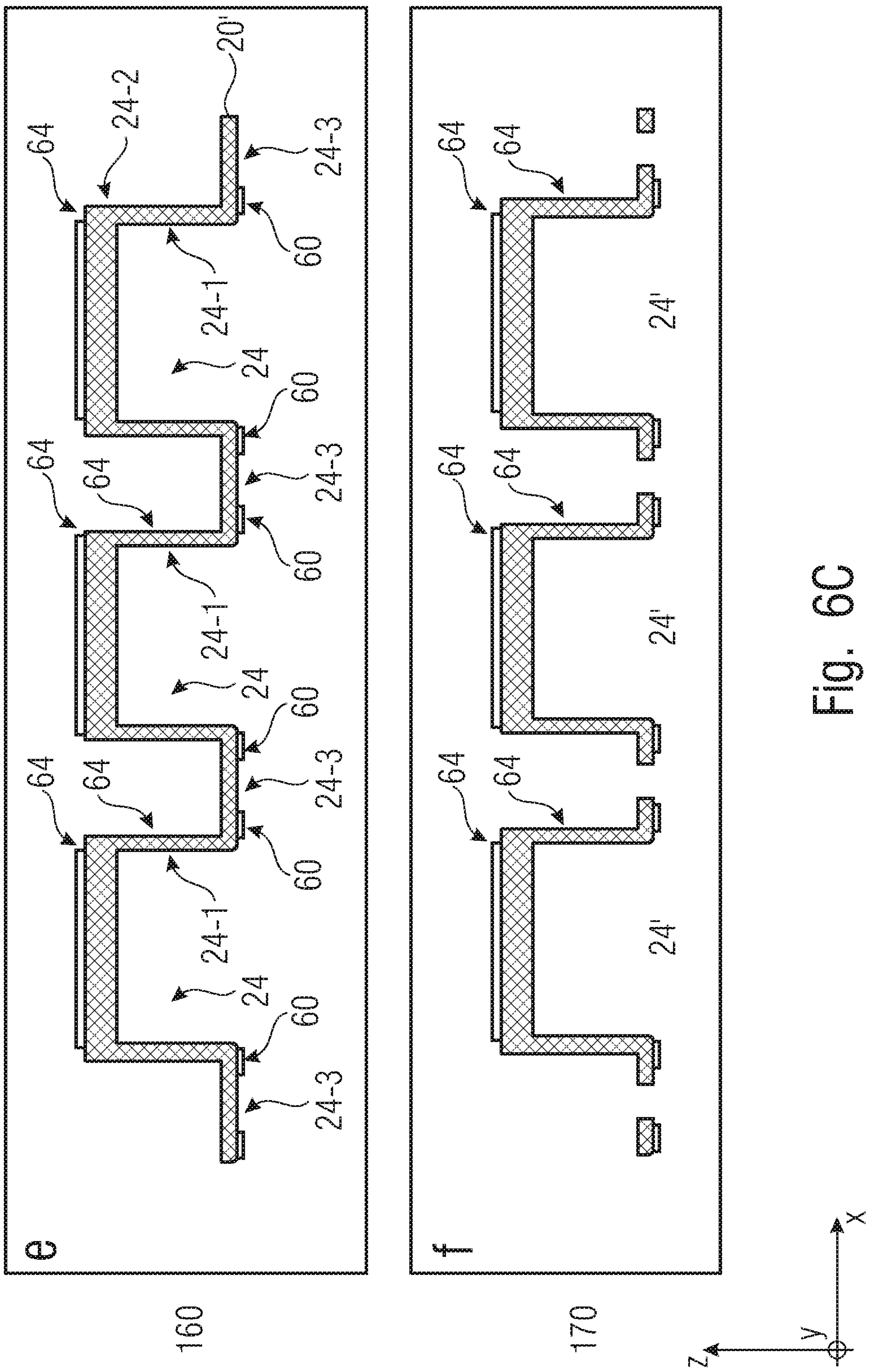

The planar stop area in this method 100 may be used multiple times as a reusable tool (cf. FIGS. 6A-6C). Several materials may in principle be used for manufacturing such a stop area, among others temperature-resistant steels and ceramics (e.g. SiC, glass carbon, others), in particular if these stop areas are additionally provided with a coating, such as graphite or boron nitrate (BN), preventing the glass melt to stick. By applying such a repelling protection layer, for a method according to FIGS. 1-6C, such a stop area may also be made of silicon.

According to an embodiment, the method 100 further comprises the step of applying, e.g. depositing, a metallization as a continuous frame structure (=a sealing frame) on bonding regions at non-bulged regions (=socket regions) of the molded cover substrate (=of the cap substrate). In this connection, for example, reference is also made to FIGS. 2A-6C and the associated description.

According to an embodiment of the method, the cover substrate may comprise a regionally-configured recess (=regional thinning) in the first main surface region. This regional recess may be provided to design, for example, the socket region (not being bulged in the blow-out process) of the cap elements of the molded cover substrate to be as thin as possible, In this connection, for example, reference is also made to FIG. 2D and the associated description.

According to an embodiment of the method 100, an anti-reflection coating is applied, or is deposited, on a region (ceiling region and/or sidewall region) of the cap element of the molded cover substrate. In this connection, for example, reference is also made to FIGS. 2A-6C and the associated description.

In the following, some further technical descriptions regarding the above-illustrated different steps of the manufacturing method 100 as well as the elements, or structures, mentioned are illustrated exemplarily. These subsequent explanations, if not explicitly stated otherwise, may be applied to all embodiments and are to be regarded as alternative or additional implementations of individual method steps, or individual elements or structures.

In the context of the present description, the mold substrate is provided, e.g., with a topographically structured surface region (first main surface region). This means that a surface region (the first main surface region) of the mold substrate comprises one or several recesses. In this case, the surface region of the mold substrate may comprise the recesses across its entire lateral expansion up to a few millimeters to, or in front of, the edge, so as to obtain the cavities and/or gas exchange channels, when hermetically bonding the mold substrate to the cover substrate. The mold substrate may also comprise a negative topography.

Furthermore, first recesses (cavity regions) in the mold substrate may be provided to configure cavities, or bulges, for an optoelectronic (radiation-emitting or radiation-receiving) device in the cap substrate by blow-out during the glass flow process. Furthermore, adjacent second cavity regions may be configured to form a hollow space for a dicing lane, or may be used to be able to expose the electric contact pads in the housing in subsequent process steps.

According to the present description, inversion or an inverted arrangement of these functional arrangements is possible. Thus, a cavity region, or a recess, according to the present description may be an area, or a trench structure, that is recessed with respect to the substrate surface, introduced into the mold substrate via an etching process. Basic geometries for the cavity regions may depend on the required cap geometry (cap substrate geometry) and the geometries are essentially freely selectable. Thus, square, rectangular, trapezoid, and linearly elongated shapes with, possibly not necessarily, rectangular corners as well as other shapes with linear edge portions are possible. Furthermore, circular or ellipsoid basic shapes are possible.

In the connection of the present description, tempering (cf. step 130) is understood as temperature treatment, e.g. temporally controlled homogenous heating or cooling, wherein this tempering step is carried out, e.g., in a specifically controllable pressure environment, i.e. with a defined ambient pressure condition. According to an embodiment, the step 130 of tempering may be carried out in a temperature range above 650° C., e.g. between 650° C. and 955° C., or between 650° C. and 750° C.

A glass material in the sense of the present description is an amorphous inorganic raw material whose viscosity (continuously) decreases with an increasing temperature.

In the illustrated manufacturing method 100, a cap substrate (molded cover substrate) with one or several cap elements is generated, wherein the cap element comprises a lateral and an upper sidewall region that may also be effective optical window regions. These optical window regions enable beam coupling and/or decoupling laterally to vertically to the carrier substrate.

According to the illustrated manufacturing method 100, the cap substrate, which may also be referred to as cap wafer, is manufactured with the lateral optically passive window areas made of glass, e.g., for a multitude of housings. For example, the lateral optically passive window areas may be configured to be vertical (=extending vertically) to the original main surface region of the cover substrate.

Essentially, the illustrated method is based on techniques of the so-called glass flow. In the embodiments, the glass material of the cover substrate may be Borofloat® glass or any other glass, such as Schott AF32, Corning Eagle XG, Hoya SD2. The coefficient of thermal expansion (CTE) of the glass materials is selected to match the semiconductor material used, since manufacturing the cap wafer (cap substrate) as well as bonding the cap wafer is carried out on the semiconductor material of the mold substrate, e.g. a silicon substrate. Too large a difference of the coefficients of thermal expansion could lead to very great thereto-mechanical stress or to destruction of the involved elements if the GTE of the glass material of the cover substrate is not matched to the CTE of the semiconductor substrate of the mold substrate (e.g. within a tolerance range of less than 1%, 5%, or 10%). For example, in embodiments, matched means that the CTE of the glass material does not deviate by more than 1-2 ppm/K from the CTE of the semiconductor material. In embodiments, the CTE of the glass material deviates by less than 0.5 ppm/K from the GTE of the semiconductor material.

For example, the cover substrate 20 comprise a thickness of 100 μm to 1500 μm or from 300 μm to 800 μm. Thus, a thickness of the window elements 24-1, i.e. the regions of the window elements 24-1 effective for passage of light, from 20 μm to 1200 μm, or from 20μ to 300 μm may be achieved. For example, a window thickness of 20 μm to 300 μm is provided for the optical passage window 24-1. For example, the vertical distance h of the (planar) stop area 40-1 of the stop element 40 to the (non-deformed) cover substrate 20 is 1.2 mm to 10 mm.

A possible process sequence when manufacturing these cap wafers with optical window areas is exemplarily described in the following on the basis of FIGS. 2A-6C. In this case, these cap wafers, i.e. cap substrates, may be manufactured with integrated vertical, convex, or concave optical window areas. For example, optical window areas are considered to be such regions of the cap wafer whose wall thickness homogeneity does not differ by more than 15% across the region illuminated by the beam and/or whose surfaces comprise a roughness of less than 50 nm. Optical window areas may be geometrically shaped differently: they may be vertically planar, vertically concave, vertically convex, uni-axially tilted, rotation-symmetrically tilted, and possibly with an offset, and may be planar-parallel to the base plane of the cap wafer. The optical window areas are used for bean decoupling and/or coupling for at least one radiation-emitting, or light-emitting, device, and optionally for one or several photodetectors. For example, several optical side windows may be provided in the same cap element at different sides, e.g. to enable beam decoupling and/or coupling laterally in different directions.

In the different embodiments (e.g. the subsequently illustrated process sequences in FIGS. 2A-6C) of the method 100, the cap elements (=glass cap) are molded by a tempering process. The geometry achieved at the end of the process is influenced by four quantities, the enclosed gas volume, the temperature progression, the pressure in the furnace, and the distance of the stop.

In a possible (simple) realization of the process sequence, the pressure in the furnace is constant over the entire time, wherein the pressure enclosed in the cavity is at least temporarily larger than the pressure in the oven. The furnace temperature should follow a profile with (consisting of) a heating phase, a processing phase, and a cooling phase. The temperature of the processing phase should be above the softening temperature of the glass so that the pressure of the enclosed gas may blow-out the cavity. If the pressure within the cavity is larger than the pressure in the furnace, a convex surface of the wall is created. However, if the process is carried out such that the pressure in the blown-out cavity approximates the overpressure (balanced state), a pressure reversal may be achieved by cooling the furnace so that the pressure in the furnace is greater than within the cavity. This leads to a deformation of the convex surface so that a wall that a flat, almost planar wall is achieved at least in partial regions. However, a geometry control is significantly increased by blow-out against a stop. In the extreme case, it is possible to achieve a convex cross-section of the wall as well. In addition to the described effect of the temperature change, such a reversal of the pressure conditions may also be carried out by changing the, e.g. controlled, furnace pressure.

A further possibility to influence the geometry of the cap (of the cap element) is to move the stop during tempering. If the glass is first blown-out into a spherical shape before the stop is brought in contact to the substrate via a decrease of the distance, a cap of the cavity with a very homogenous thickness is created. If the distance between the substrate and the stop is increased again after the glass has contacted it, this leads to stretching of the walls. The cross-section of the walls that has first been convex is flattened through this. When further increasing the distance, necking of the cross-section takes place in the region on the walls, by which they obtain a convex cross-section.

The combination of the mechanical movement with the previously described pressure and temperature changes enables selective influencing the cap geometry and in particular the wall cross-section.

In the different embodiments (e.g. the subsequently illustrated process sequences in FIGS. 2A-6C) of the method 100, the mold substrate and the cover substrate are provided and anodically bonded in steps 110 and 112.

According to an embodiment, with respect to providing 110 the mold substrate, the method 100 may include the following steps: providing a semiconductor wafer with a passivation layer on a surface (=first main surface region), lithographing the passivation layer so that the lacquer layer is removed on its surface where the recesses and gas channels are provided, etching the passivation layer on the surface of the semiconductor wafer with respect to the lithographed regions, removing the lacquer layer, etching the exposed semiconductor material so that a thickness of the semiconductor wafer perpendicular to the lithographed regions of the surface is decreased to structure the surface region and to therefore specify recesses (e.g. cavities and gas channels), and fully removing the passivation layer.

Through this, for example, the mold substrate may be manufactured and provided with a functionally structured surface region. For example, the semiconductor wafer is a silicon wafer. The semiconductor wafer may be coated with a etch-resistant passivation, such as made of LP nitride (LP=low pressure) in a LP-CVD process (LP-CVD=Low Pressure Chemical Vapor Deposition). Subsequently, lithography is performed. The passivation is opened via plasma etching. The lithographed regions may be processed by plasma-supported gas-phase etching, e.g. anisotropic high-rate etching or isotropic wet etching, so that the surface of the semiconductor wafer is etched with respect to the lithographed regions. Finally, the passivation layer is fully removed, e.g., by selectively etching it away.

According to an embodiment of the first method, in arranging 112 and bonding 114 the cover substrate, the method includes the following steps: bonding, in a planar and anodic manner, the surface region, structured with recesses, of the mold substrate with the adjacent surface region of the cover substrate. A glass wafer suitable as a cover substrate may comprise (consist of) (Pyrex), Borofloat® 33 or similar glass materials with a low CTE. Such glass materials may be characterized in that they are particularly well suited to be used in glass flow processes.

According to an embodiment, the overpressure for bulging the glass material of the cover substrate may be obtained by enclosing an increased gas pressure into the enclosed cavities 30 between the cover substrate 20 and the mold substrate 10 to obtain the overpressure in the cavities 30 compared to the surrounding atmosphere. Thus, for example, the bonding process 114 of the cover substrate 20 and the mold substrate 10 may be carried out in a defined atmosphere so as to enclose a high defined gas pressure in the cavities and channel structures 30 so that the subsequent process of bulging the glass material of the cover substrate may also be performed at a normal ambient pressure or a corresponding (reduced) negative pressure of the ambient atmosphere. Thus, an enclosed gas pressure in the cavities 30 may be provided to cause or (at least) support blow-out of the glass material through a pressure difference.

Alternatively or additionally, the atmospheric overpressure in the enclosed cavities 30 compared to the ambient atmosphere may also be obtained in a so-called negative-pressure furnace, by the negative-pressure furnace providing the surrounding atmosphere for the manufacturing process with an atmospheric negative pressure (compared to the gas pressure set in the cavities 30).

In the following, exemplary processes sequences or process sequences for implementing the fundamental manufacturing method 100 illustrated in FIG. 1 are described on the basis of FIGS. 2A-6C. In FIGS. 2A-6C, the drawing plane extends in parallel to the x-z plane.

All subsequently described process alternatives of the method 100 are based on the basic concept that a cap substrate for housing one or a plurality of optical (or optoelectronic) devices is manufactured by means of a hot-viscous glass flow method, wherein the molded cover substrate forms the cap substrate with the at least one optically neutral element. The cap element comprises an optically neutral (passive) side window (=glass window). In this case, hermetically enclosed cavities between the cover substrate and the mold substrate are used to cause, when tempering the cover substrate and the mold substrate, by decreasing the viscosity of the glass material of the cover substrate and by providing an overpressure in the enclosed cavity compared to the surrounding atmosphere, a defined bulging of the glass material of the cover substrate starting from the enclosed cavity up to a stop area spaced apart from the cover substrate. Through this, the molded cover substrate with the cap element, or the bulge, is obtained. This cap element with the optically passive glass windows may now be used to house optoelectronic devices, such as radiation-emitting and/or radiation-receiving devices.

Figure 2A:
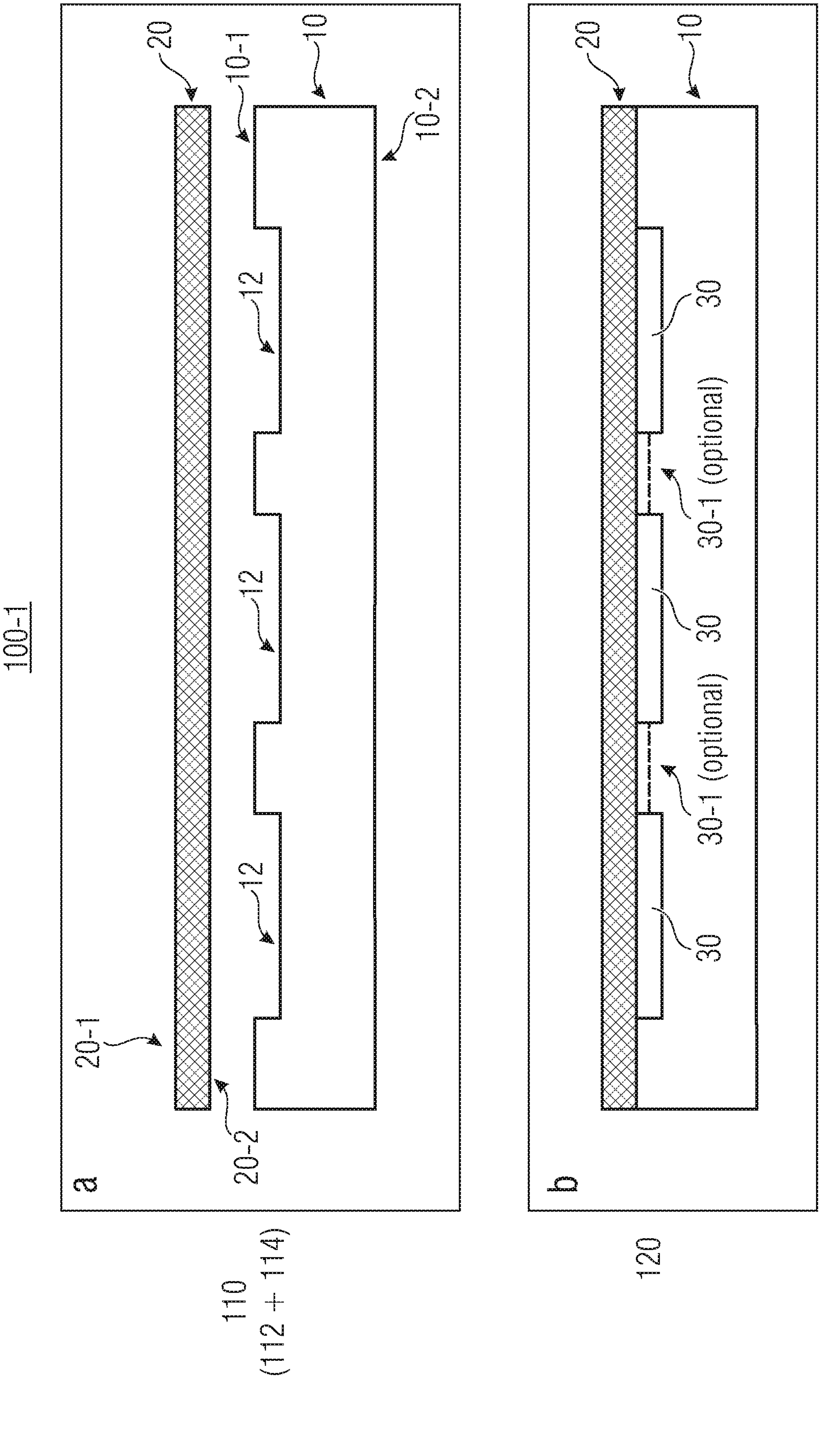
FIGS. 2A-6C show exemplary fundamental process diagrams of the inventive manufacturing method according to further embodiments.
Figure 2B:
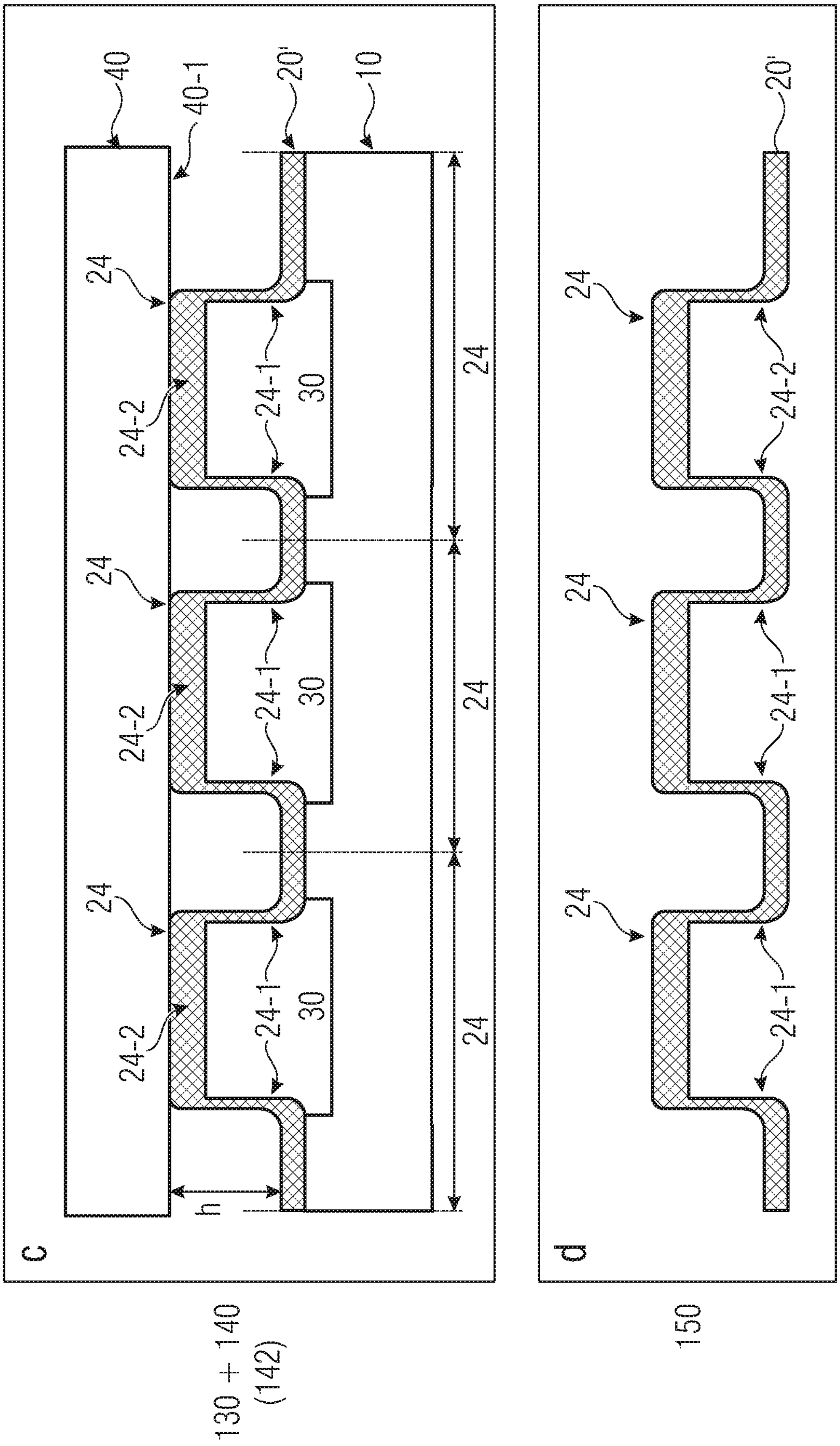
Figure 2C:
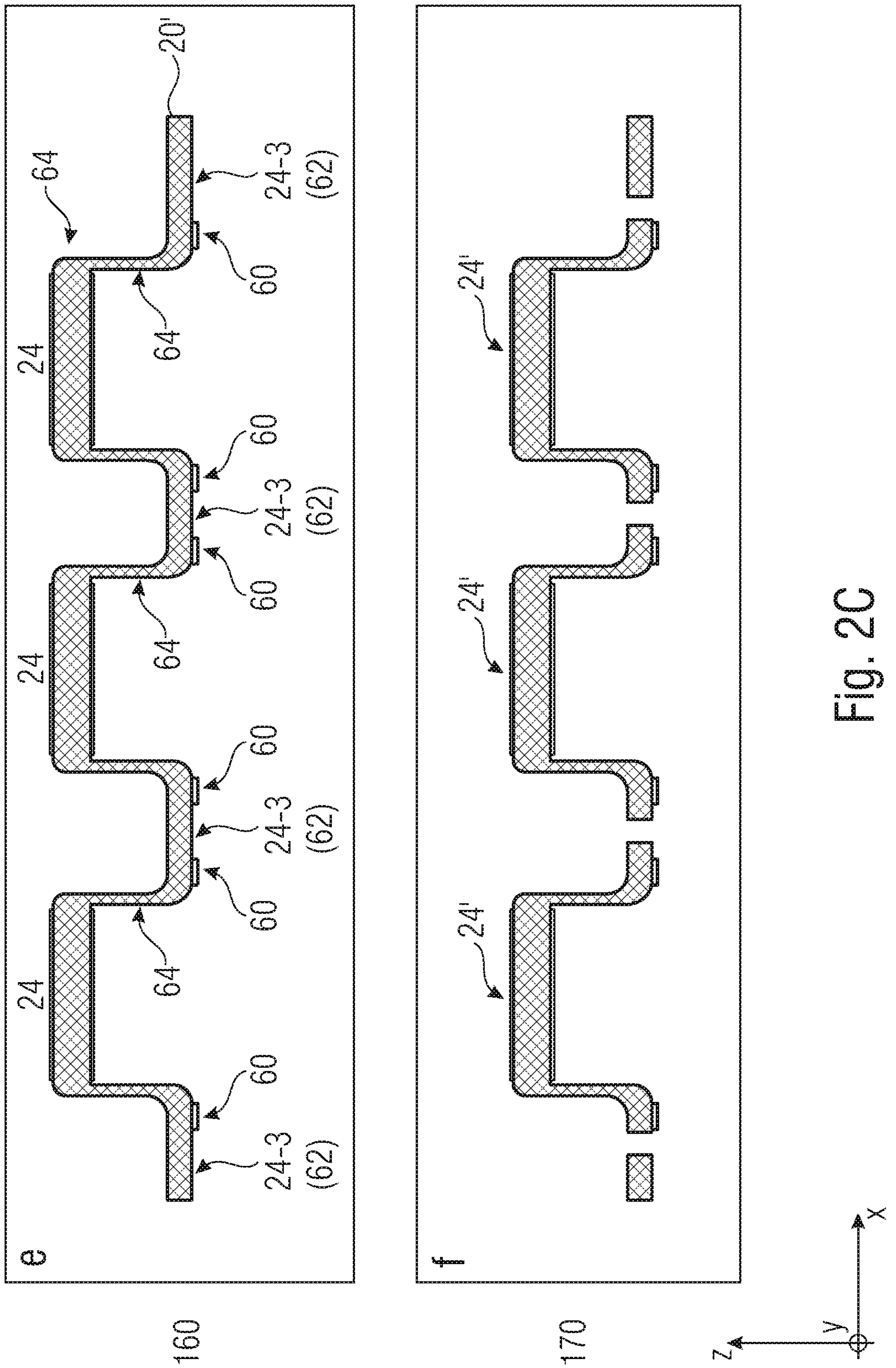

FIGS. 2A-2C now show an exemplary flow diagram 100-1 of the inventive manufacturing method 100 for manufacturing a cap substrate, e.g., which may be used for housing one or a plurality of optical, or optoelectronic, devices. For example, the window elements may be formed as upright side windows.

First, in a step 110, the mold substrate 10, e.g. a semiconductor or a silicon wafer, is provided with the structured surface 10-1, i.e. the mold substrate 10 is provided with a recess 12. Furthermore, the cover substrate 20, e.g. a glass wafer, is provided.

According to an embodiment, the mold substrate 10 may be configured as a semiconductor substrate (semiconductor wafer or silicon wafer) and the cover substrate 20 may be configured as a glass substrate, or glass wafer. For example, the mold substrate 10 is a molded substrate with a shape, contour, or topography, such as a topographically structured substrate. For example, the mold substrate may be configured as a semiconductor wafer, such as a silicon wafer, wherein the surface structuring, or topography, of the mold substrate may be obtained very precisely by means of semiconductor processing process steps, or silicon processing process steps. For example, the cover substrate 20 comprises a single homogeneous material, or glass material, so as to integrally form the molded cover substrate 20 as a cap substrate, or glass cap, with the following manufacturing steps.

In a step 112, the cover substrate 20 is arranged in an aligned way on the structured surface region 10-1 of the mold substrate 10. Thus, for example, the second main surface region 20-2, adjacent to the mold substrate 10, i.e., to the raised regions of the structured surface region 10-1 of the mold substrate 10, of the cover substrate 20 may be planar and may therefore be configured without recesses.

In a step 114, the cover substrate 20 is then bonded, or joined, to the mold substrate 10, e.g. hermetically bonded by means of anodic bonding, so as to form at least one enclosed cavity 30 between the cover substrate 20 and the mold substrate 10. In this case, the recess 12 arranged in the mold substrate 10, or the recesses 12 arranged in the mold substrate 10, each form(s) the at least one enclosed cavity 30 between the cover substrate 20 and the mold substrate 10.

According to an embodiment of the flow diagram 100-1 of the method 100, (hermetically) bonding 114 the cover substrate 20 to the mold substrate 10 is carried out in an atmosphere with a defined atmospheric ambient pressure so as to enclose a defined atmospheric pressure in the enclosed cavities 30.

In preparation of the actual manufacturing process, the mold substrate 10, e.g. a silicon mold substrate, is provided with cavities and channel structures 12 (=recesses) on one side. The glass wafer 20 is aligned with respect to the mold substrate 10 and is, e.g. anodically, bonded in a defined atmosphere so as to enclose a (defined) gas pressure in the cavities and channel structures 30.

According to an embodiment of the flow diagram 100-1 of the method 100, the cover substrate 20 and/or the mold substrate 10 is/are configured to form the enclosed cavity 30 with a plurality of enclosed cavity regions 30 between the cover substrate 20 and the mold substrate 10, wherein the enclosed cavity regions 30 are arranged so as to be fluidically separated from each other, or wherein gas exchange channels 30-1 are further provided between the cavity regions 30 enclosed from the ambient atmosphere so as to fluidically couple them to obtain a common defined atmospheric pressure in the coupled cavity regions 30.

Thus, in step 120, the mold substrate 10 and the cover substrate 20 that are bonded to each other are provided, wherein the surface region 10-1 of the mold substrate 10 is structured (configured with recesses or channel structures 12) so as to form the at least one enclosed cavity 30 between the cover substrate 20 and the mold substrate 10. For example, in step 120, an anodically bonded glass-silicon cap substrate 10, 20 is obtained, or provided.

Now, in a (subsequent) step 130, the cover substrate 20 and the mold substrate 10 are tempered, i.e. subjected to temperature treatment, or heated (warmed), so as to decrease the viscosity of the glass material of the cover substrate 20. Furthermore, in a step 140, an overpressure is provided in the (at least one) enclosed cavity, or the enclosed cavities 30, compared to the surrounding atmosphere so as to cause, on the basis of the decreased viscosity of the glass material of the cover substrate 20 and the overpressure in the enclosed cavity 30 compared to the surrounding atmosphere, a defined bulging, or blow-out or deformation, of the glass material of the cover substrate 20 starting from the enclosed cavity 30 to a stop area 40-1, spaced apart from the cover substrate 20, of a stop element 40. The defined bulging of a glass material of the cover substrate 20 due to the overpressure in the enclosed cavity 30 and the decreased viscosity of the glass material may also be referred to as blow-out or deformation of the glass material. Due to the defined bulging of the glass material of the cover substrate 20, a molded cover substrate 20' with (at least) one cap element 24 (=bulging or deformation) is therefore obtained. Thus, the obtained bulge or deformation of the molded cover substrate (=cap substrate) 20' is referred to as the cap element 24. According to an embodiment, step 130 of tempering may be performed in a temperature range above 650° C., e.g. between 650° C. and 955° C., or between 650° C. and 750° C.

Furthermore, the defined bulging of the cover substrate 20 causes configuring the side windows 24-1 at the cap element 24, or molds them. The side region of the cap element 24 is also referred to as (optically passive, or neutral) window element or optically passive glass window 24-1 (=lateral window element).

According to an embodiment of the flow diagram 100-1 of the method 100, the step of tempering 130 and providing 140 an overpressure is carried out as a glass flow process in a negative-pressure furnace 50 so as to obtain a defined atmospheric overpressure compared to the surrounding atmosphere in the enclosed cavity 30.

According to an embodiment of the flow diagram 100-1 of the method 100, in the step of tempering 130 and providing 140 an overpressure, the cover substrate 20 is bulged, or blown-out, in a region of the enclosed cavity 30 up to a height h specified by the vertical distance of the stop area 40-1 of the stop 40 to the main surface region 20-1 of the cover substrate 20.

According to an embodiment of the flow diagram 100-1 of the method 100, the region, opposite to the cavity 30 or the cavity regions 30, of the stop area 40-1 of the stop element 40 is configured to be planar and in parallel to the main surface region 20-1 of the cover substrate 20 (=parallel to the reference plane) so as to form a planar cap region 24-2 of the cap element 24 in the step of tempering 130 and providing 140 an overpressure. According to an embodiment, the stop element 40 may be configured as a reusable tool.

Performing the glass flow process 130, 140 may therefore be carried out in a pressure-controlled furnace 50. The glass wafer (cover substrate) 20 is blown-out in the regions of the cavities 30 up to a height h, which may be determined by a stop area 40-1 of the stop element 40. The stop 40, and therefore the stop area 40-1, is configured to be planar, for example. For example, after the glass flow process 130, 140, cooling the cap substrate 20' and removing the cap substrate 20' from the furnace 50 is carried out. Thus, after the glass flow process 130, 140, the wafers 10, 20' are cooled in the blown-out state.

According to an embodiment of the flow diagram 100-1 of the method 100, in a step 142, cooling the molded cover substrate 20' may be carried out in a defined way so as to generate a convex or concave bulge of the sidewall regions (side windows) 24-1 of the cap element 24 of the molded cover substrate 20'.

In a subsequent step 150, the stop element 40 and the mold substrate 10 are now removed from the molded cover substrate 20', wherein the molded cover substrate 20' now forms the cap substrate 20' with the at least one cap element 24. For example, the cap substrate 20' may be used for housing one or a plurality of optical or optoelectronic devices.

According to an embodiment, the flow diagram 100-1 of the method 100 may further comprise the step 142 of cooling the stop element 40, the mold substrate 10, and the molded cover substrate 20', wherein, in the step 150, the mold substrate 10 is subsequently removed by means of an etching process, e.g. a silicon or semiconductor etching process of the silicon or semiconductor material of the mold substrate.

According to an embodiment, the step 150 of removing the stop element 40 is also carried out by means of an etching process, e.g. by means of a silicon or semiconductor etching process of the silicon or semiconductor material of the stop 40.

Since the cover substrate 20 according to an embodiment comprises a single homogeneous material, such as a glass material, the molded cover substrate 20', i.e. the cap substrate, or the glass cap, with the at least one cap element 24, is also configured as a single piece (integrally) and from a single homogeneous material, e.g. the glass material.

Thus, in the step 150, e.g. a glass cap substrate 20' with the sidewalls 24-1 of the glass caps 24 is obtained after removing the silicon of the mold substrate 10 and of the stop element 50 on both sides. The side windows 24-1 may be configured to be surrounding or segmented.

In a (optional) subsequent step 160, the process sequence 100-1 of the method 100 may further comprise applying, or depositing, a metallization 60 as a (continuous) frame structure, or as a sealing frame, on bonding regions 62 at the second main surface region 20-2 at non-bulged regions (socket regions) 24-3 of the cap elements 24 of the molded cover substrate (of the cap substrate) 20'.

According to an embodiment, in a step 160, an anti-reflection coating 64 may be applied or deposited on an inner-side and/or outer-side region, e.g. on an inner side and/or outer side on the cap region 24-2 and/or the sidewall region 24-1, of the cap element 24 of the molded cover substrate 20'.

In the optional step 160, thus, a deposition of sealing frames 60 and/or optional anti-reflection coatings 64 onto the cap substrate 20' may be carried out. With this glass cap substrate 20', optical structures on the wafer level may be hermetically sealed, as will be described in the following.

In an (optional) subsequent step 170, the process sequence 100-1 of the method 100 may further comprise dicing the molded cover substrate 20' so as to obtain diced cap elements 24'. Dicing 170 the glass cap substrate 20' may be carried out by means of sawing or laser separation, for example. With the diced caps 24', optical structures on the individual substrate plane or on the wafer plane may be hermetically sealed by means of individual capping, as will be described in the following.

In the following, some method steps of the process sequence 100-1 of the method 100 of FIGS. 2A-2C are again illustrated in a summarized way.

That is, FIGS. 2A-2C shows a flow diagram 100-1 that illustrates, on the basis of steps 110 to 170, a first process sequence 100-1 for manufacturing a cap substrate 20'. For example, the cap substrate 20' resulting from the manufacturing method 100-1 comprises an optically passive (neutral) side window 24-1 that is an integral component of the cap element 24 (cap) and enables lateral beam decoupling and/or coupling. For example, several lateral side windows 24-1 (e.g. with a vertical extension) may be provided, being an integral component of the cap element 24 (cap) of the cap substrate 20' and enabling lateral beam decoupling and/or coupling in different directions, e.g. in different directions in parallel to a reference plane (x-y plane). For example, a vertical (upper) side window 24-2 (e.g. with a lateral extension) may be provided, being an integral component of the cap element 24 (cap) of the cap substrate 20' and enabling vertical beam decoupling and/or coupling, e.g. perpendicular to the reference plane (x-y plane).

Thus, the process sequence 100-1 of FIG. 1 includes a step 110 of providing the mold substrate with a structured (provided with recesses) surface region, wherein the mold substrate comprises a semiconductor material, such as silicon, or consists of the semiconductor material, e.g. silicon. Subsequently, arranging the unstructured cover substrate on the structured surface region of the mold substrate takes place. The cover substrate comprises a glass material or consists of a glass material. In arranging the cover substrate at the mold substrate, the structured surface of the mold substrate is arranged so as to at least partially overlap with a surface of the cover substrate, and, in bonding the cover substrate with the mold substrate, the same is anodically bonded or hermetically joined, for example. The structured surface of the mold substrate is bonded to the surface of the cover substrate, e.g. in a gas-tight way with a defined enclosed inner atmosphere in the recesses (cavities).

Subsequently, tempering 130 the bonded substrates 10, 20 in a negative-pressure furnace such that a blow-out of the glass material of the cover substrate is caused in the regions of the recesses through the enclosed pressure in relation to the furnace pressure takes place. In this case, the temperatures are selected such that the viscosity of the glass material strongly decreases and the glass material is able to controllably expand in the window region, however, does not flow away.

To support the blow-out, a pressure difference, e.g. which is adjusted, may be present between the inner spaces, or cavities, arranged between the substrates, and the ambient atmosphere in the furnace. An enclosed gas pressure in the inner spaces may be provided to sup cause port the blow-out of the glass material by means of a pressure difference or to (at least) support it. Through this, the process may be performed in a tempering step. The pressure difference present between the enclosed gas pressure in the recessed inner spaces and the controlled vacuum (negative pressure) of the furnace atmosphere supports the entire flow process.

In the glass flow process, a stop of the flow front takes place at the stop area 40-1 of the stop element 40 in an adjustable distance h in the negative-pressure furnace, wherein the stop element 40 with the stop area 40-1 comprises a silicon wafer, for example, or consists of a silicon wafer. The flow process with the stop area 40-1 in a static distance therefore is based on the decreased viscosity of the glass material of the cover substrate 20 and the overpressure in the enclosed cavity 30 compared to the surrounding atmosphere, wherein the bulging (blow-out/deformation) of the glass material of the cover substrate 20 is caused starting from the enclosed cavity 30 up to the stop area 40-1, spaced apart from the cover substrate 20, of the sub-element 40 so as to obtain the molded cover substrate 20' with the (at least) one cap element (=bulge) 24.

In the glass flow process 130, 140, cooling the bonded substrates under a reproducible temperature and pressure ramp and finally removing the cap substrate 20' with the mold substrate and, e.g., the stop element 40 from the furnace 50 takes place.

Then, removing 150 the stop element 40 and the mold substrate 10 takes place so as to obtain the structured cap substrate 20' gained from the cover substrate 20 through the blow-out process. Removing 150 may mean separating or selectively etching away the semiconductor material of the mold substrate 10 and/or the stop element 40 by means of an etching process (silicon or semiconductor etching process of the silicon or semiconductor material), e.g. in a hot caustic potash solution. In this way, an effective method for manufacturing a cap substrate 20' for capping radiation-emitting devices is provided, since the cap substrate 20' obtained by the method 100 as schematically illustrated in FIGS. 2A-6C includes a (optically passive) decoupling window 24-1 formed by means of the window device (cap element) 24.

In an embodiment of the method 100 for manufacturing a cap substrate 20', e.g., the resulting cap substrate 20' comprises a side window 24-1 that is an integral component of the cap (of the cap element) 24 and enables lateral beam decoupling. For example, several side windows 24-1 that are an integral component of the cap 24 and enable lateral beam decoupling in different directions, e.g. in a different direction each, may be provided.

In the optional step 160, applying (depositing) the metallization 60 as a (continuous) frame structure (a sealing frame) onto bonding regions 62 on the second main surface region 20-2 at the non-bulged regions (socket regions) 62 of the molded cover substrate (cap substrate) 20' may be performed. In the optional step 160, furthermore, an anti-reflection coating 64 may be applied or deposited onto a region (ceiling region and/or sidewall region) of the cap element 24 of the molded cover substrate 20'. In a further optional step 170, the molded cover substrate 20' may be diced so as to obtain diced cap elements 24'.

The above-illustrated manufacturing method 100 with the exemplary process sequence of FIGS. 2A-2C is a very effective and simple approach of setting up the side windows and side regions 24-1 of the respective cap element 24.

Figure 2D:
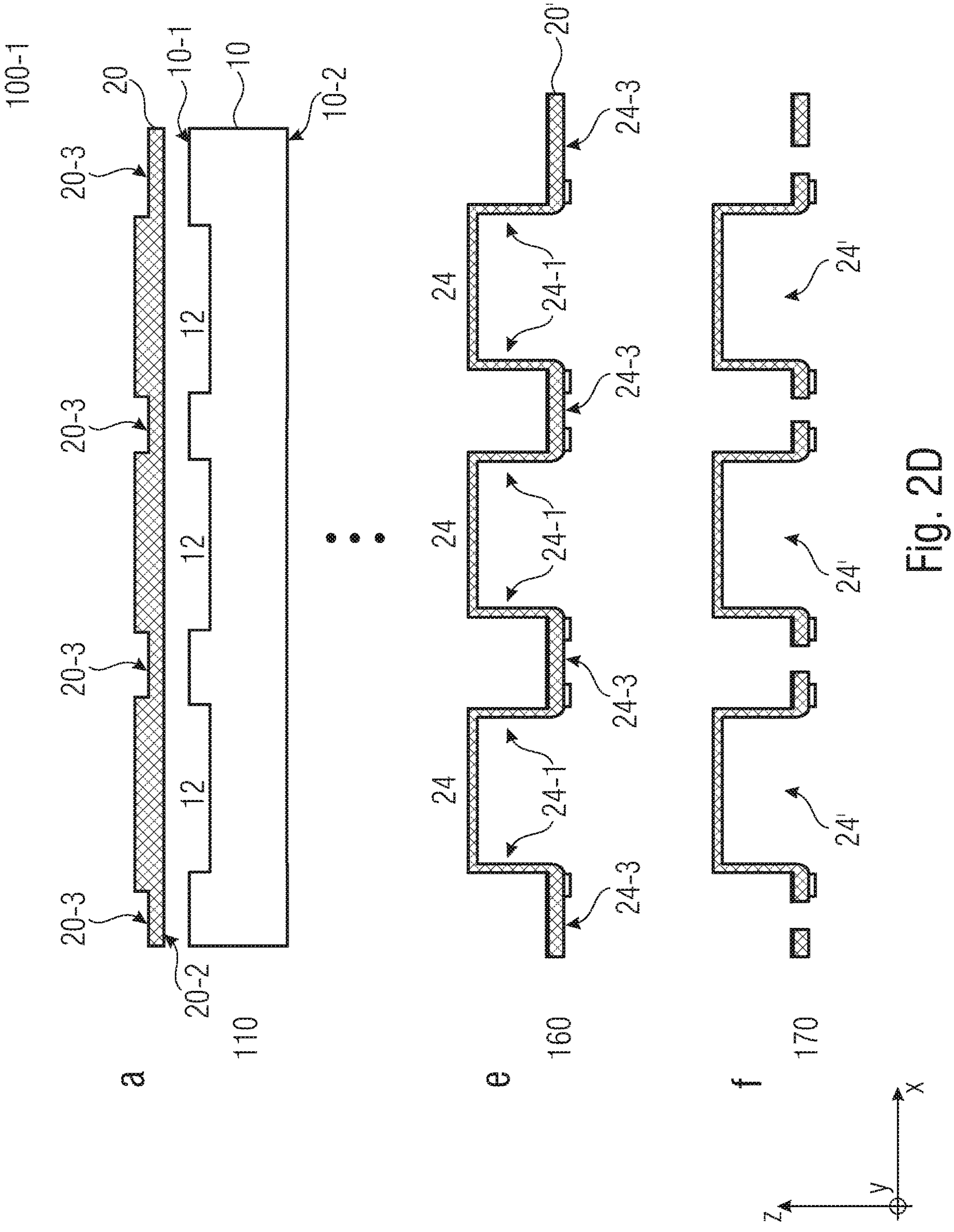

With respect to the manufacturing method 100 illustrated in FIGS. 2A-2C by means of the flow diagram 100-1, FIG. 2D now illustrates a further alternative implementation of the cover substrate 20 with a regionally configured recess (=regional thinning) 20-3 in the first main surface region 20-1 of the cover substrate 20.

This regional recess 20-3 may be provided to, e.g., configure the (non-bulged) socket region 24-3 of the cap elements 24 of the molded cover substrate (=cap substrate) 20' to be as thin as possible, i.e. to configure the socket region 24-3 to be as thin, or flat, as possible at least adjacent to the lateral beam exit region 24-1. This may achieve that, in case of (subsequently) housing an optical device (transmission and/or reception device) arranged at a device substrate, a lowest possible required structural height of the optical device above the device substrate is achieved. Through this, in case of the optoelectronic device, it may be achieved that this device (e.g. a laser emitter or a photodiode) does not have to be mounted with an additional effort, e.g. in a raised manner on a sub-mount, so as to avoid a collision of the transmission or reception radiation of the optical device with an otherwise increased glass socket.

According to this embodiment, the socket region 24-3 of the cap element 24 may be configured to be (relatively) flat at least in a direction of the lateral beam passage of the transmission or reception radiation of the optoelectronic device so as to not require to mount the optoelectronic device on an additional pedestal, e.g. on a (raised) sub-mount on the device substrate, so that the transmission and/or reception radiation of the optoelectronic device 1 does not collide, or interfere, with the socket region (glass socket) 24-3 of the cap element.

To this end, the glass material of the cover substrate 20 is applied to the mold substrate 10 already with an thinned region 20-3 at the top side (=the first main surface region) 20-1, wherein this thinning 20-3 extends in the beam decoupling direction up into the frame region of the cover element (the glass cap) 24 or up into the dicing region of the cap element 20'.

This thinning 20-3 may also extend into the region of the window area 24-1 still to be blown-out, arranged to be vertically upright after the bulging process, for example, so as to generate, e.g. in the beam passage region, a particularly thin-walled window element with little optical effect. In addition, the thin-walled window element comprises a large beam passage region due to the socket region 24-3 being configured to be flat, without having to blow-out the same particularly high during the blow-out process of the glass cap (the cover substrate) 20.

FIG. 2D exemplarily shows such a cover substrate provided with thinning regions 20-3 in step 110 of providing and further after having gone through the manufacturing method 100 in steps 160, 170, wherein the decreased thickness of the socket region 24-3 of the cap substrate 20' is clearly illustrated.

Providing these thinning regions 20-3 in the cap substrate is equally applicable to the subsequently illustrated different process sequences of the manufacturing method 100, wherein the thinning regions 20-3 of the cover substrate 20 are provided so as to obtain a selective thin implementation of the resulting cap element 24 in the desired sidewall regions and to obtain the (improved) optical characteristics resulting therefrom.

Figure 3A:
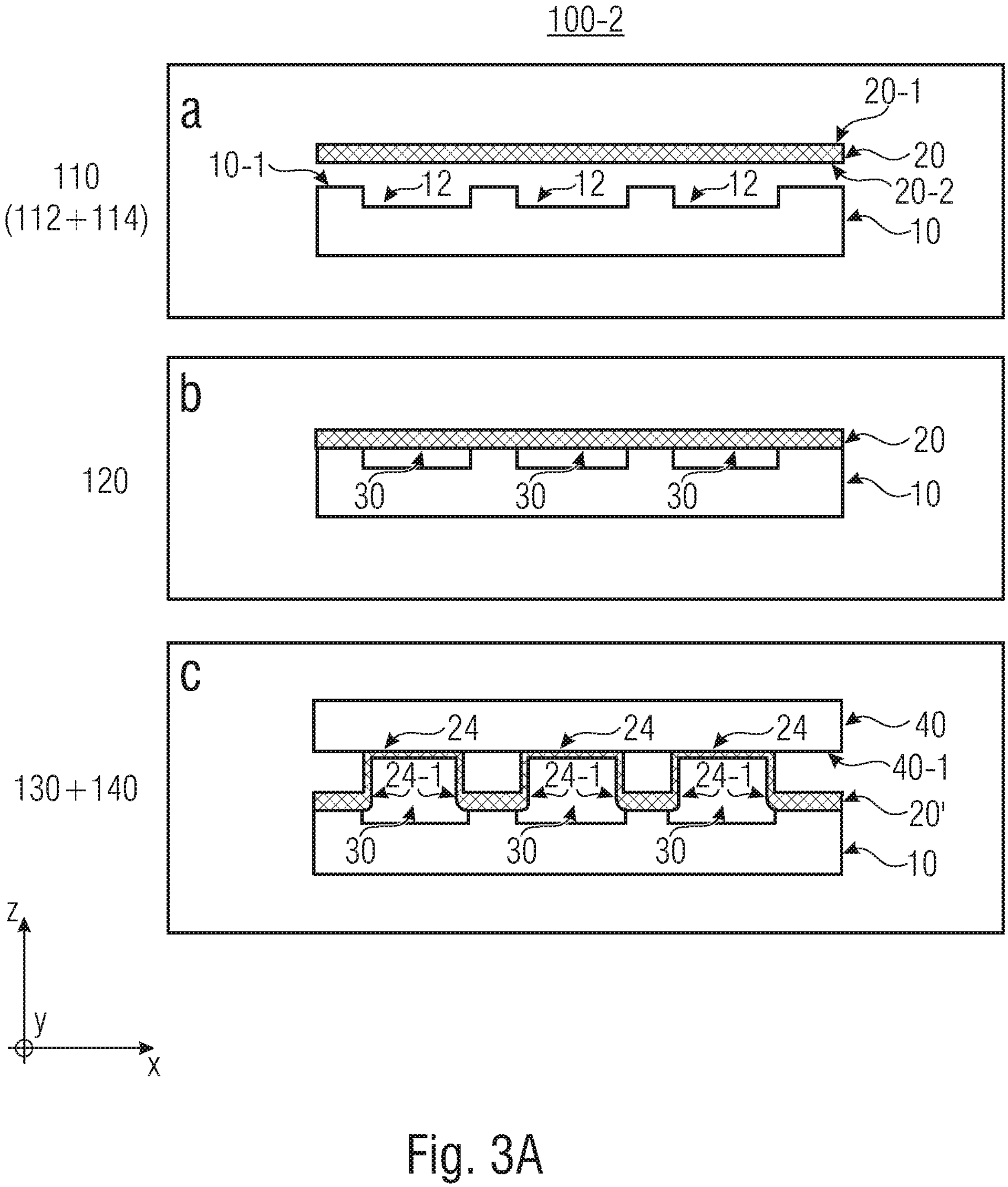
Figure 3B:
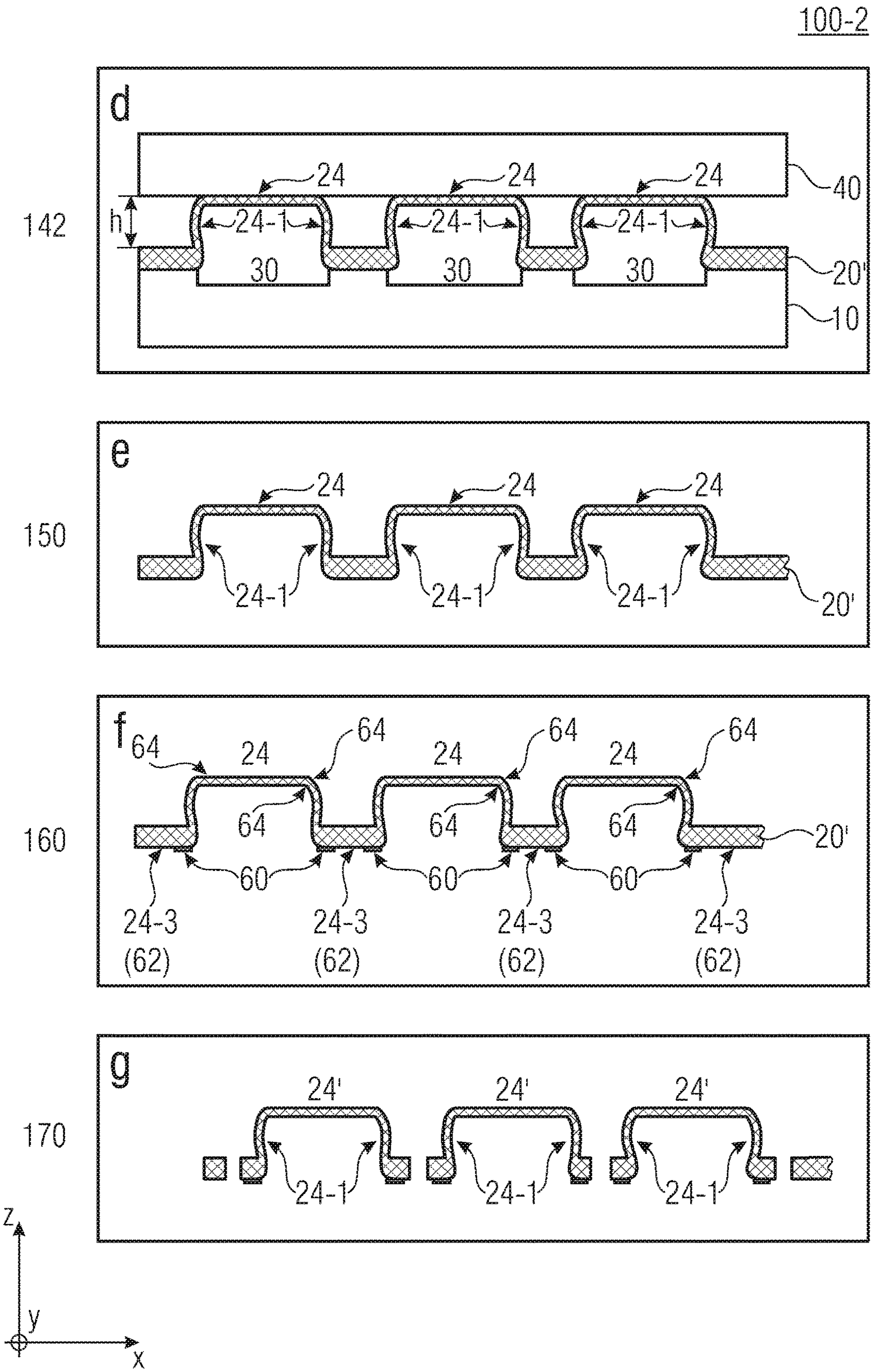

FIGS. 3A-3B now shows a further exemplary principle flow diagram 100-2 of the inventive manufacturing method 100 according to a further embodiment. In the following, essential differences, or different method steps, of the flow diagram 100-2 of FIGS. 3A-3B are illustrated compared to the flow diagram 100-1 of FIGS. 2A-2C. Thus, the above description of FIGS. 1 and FIGS. 2A-2C may be accordingly applied to the subsequent description of the embodiment of FIGS. 3A-3B, wherein, above all, the differences, such as different (=alternative and/or additional) process steps and/or elements, with respect to the process sequence 100-1 of FIGS. 2A-2C and the resulting technical effects are described in the subsequent description.

FIGS. 3A-3B now shows an exemplary flow diagram 100-2 of the inventive manufacturing method 100 for manufacturing a cap substrate, e.g., which may be used to house one or a plurality of optical, or optoelectronic, devices. For example, the window elements may be formed so as to be upright convex (bulged towards the outside) side windows.

In a step 110, first, the mold substrate 10, e.g. a semiconductor or silicon wafer, is provided with the structured surface region 10-1, i.e. the mold substrate 10 is provided with at least one recess 12. Furthermore, the cover substrate 20, e.g. a glass wafer, is provided.

In a step 112, the cover substrate 20 is arranged on the structured surface region 10-1 of the mold substrate 10 in an aligned way. Thus, for example, the second main surface region 20-2 of the cover substrate 20 adjacent to the mold substrate 10, i.e. at the raised regions of the structured surface region 10-1 of the mold substrate 10, may be planar, and may therefore be configured without recesses.

In a step 114, the cover substrate 20 is then bonded or joined, e.g. hermetically bonded by means of anodic bonding, to the mold substrate 10 so as to form at least one enclosed cavity between the cover substrate 20 and the mold substrate 10. In this case, the recess 12 arranged in the mold substrate 10, or the recesses 12 arranged in the mold substrate 10, each forms/form the at least on enclosed cavity 30 between the cover substrate 20 and the mold substrate 10.

According to an embodiment of the flow diagram 100-2 of the method 100, (hermetically) bonding 114 the cover substrate 20 to the mold substrate 10 is carried out in an atmosphere with a defined atmospheric ambient pressure so as to enclose a defined atmospheric pressure into the enclosed cavity 30.

Thus, in preparing the actual manufacturing process, the mold substrate 10, e.g. a silicon mold substrate, is provided with cavities and channel structures 12 (=recesses) on one side. The glass wafer 20 is aligned with respect to the mold substrate 10 and is, e.g. anodically, bonded in a defined atmosphere so as to enclose a (defined) gas pressure in the cavities and channels structures 30.

Thus, in a step 120, the mold substrate 10 and the cover substrate 20 that are bonded to each other are provided, wherein the surface region 10-1 of the mold substrate 10 is structured (configured with recesses or channel structures 12) to form the at least one enclosed cavity 30 between the cover substrate 20 and the mold substrate 10. In the step 120, e.g., an anodically bonded glass-silicon cap substrate 10, 20 is obtained, or provided.

In a (subsequent) step 130, the cover substrate 20 and the mold substrate 10 are now being tempered, i.e. subjected to a temperature treatment, or heated (warmed), so as to decrease the viscosity of the glass material of the cover substrate 20. Furthermore, in a step 140, an overpressure in the (at least one) enclosed cavity, or the enclosed cavities, 30 compared to the surrounding atmosphere is provided so as to cause, on the basis of the decreased viscosity of the glass material of the cover substrate 20 and the overpressure in the enclosed cavity 30 compared to the surrounding atmosphere, a defined bulging, e.g. blow-out or deformation, of the glass material of the cover substrate 20 starting from the enclosed cavity 30 up to a stop area 40-1, spaced apart from the cover substrate 20, of a stop element 40. The defined bulging of the glass material of the cover substrate 20 due to the overpressure in the enclosed cavity 30 and the decreased viscosity of the glass material may also be referred to as blow-out or deformation of the glass material. Through the defined bulging of the glass material of the cover substrate 20, a molded cover substrate 20' with (at least) one cap element 24 (=bulge or deformation) is therefore obtained. Thus, the obtained bulge or deformation of the molded cover substrate (=cap substrate) 20' is referred to as the cap element 24. According to an embodiment, the step 130 of tempering may be performed in a temperature range above 650° C., e.g. between 650° C. and 955° C., or between 650° C. and 750° C.

Furthermore, through the defined bulging of the cap substrate 20, configuration of the side windows 24-1 at the cap element 24 is caused, or they are molded. The side region of the cap element 24 is also referred to as (optically passive) window element or optically passive glass window 24-1.

According to an embodiment of the flow diagram 100-2 of the method 100, the step of tempering 130 and providing 140 an overpressure is performed as a glass flow process in a negative-pressure furnace 50 so as to obtain a defined atmospheric overpressure compared to the surrounding atmosphere in the enclosed cavity 30.

According to an embodiment of the flow diagram 100-2 of the method 100, in the step of tempering 130 and providing 140 an overpressure, the cover substrate 20 is bulged, or blown-out, in the region of the enclosed cavity 30 up to a height h specified by the vertical distance of the stop area 40-1 of the stop 40 to the first main surface region 20-1 of the cover substrate 20.

According to an embodiment of the flow diagram 100-2 of the method 100, the region, opposite the cavity 30 or the cavity regions 30, of the stop area 40-1 of the stop element 40 is configured to be planar and parallel to the main surface region 20-1 of the cover substrate 20 (=parallel to the reference plane) so as to form a planar ceiling region 24-2 of the cap element 24 in the step of tempering 130 and providing 140 an overpressure.

According to an embodiment of the flow diagram 100-2 of the method 100, in a step 142 of (defined) cooling the molded cover substrate 20' in a temperature range above 650° C., e.g. between 650° C. and 955° C., or between 650° C. and 750° C., an atmospheric overpressure may be caused in the enclosed cavities 30 compared to the surrounding atmosphere so as to generate a convex bulge of the sidewall regions (side windows) 24-1 of the cap element 24 of the molded cover substrate 20' towards the outside. According to an embodiment of the method, the step of tempering 130 and providing 140 an overpressure may be performed in a negative-pressure furnace 50, wherein the atmospheric overpressure in the enclosed cavity 30 compared to the surrounding atmosphere is obtained through a decreased atmospheric pressure in the negative-pressure furnace 50.

In a subsequent step 150, the stop element 40 and the mold substrate 10 are now removed from the molded cover substrate 20', wherein the molded cover substrate 20' now forms the cap substrate 20' with the at least one cap element 24. For example, the cap substrate 20' may be used for housing one or a plurality of optical or optoelectronic components.

According to an embodiment, the flow diagram 100-2 of the method 100 may further comprise the step 142 of cooling the stop element 40, the mold substrate 10, and the molded cover substrate 20', wherein, in a step 150, the mold substrate 10 is subsequently removed by means of an etching process, e.g. a silicon or semiconductor etching process of the silicon or semiconductor material of the mold substrate.

In a (optional) subsequent step 160, the process sequence 100-2 of the method 100 may further comprise applying, or depositing, a metallization 60 as a (continuous) frame structure, or as a sealing frame on bonding regions 62 at the second main surface region 20-2 at non-bulged regions (socket regions) 24-3 of the cap elements 24 of the molded cover substrate (of the cap substrate) 20'.

According to an embodiment, in a step 160, an anti-reflection coating 64 may be applied or deposited on an inner-side and/or outer-side region, e.g. on an inside and/or outside on the ceiling region 24-2 and/or the sidewall region 24-1, of the cap element 24 of the molded cover substrate 20'.

In a (optional) subsequent step 170, the process sequence 100-2 of the method 100 may further comprise dicing the molded cover substrate 20' so as to obtain diced cap elements 24'. Dicing 170 the glass cap substrate 20' may be carried out by means of sawing or laser separation, for example. With the diced caps 24', optical structures may be hermetically sealed on the individual substrate plane or on the wafer plane by means of individual capping, as will be subsequently described.

In the following, some method steps of the process sequence 100-2 of the method 100 of FIGS. 3A-3B are again illustrated in a summarized way.

Thus, FIGS. 3A-3B show a flow diagram 100-2 that illustrates a first process sequence 100-2 for manufacturing a cap substrate 20' on the basis of steps 110 to 170. The cap substrate 20' resulting from the manufacturing method 100-2 comprises, after the process sequence, e.g., (at least) one optically passive side window 24-1 that is an integral component of the cap element 24 (cap) and enables lateral beam decoupling and/or coupling.

Thus, the process sequence 100-2 of FIGS. 3A-3B includes a step 110 of providing the mold substrate with a structured (provided with recesses) surface region, wherein the mold substrate comprises a semiconductor material, such as silicon, or consists of the semiconductor material, such as silicon. Subsequently, arranging the unstructured cover substrate on the structured surface region of the mold substrate takes place. The cover substrate comprises a glass material or consists of a glass material. In arranging the cover substrate on the mold substrate, the structured surface of the mold substrate is arranged so as to at least partially overlap a surface of the cover substrate, and, in bonding the cover substrate to the mold substrate, it is anodically bonded or hermetically joined, for example. The structured surface of the mold substrate is bonded to the surface of the cover substrate, e.g., in a gas-tight manner with a defined enclosed inner atmosphere in the recesses (cavities).

For example, subsequently, tempering 130 the bonded substrates 10, 20 in a negative-pressure furnace such that a blow-out of the glass material of the cover substrate is caused in the region of the recesses through the enclosed pressure in relation to the furnace pressure takes place.

In the glass flow process, a stop of the flow front occurs at the stop area 40-1 of the stop element 40 in an adjustable distance h in the negative-pressure furnace, wherein the stop element 40 with the stop area 40-1 comprises a silicon wafer or consists of a silicon wafer, for example.

In the glass flow process 130, 140, cooling the bonded substrate is carried out under a reproducible temperature and pressure ramp so as to generate the convex window shape. Finally, removing the cap substrate 20' with the mold substrate and, e.g., the stop element 40 from the furnace 50 takes place.

Then, removing 150 the stop element 40 and the mold substrate 10 is carried out so as to obtain the structured cap substrate 20' gained from the cover substrate 20 by the blow-out process.

Figure 4A:
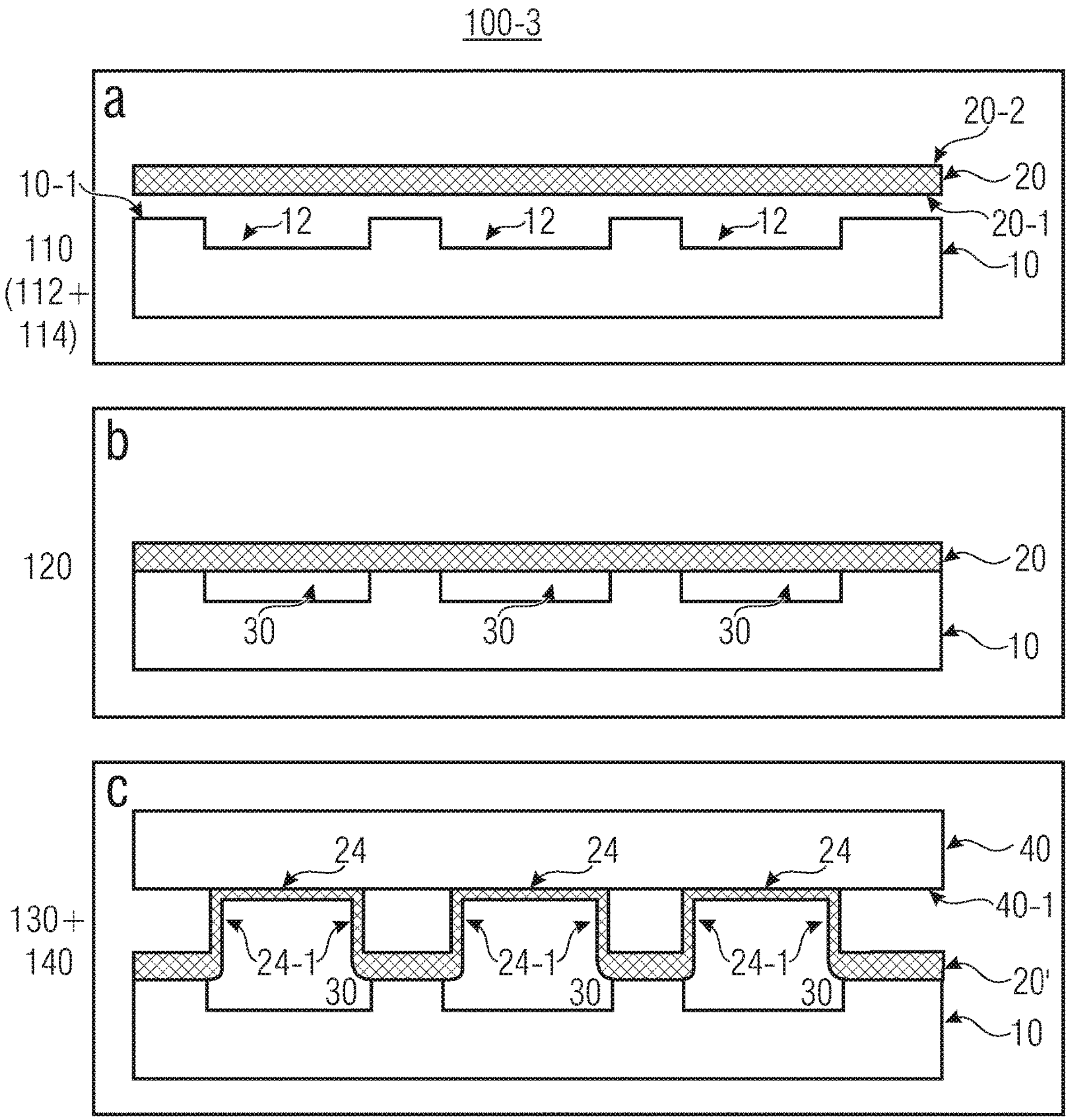
Figure 4B:
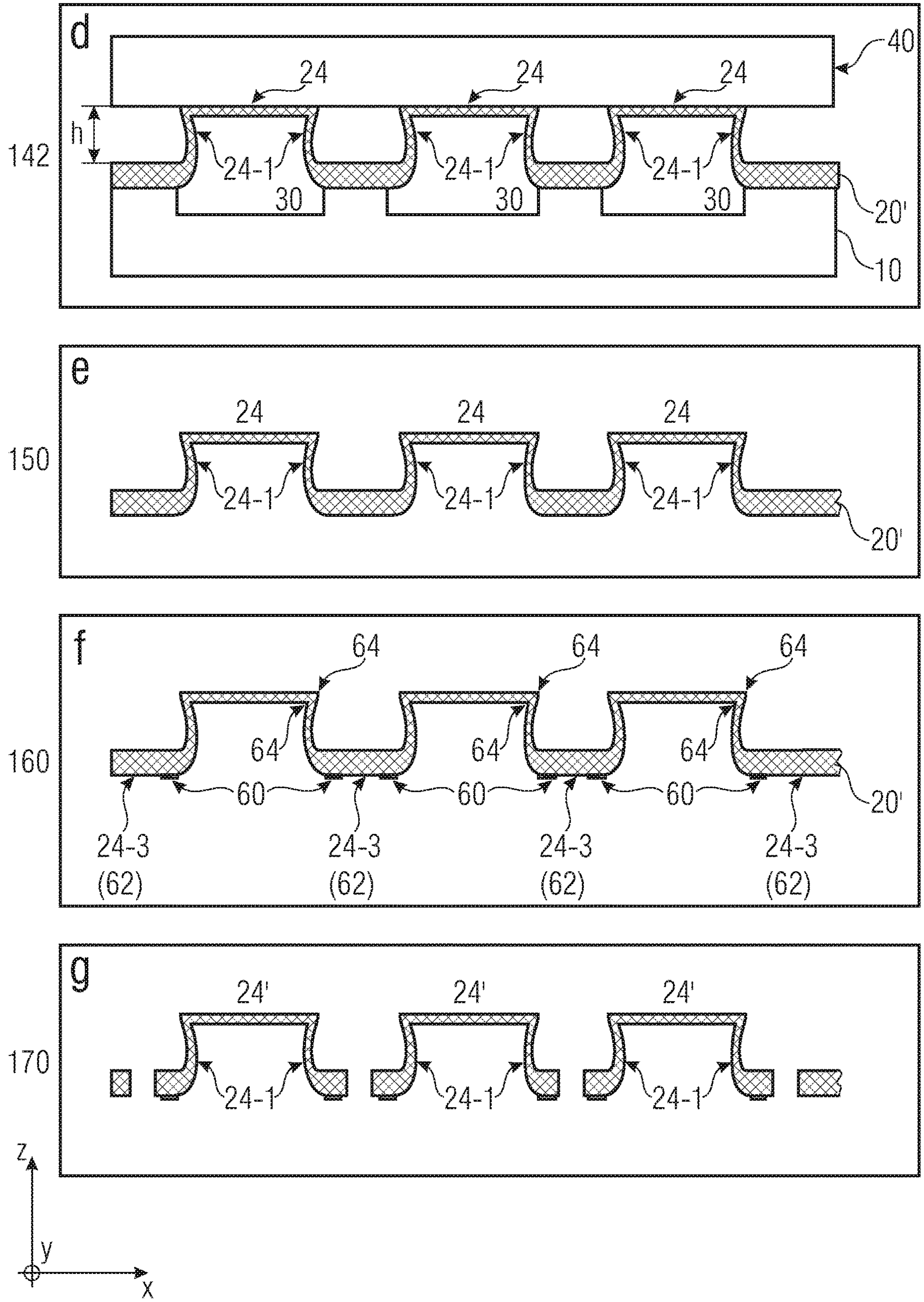

FIGS. 4A-4B now shows an exemplary flow diagram 100-3 of the inventive manufacturing method 100 for manufacturing a cap substrate, e.g., which may be used to house one or a plurality of optical, or optoelectronic, devices. For example, the window elements may be formed so as to be upright concave (bulged towards the inside) side windows.

In a step 110, first, the mold substrate 10, e.g. a semiconductor or silicon wafer, is provided with the structured surface region 10-1, i.e. the mold substrate 10 is provided with at least one recess 12. Furthermore, the cover substrate 20, e.g. a glass wafer, is provided.

In a step 112, the cover substrate 20 is arranged on the structured surface region 10-1 of the mold substrate 10 in an aligned way. Thus, for example, the second main surface region 20-2 of the cover substrate 20 adjacent to the mold substrate 10, i.e. at the raised regions of the structured surface region 10-1 of the mold substrate 10, may be planar, and may therefore be configured without recesses.

In a step 114, the cover substrate 20 is then bonded or joined, e.g. hermetically bonded by means of anodic bonding, to the mold substrate 10 so as to form at least one enclosed cavity between the cover substrate 20 and the mold substrate 10. In this case, the recess 12 arranged in the mold substrate 10, or the recesses 12 arranged in the mold substrate 10, each forms/form the at least on enclosed cavity 30 between the cover substrate 20 and the mold substrate 10.

According to an embodiment of the flow diagram 100-3 of the method 100, (hermetically) bonding 114 the cover substrate 20 to the mold substrate 10 is carried out in an atmosphere with a defined atmospheric ambient pressure so as to enclose a defined atmospheric pressure into the enclosed cavity 30.

Thus, in preparing the actual manufacturing process, the mold substrate 10, e.g. a silicon mold substrate, is provided with cavities and channel structures 12 (=recesses) on one side. The glass wafer 20 is aligned with respect to the mold substrate 10 and is, e.g. anodically, bonded in a defined atmosphere so as to enclose a (defined) gas pressure in the cavities and channels structures 30.

Thus, in a step 120, the mold substrate 10 and the cover substrate 20 that are bonded to each other are provided, wherein the surface region 10-1 of the mold substrate 10 is structured (configured with recesses or channel structures 12) to form the at least one enclosed cavity 30 between the cover substrate 20 and the mold substrate 10. In the step 120, e.g., an anodically bonded glass-silicon cap substrate 10, 20 is obtained, or provided.

In a (subsequent) step 130, the cover substrate 20 and the mold substrate 10 are now being tempered, i.e. subjected to a temperature treatment, or heated (warmed), so as to decrease the viscosity of the glass material of the cover substrate 20. Furthermore, in a step 140, an overpressure in the (at least one) enclosed cavity, or the enclosed cavities, 30 compared to the surrounding atmosphere is provided so as to cause, on the basis of the decreased viscosity of the glass material of the cover substrate 20 and the overpressure in the enclosed cavity 30 compared to the surrounding atmosphere, a defined bulging, e.g. blow-out or deformation, of the glass material of the cover substrate 20 starting from the enclosed cavity 30 up to a stop area 40-1, spaced apart from the cover substrate 20, of a stop element 40. The defined bulging of the glass material of the cover substrate 20 due to the overpressure in the enclosed cavity 30 and the decreased viscosity of the glass material may also be referred to as blow-out or deformation of the glass material. Through the defined bulging of the glass material of the cover substrate 20, a molded cover substrate 20' with (at least) one cap element 24 (=bulge or deformation) is therefore obtained. Thus, the obtained bulge or deformation of the molded cover substrate (=cap substrate) 20' is referred to as the cap element 24. According to an embodiment, the step 130 of tempering may be performed in a temperature range above 650° C., e.g. between 650° C. and 955° C., or between 650° C. and 750° C.

Furthermore, through the defined bulging of the cap substrate 20, configuration of the side windows 24-1 at the cap element 24 is caused, or they are molded. The side region of the cap element 24 is also referred to as (optically passive) window element or optically passive glass window 24-1.

According to an embodiment of the flow diagram 100-3 of the method 100, the step of tempering 130 and providing 140 an overpressure is performed as a glass flow process in a negative-pressure furnace 50 so as to obtain a defined atmospheric overpressure compared to the surrounding atmosphere in the enclosed cavity 30.

According to an embodiment of the flow diagram 100-3 of the method 100, in the step of tempering 130 and providing 140 an overpressure, the cover substrate 20 is bulged, or blown-out, in the region of the enclosed cavity 30 up to a height h specified by the vertical distance of the stop area 40-1 of the stop 40 to the first main surface region 20-1 of the cover substrate 20.

According to an embodiment of the flow diagram 100-3 of the method 100, the region, opposite the cavity 30 or the cavity regions 30, of the stop area 40-1 of the stop element 40 is configured to be planar and parallel to the main surface region 20-1 of the cover substrate 20 (=parallel to the reference plane) so as to form a planar ceiling region 24-2 of the cap element 24 in the step of tempering 130 and providing 140 an overpressure.

According to a further embodiment of the flow diagram 100-3 of the method 100, in the step 142 of (defined) cooling the molded cover substrate 20' in a temperature range above 650° C., e.g. between 650° C. and 955° C., or between 650° C. and 750° C., an atmospheric negative pressure may be caused in the enclosed cavities 30 compared to the surrounding atmosphere so as to generate a concave bulge of the sidewall regions (side windows) 24-1 of the cap element 24 of the molded cover substrate 20' towards the inside. According to an embodiment of the method 100-3, the step of tempering 130 and providing 140 the negative pressure may be performed in a negative-pressure furnace 50, wherein the atmospheric negative pressure P in the enclosed cavity 30 compared to the surrounding atmosphere is obtained through an increased atmospheric pressure in the negative-pressure furnace 50.

In a subsequent step 150, the stop element 40 and the mold substrate 10 are now removed from the molded cover substrate 20', wherein the molded cover substrate 20' now forms the cap substrate 20' with the at least one cap element 24. For example, the cap substrate 20' may be used for housing one or a plurality of optical or optoelectronic components.

According to an embodiment, the flow diagram 100-3 of the method 100 may further comprise the step 142 of cooling the stop element 40, the mold substrate 10, and the molded cover substrate 20', wherein, in a step 150, the mold substrate 10 is subsequently removed by means of an etching process, e.g. a silicon or semiconductor etching process of the silicon or semiconductor material of the mold substrate.

In a (optional) subsequent step 160, the process sequence 100-3 of the method 100 may further comprise applying, or depositing, a metallization 60 as a (continuous) frame structure, or as a sealing frame on bonding regions 62 at the second main surface region 20-2 at non-bulged regions (socket regions) 24-3 of the cap elements 24 of the molded cover substrate (of the cap substrate) 20'.

According to an embodiment, in a step 160, an anti-reflection coating 64 may be applied or deposited on an inner-side and/or outer-side region, e.g. on an inside and/or outside on the ceiling region 24-2 and/or the sidewall region 24-1, of the cap element 24 of the molded cover substrate 20'.

In a (optional) subsequent step 170, the process sequence 100-3 of the method 100 may further comprise dicing the molded cover substrate 20' so as to obtain diced cap elements 24'. Dicing 170 the glass cap substrate 20' may be carried out by means of sawing or laser separation, for example. With the diced caps 24', optical structures may be hermetically sealed on the individual substrate plane or on the wafer plane by means of individual capping, as will be subsequently described.

In the following, some method steps of the process sequence 100-3 of the method 100 of FIGS. 4A-4B are again illustrated in a summarized way.

Thus, FIGS. 4A-4B shows a flow diagram 100-3 that illustrates a first process sequence 100-3 for manufacturing a cap substrate 20' on the basis of steps 110 to 170. The cap substrate 20' resulting from the manufacturing method 100-3 comprises, after the process sequence, e.g., (at least) one optically passive side window 24-1 that is an integral component of the cap element 24 (cap) and enables lateral beam decoupling and/or coupling.

Thus, the process sequence 100-3 of FIGS. 4A-4B includes a step 110 of providing the mold substrate with a structured (provided with recesses) surface region, wherein the mold substrate comprises a semiconductor material, such as silicon, or consists of the semiconductor material, such as silicon. Subsequently, arranging the unstructured cover substrate on the structured surface region of the mold substrate takes place. The cover substrate comprises a glass material or consists of a glass material. In arranging the cover substrate on the mold substrate, the structured surface of the mold substrate is arranged so as to at least partially overlap a surface of the cover substrate, and, in bonding the cover substrate to the mold substrate, it is anodically bonded or hermetically joined, for example. The structured surface of the mold substrate is bonded to the surface of the cover substrate, e.g., in a gas-tight manner with a defined enclosed inner atmosphere in the recesses (cavities).

For example, subsequently, tempering 130 the bonded substrates 10, 20 in a negative-pressure furnace such that a blow-out of the glass material of the cover substrate is caused in the region of the recesses through the enclosed pressure in relation to the furnace pressure takes place.

In the glass flow process, a stop of the flow front occurs at the stop area 40-1 of the stop element 40 in an adjustable distance h in the negative-pressure furnace, wherein the stop element 40 with the stop area 40-1 comprises a silicon wafer or consists of a silicon wafer, for example.

In the glass flow process 130, 140, cooling the bonded substrate is carried out under a reproducible temperature and pressure ramp so as to generate the concave window shape. Finally, removing the cap substrate 20' with the mold substrate and, e.g., the stop element 40 from the furnace 50 takes place.

Then, removing 150 the stop element 40 and the mold substrate 10 is carried out so as to obtain the structured cap substrate 20' gained from the cover substrate 20 by the blow-out process.

FIGS. 5A-5B now shows an exemplary flow diagram 100-4 of the inventive manufacturing method 100 for manufacturing a cap substrate 20' with a reusable stop element 40, or with a reusable stop area 40.

In a step 110, first, the mold substrate 10, e.g. a semiconductor or silicon wafer, is provided with the structured surface region 10-1, i.e. the mold substrate 10 is provided with at least one recess 12. Furthermore, the cover substrate 20, e.g. a glass wafer, is provided.

In a step 112, the cover substrate 20 is arranged in an aligned way on the structured surface region 10-1 of the mold substrate 10. Thus, for example, the second main surface region 20-2 of the cover substrate 20 adjacent to the mold substrate 10, i.e. adjacent to the raised regions of the structured surface region 10-1 of the mold substrate 10, may be configured to be planar and therefore without any recesses.

In a step 114, the cover substrate 20 is then bonded, or joined, e.g. hermitically bonded by means of anodic bonding, to the mold substrate 10 so as to form at least one enclosed cavity 30 between the cover substrate 20 and the mold substrate 10. In this case, the recess 12 arranged in the mold substrate 10, or the recesses 12 arranged in the mold substrate 10, each forms/form the at least one enclosed cavity 30 between the cover substrate 20 and the mold substrate 10.

In a step 120, thus, the mold substrate 10 and the cover substrate 20 that are bonded to each other are provided, wherein the surface region 10-1 of the mold substrate 10 is structured (configured with recesses or channel structures 12) so as to form the at least one enclosed cavity 30 between the cover substrate 20 and the mold substrate 10. In a step 120, e.g., an anodically bonded glass-silicon cap substrate 10, 20 is obtained, or provided.

In a (subsequent) step 130, the cover substrate 20 and the mold substrate 10 are now being tempered, i.e. subjected to a temperature treatment, or heated (warmed), so as to decrease the viscosity of the glass material of the cover substrate 20. Furthermore, in a step 140, an overpressure in the (at least one) enclosed cavity, or the enclosed cavities, 30 compared to the surrounding atmosphere is provided so as to cause, on the basis of the decreased viscosity of the glass material of the cover substrate 20 and the overpressure in the enclosed cavity 30 compared to the surrounding atmosphere, a defined bulging, e.g. blow-out or deformation, of the glass material of the cover substrate 20 starting from the enclosed cavity 30 up to a stop area 40-1, spaced apart from the cover substrate 20, of a stop element 40. According to an embodiment, the step 130 of tempering may be performed in a temperature range above 650° C., e.g. between 650° C. and 955° C., or between 650° C. and 750° C.

According to an embodiment of the flow diagram 100-4 of the method 100, the step of tempering 130 and providing 140 an overpressure is performed as a glass flow process in a negative-pressure furnace 50 so as to obtain in the enclosed cavity 30 a defined atmospheric overpressure compared to the surrounding atmosphere.

According to an embodiment of the flow diagram 100-4 of the method 100, in the step of tempering 130 and providing 140 an overpressure, the cover substrate 20 is bulged, or blown-out, in the region of the enclosed cavity 30 up to a height h specified by the vertical distance of the stop area 40-1 of the stop 40 to the first main surface region 20-1 of the cover substrate 20.

According to an embodiment of the flow diagram 100-4 of the method 100, the region, opposite the cavity 30 or the cavity regions 30, of the stop area 40-1 of the stop element 40 is configured to be planar and parallel to the main surface region 20-1 of the cover substrate 20 (=parallel to the reference plane) so as to form, in the step of tempering 130 and providing 140 and overpressure, a planar ceiling region 24-2 of the cap element 24.

According to an embodiment, the stop element 40 may be configured as a reusable tool and may comprise a non-stick coating 42 (as the stop area 40 or at the same) for the glass material of the cover substrate 20 at least at the region 40-1, opposite the cavity 30, of the stop area 40 or at the entire stop area 40.

In a subsequent step 150, the reusable stop element 40 and the mold substrate 10 are now removed from the molded cover substrate 20', wherein the molded cover substrate 20' now forms the cap substrate 20' with the at least one cap element 24. For example, the cap substrate 20' may be used for housing one or a plurality of optical or optoelectronic devices.

According to an embodiment, the flow diagram 100-4 of the method 100 may further comprise the step 142 of cooling the stop element 40, the mold substrate 10, and the molded cover substrate 20', wherein, in a step 150, the mold substrate 10 is subsequently removed by means of an etching process, e.g. a silicon or semiconductor etching process of the silicon or semiconductor material of the mold substrate.

In an (optional) subsequent step 160, the process sequence 100-4 of the method 100 may further comprise applying, or depositing, a metallization 60 as a (continuous) frame structure, or as a sealing frame, on bonding regions 62 at the second main surface region 20-2 at non-bulged regions (socket regions) 24-3 of the cap elements 24 of the molded cover substrate (of the cap substrate) 20'.

According to an embodiment, in a step 160, an anti-reflection coating 64 may be applied or deposited on an inner-side and/or outer-side region, e.g. on the inside and/or outside on the ceiling region 24-2 and/or the sidewall region 24-1, of the cap element 24 of the molded cover substrate 20'.

In an (optional) subsequent step 170, the process sequence 100-4 of the method 100 may further comprise dicing the molded cover substrate 20' so as to obtain diced cap elements 24'. Dicing 170 the glass cap substrate 20' may be carried out by means of sawing or laser separation, for example. With the diced caps 24', optical structures may be hermetically sealed on the individual substrate plane or on the wafer plane by means of individual capping, as will be illustrated in the following.

In the following, some method steps of the process sequence 100-4 of the method 100 of FIGS. 5A-5B are illustrated again in a summarized way.

That is, FIGS. 5A-5B show a flow diagram 100-4 that illustrates a process sequence 100-4 for manufacturing a cap substrate 20' on the basis of steps 110 to 170. After the process sequence, the cap substrate 20' resulting from the manufacturing method 100-4 comprises, e.g., (at least) one optically passive side window 24-1 that is an integral component of the cap element 24 (cap) and enables lateral beam decoupling and/or coupling.

Thus, the process sequence 100-4 of FIGS. 5A-5B includes a step 110 of providing the mold substrate with a structured (provided recesses) surface region, wherein the mold substrate comprises a semiconductor material, such as silicon, or consists of the semiconductor material, such as silicon. Subsequently, arranging the unstructured cover substrate on the structured surface region of the mold substrate takes place. The cover substrate comprises a glass material or consists of a glass material. In arranging the cover substrate on the mold substrate, the structured surface of the mold substrate is arranged so as to at least partially overlap a surface of the cover substrate, and, in bonding the cover substrate to the mold substrate, e.g., it is anodically bonded or hermetically joined.

Subsequently, e.g., tempering 130 the bonded substrate 10, 20 in a negative-pressure furnace such that a blow-out of the glass material of the cover substrate is caused in the region of the recesses through the enclosed pressure in relation to the furnace pressure takes place.

In the glass flow process, a stop of the flow front occurs at the stop area 42 (at the first main surface region 40-1) of the stop element 40 in an adjustable distance h in the negative pressure oven, wherein, with the stop area 42, the stop element 40, e.g., comprises a silicon wafer or consists of a silicon wafer. The stop tool 40 or only the stop area 42 of the stop tool 40 comprises a high-melting material, such as silicon, metal, ceramics, or glass ceramics, with a glass-rejecting protective layer, e.g. on the basis of boron nitride, carbon, etc., or consists of the same, so as to make the stop tool 40, or the stop area 42, reusable.

According to an embodiment, thus, coating a silicon wafer 40 on the main surface region 40-1 with a glass-rejecting layer 42 may be carried out so as to obtain the stop area 42. Thus, a semiconductor wafer 40 may be provided with a glass-rejecting passivation layer 42 on a surface 40-1.

In the case of reusable stop elements, or stop areas, e.g. a (selectable or elaborate) negative molding may be provided so as to transfer these high-value shapes by means of the glass flow process into the upper window of the cap element. Thus, for structures (which are at least not too fine) a shape transfer (from the stop area into the upper window of the cap element) may be 100% possible. Thus, for example, flat lenses or holographic structures may be transferred from the stop area into the upper window 24-2 of the cap element 24.

In the glass flow process 130, 140, cooling the bonded substrates under a reproducible temperature and pressure ramp is carried out so as to generate the concave window shape. Finally, removing the cap substrate 20' with the mold substrate and, e.g., the stop element 40 from the furnace 50 is carried out.

Then, removing 150 the reusable stop element 140 and the mold substrate 10 is carried out so as to obtain the structured cap substrate 20' gained from the cover substrate 20 through the blow-out process.

In summary, it can be noted that FIGS. 2A-5B illustrate possible and optional sub-steps and process sequences of the method 100 for manufacturing a cap substrate 20' as described on the basis of FIG. 1. These sub-steps and process sequences illustrated in FIGS. 2A-5B comprise variations in other implementations. Possible process sequences are illustrated, such as manufacturing the cap wafer 20', i.e. the cap substrates 20', with the vertical, convex, or concave optically passive window areas 24-1, 24-2. Essentially, the method 100 is based on techniques of the so-called glass flow. In a preparation step, coating a silicon wafer 40, i.e. a stop area 40, with a glass-rejecting layer 42 is carried out.

For example, the spatial cap substrate 20' is a prerequisite for manufacturing improved housed radiation-emitting devices 1' with the subsequently described method 200. The above sub-steps and process sequences are only examples and may comprise variations in other implementations. A possible process sequence for how manufacturing of these cap wafers, i.e. the cap substrates, with the window areas 24-1, 24-2 may be carried out is illustrated.

FIGS. 6A-6C now shows a further principle process sequence 100-5 of the inventive manufacturing method 100 according to a further embodiment. In the following, differences, or different method steps, of the flow diagram 100-5 of FIGS. 6A-6C are essentially illustrated compared to the flow diagrams 100-1, 100-2, 100-3, 100-4 of FIGS. 2A to 5B. Thus, the above description of FIGS. 1 to 5B may be applied accordingly to the subsequent description of the embodiment of FIGS. 6A-6C, wherein, above all, differences, such as different (=alternative and/or additional) process steps and/or elements compared to the previous process sequences and the technical effects resulting therefrom are considered in the following description.

In a step 110, first, the mold substrate 10, e.g. a semiconductor or silicon wafer, is provided with the structured surface region 10-1, i.e. the mold substrate 10 is provided with at least one recess 12. Furthermore, the cover substrate 20, e.g. a glass wafer, is provided. The cover substrate 20 comprises a glass material.

In a step 112, the cover substrate 20 is arranged on the structured surface region 10-1 of the mold substrate 10 (in an aligned way). In a step 114, the cover substrate 20 is then bonded to the mold substrate 10, e.g. hermetically bonded by means of anodic bonding (e.g. in a defined atmosphere), so as to form at least one enclosed cavity 30 or a plurality of sub-cavities 30 between the cover substrate 20 and the mold substrate 10. (Hermetically) bonding 114 the cover substrate 20 to the mold substrate 10 may be carried out in an atmosphere with a defined atmospheric ambient pressure so as to enclose a defined atmospheric pressure into the enclosed cavities 30. The cover substrate 20 and/or the mold substrate 10 is/are configured to form the enclosed cavity 30 with one or a plurality of enclosed cavity regions 30 between the cover substrate 20 and the mold substrate 10, wherein the enclosed cavity regions 30 are arranged so as to be fluidically separated from each other, and wherein gas exchange channels 30-1 may further be provided between the cavity regions 30 enclosed by the surrounding atmosphere so as to fluidically couple them to obtain a common defined atmospheric pressure in the bonded cavity regions 30.

In the step 120, thus, the mold substrate 10 and the cover substrate 20 that are (fixedly) bonded to each other are provided, wherein the surface region 10-1 of the mold substrate 10 is structured (configured with recesses or channel structures 12).

In the (subsequent) step 130, the cover substrate 20 and the mold substrate 10 are now tempered, i.e. subjected to temperature treatment, or heated (warmed), so as to decrease the viscosity of the glass material of the cover substrate 20. Furthermore, in a step 140, an overpressure in the (at least one) enclosed cavity, or the enclosed cavities 30, compared to the surrounding atmosphere is provided so as to cause a defined bulging, e.g. blow-out or deformation, of the glass material of the cover substrate 20. Through the defined bulging of the glass material of the cover substrate 20, a molded cover substrate 20' with (at least) one cap element 24 is obtained, wherein the bulges or deformations, i.e. the blown-out regions, then form the sidewall regions 24-1 and the sub-regions 24-3 of the resulting cap elements 24.

According to an embodiment of the flow diagram 100-5 of the method 100, the step of tempering 130 and providing 140 an overpressure is performed as a glass flow process in a negative-pressure furnace 50 so as to obtain a defined atmospheric overpressure compared to the surrounding atmosphere in the enclosed cavities 30. According to an embodiment of the flow diagram 100-5 of the method 100, in the step of tempering 130 and providing 140 an overpressure, the cover substrate 20 is bulged, or blown-out, in the region of the enclosed cavity up to a height h specified by the vertical distance of the stop area 40-1 of the stop 40 to the main surface area 20-1 of the cover substrate 20.

According to an embodiment of the flow diagram 100-5 of the method 100, the region of the stop area 40-1, opposite the cavity 30 or the cavity regions 30, of the stop element 40 is configured to be planar and parallel to the main surface region 20-1 of the cover substrate 20 so as to form a planar socket region 24-3 of the cap element 24 in the step of tempering 130 and providing 140 an overpressure. Performing the glass flow process 130, 140 may be carried out in a pressure-controlled furnace (e.g. a negative-pressure furnace) 50. A glass wafer (cover substrate) 20 is blown out in regions of the cavities 30 up to the height h, which may be determined by a stop area 40-1 of the stop element 40.

In the further process sequence 100-5 of the manufacturing method 100 illustrated in FIGS. 6A-6C, the frames (sidewall regions 24-1 and socket regions 24-3) of the cap elements 24 are blown-up, or blown-out. Thus, so to speak, an inversion of the glass cap (cavity points upwards=z direction) is obtained. This approach may achieve that the cap form is not deteriorated by the glass flow process. The cap substrate 20 is fixedly and anodically bonded to the mold substrate 10 and the surrounding channel structures or trench structures 12 in the mold substrate 10 are blown-out and formed the cavity/cavities 39 with the distance h.

FIGS. 2A-6C illustrate possible and optional sub-steps and process sequences of the method 100 for manufacturing a cap substrate 20', as described on the basis of FIG. 1. The sub-steps and process sequences illustrated in FIGS. 2A-6C are only examples and may comprise variations in other implementations. Possible process sequences as to how manufacturing of the cap wafer 20', i.e. the cap substrate 20', with the optically neutral window areas 24-1 may be done are illustrated. The method 100 is essentially based on techniques of the so-called glass flow. In a preparation step, coating a silicon wafer 40, i.e. a stop area 40-1, with a glass-rejecting layer is carried out.

For example, the special cap substrate 20' is a prerequisite for manufacturing improved house radiation-emitting devices 1' with the subsequently described method 200. The above sub-steps and process sequences are only examples and may comprise variations in other implementations. A possible process sequence as to how manufacturing of these cap wafers, i.e. the cap substrates, with the optical window areas 24-1 may be done is illustrated.

With respect to the process sequences previously illustrated on the basis of FIGS. 2A-6C, it can be summarized that, in the process sequences 100-1, 100-2, 100-3 and 100-4, when bulging the glass material of the cover substrate (step 140), the side windows 24-1 and cap regions 24-2 are bulged (blown-out or deformed), whereas in the process sequence 100-5, when bulging the glass material of the cover substrate 20, the side windows 24-1 and the socket regions 24-3 are bulged so as to obtain the deformed cap cover substrate 20' with the cap elements 24'.

According to an embodiment of the method, thus, in the step of tempering 130 and providing an overpressure, the side windows 24-1 and the cap region 24-2 (in the processes 100-1, 100-2, 100-3, 100-4), or, on the other hand, the side windows 24-1 and the socket regions 24-3 (in the process 100-5) are bulged with the glass material of the cover substrate 20 starting from the enclosed cavity 30 up to the spaced apart stop area 40-1 of the stop element 40.

FIG. 7 now shows a schematic flow diagram of an inventive method 200 for manufacturing a hermetically housed optical or optoelectronic device 1' according to an embodiment.

Before the subsequent embodiments are described in detail on the basis of the drawings, it is to be noted that identical or functionally-identical elements, objects, functional blocks and/or method steps, or elements, objects, functional blocks and/or method steps having the same effect are provided in the different drawings with the same reference numerals so that the description of these elements, objects, functional blocks and/or method steps illustrated in different embodiments is interchangeable and may be applied to each other.

In the method 200 for manufacturing a hermetically housed optical device, e.g. an optoelectronic transmission and/or reception device, the following steps are now performed. First, in a step 210, the above described method 100 with the exemplary process sequences 100-1, 100-2, 100-3, 100-4, 100-5 for manufacturing a molded cover substrate (=structured cap substrate) 20' is performed. Here, the molded cover substrate 20' may comprise a single or a diced cap element 24' or may also comprise a plurality, or a multitude, of cap elements 24 (e.g. cap wafers on the wafer level).

Furthermore, in a step 220, a device substrate 2 is provided with at least one optoelectronic device 1 (=transmission and/or reception device) arranged thereon. According to an embodiment, a device substrate 2 may be provided with a single optoelectronic device 1 or as a device wafer tool with a plurality of optoelectronic devices 1 arranged thereon.

According to an embodiment, e.g., the step 210 of performing the method 100 may be carried out on the wafer-level, wherein a multitude of optical devices 1 is arranged on the device substrate 2 (device wafer), and wherein the molded cover substrate 20' (cap wafer) comprises a multitude of cap elements 24. In this connection, for example, reference is made to FIGS. 8A-10C and the associated description.

According to an embodiment, the step 230 of the method 200, e.g., further comprises a step of bonding, or hermetically bonding, the device substrate 2 and the molded cover substrate 20' along an intermediate bonding region 60, 61, such as a bond frame. In this connection, e.g., reference is also made to FIGS. 8A-10C and the associated description.

According to an embodiment of the method 200, the bonding region 60 comprises, e.g., a metallization at the second main surface region 20-2 so as to form a frame structure, e.g. a continuous frame structure, on non-bulged regions 24-3 (=socket regions) of the molded cover substrate 20', wherein the method 200 further comprises a step 230 of bonding the molded cover substrate 20' and the device substrate 2 by means of a bond frame 60. For example, the bond frame 60 may comprise a metallic solder material 66. In this connection, e.g., reference is also made to FIGS. 8A-10C and the associated description.

According to an embodiment, the step 230 of the method 200, e.g., further comprises a step of bonding the device substrate 1 and the cover substrate 20' by means of direct laser welding, laser soldering, eutectic solder bonding, thermal compression bonding, glass frit bonding, reactive nano-metal layer soldering (RMS) or induction soldering along the bonding region 61. In this connection, e.g., reference is also made to FIGS. 8A-10C and the associated description.

According to an embodiment, e.g., the method 200 further includes the steps of dicing 170 the molded cover substrate 20' so as to obtain diced cap elements 24', and (hermetically) bonding 230 the diced cap elements 24' with a device substrate 2 so as to obtain the housed optical device 1'. In this connection, e.g., reference is also made to FIGS. 8A-10C and the associated description.

According to an embodiment, e.g., the method 200 further comprises the steps of (hermetically) bonding 230 the molded cover substrate 20' to the multitude of cap elements 24 with the device substrate 2 comprising a multitude of optoelectronic devices 1 so as to obtain a multitude of housed optical devices 1' (on the wafer level), and further comprises the step of dicing 240 the multitude of housed optical devices 1' so as to obtain diced hermetically housed optical devices 1'. For example, the step of dicing 240 may be carried out by sawing or laser separation. In this connection, e.g., reference is also made to FIGS. 8A-10C and the associated description.

According to an embodiment, e.g., the method 200 further comprises the steps of dicing the molded cover substrate 20' to obtain diced cap elements 24', dicing the device substrate 2 to obtain diced devices 1 on the diced device substrates 2', and (hermetically) bonding 230 of each diced cap element 24' to the respective diced device 1 so as to obtain a housed optical device 1'. In this connection, e.g., reference is also made to FIGS. 8A-10C and the associated description.

In the method 200 for manufacturing a housed radiation-emitting device 1, e.g. which may be carried out on the wafer level, according to an embodiment, arranging and hermetically bonding 230 the substrates 2, 20', i.e. the device substrate 2 and the molded cover substrate 20', is carried out under a specified atmosphere. This may ensure that the housing 2, 20', or its inner volume (cavity) 32, is fully free of organic substances or water vapor so that the service life of the optoelectronic device 1, e.g., illumination diodes or laser diodes, is not effected.

For example, dry air (=reactive atmosphere), nitrogen, or any other type of inertial atmosphere, may be located in the cavity 32, but even a negative pressure or a full vacuum may be set up in principle and may additionally be maintained over long periods of time by introducing particular getter layers 4. A vacuum may be understood as a reduced atmospheric pressure (negative pressure) in the cavity 32 of approximately 100 Torr, 50 Torr, 5 Torr, or 1 Torr or pressure values below that. The cavity 32 may be configured in a hermetically tight way so as to oppose introduction of water vapor. In this connection, e.g., reference is also made to FIGS. 8A-10C and the associated description.

In some embodiments, the housed optoelectronic (radiation-emitting or radiation-sensitive) device 1 is configured such that the device substrate 2 serves as a housing socket and as a support area for the radiation-emitting device 1, wherein the cap substrate 20' interacts with the housing socket 2 so as to hermetically seal the cavity 32 of the housing 5. In this connection, e.g., reference is also made to FIGS. 8A-10C and the associated description.

In some embodiments, the housed radiation-emitting device 1' is configured such that the housing socket 2 (device substrate) is configured as a socket wafer including several housing socket elements 2', and/or the cap substrate 20' is configured as a cap wafer including several cap elements 24. In this connection, e.g., reference is also made to FIGS. 8A-10C and the associated description.

In some embodiments, the housed radiation-emitting device 1' is configured such that an intermediate carrier 6 for the radiation-emitting device 1 is arranged between the device substrate 2 and the radiation-emitting device 1 so that the device substrate 2 indirectly carries the radiation-emitting device 1 (via the intermediate carrier 6). In this connection, e.g., reference is also made to FIGS. 8A-10C and the associated description.

In some embodiments, the housed radiation-emitting device 1' is configured such that the device element 2 and the cap substrate 20' are fixed to each other by means of a bond frame 60, 61 comprising a metallic solder material 66. The bond frame may fix the opposing metallization 60, 61 at the cap substrate 20' (on the second main surface region 20-2) and the device substrate 2 (on the first main surface region 2-1) with the intermediate solder material 66 creating a mechanical and electrical connection between the metallization 60, 61. In this connection, e.g., reference is also made to FIGS. 8A-10C and the associated description.

In some embodiments, the housed radiation-emitting device 1' is configured such that a conductor path 7 for electrically coupling (or connecting) the radiation-emitting device 1 is arranged on the side of the device substrate 2, and such that the conductor path 7 is led out from the cavity 32, e.g. laterally, between the cap substrate 20' and the device substrate 2. In this connection, e.g., reference is made to FIGS. 8A-10C and the associated description.

In some embodiments, the housed radiation-emitting device 1' is configured such that a conductor path 7 for electrically coupling the radiation-emitting device 1 is arranged on the side of the device substrate 2, and the conductor path 7 is led out of the cavity 32 downwards through the device substrate 2. To this end, e.g., a TSV arrangement and/or TGV arrangement 7-1 (Through Silicon Vias (TSV) or Through Glass Vias (TGV)) may be used. In this connection, e.g., reference is also made to FIGS. 8A-10C and the associated description.

In some embodiments, the housed radiation-emitting device 1 is configured such that, on the side of the device substrate 2, an optical bank 8 with one or several additional optical elements 8-1, e.g., discrete lens elements, is placed in front of the optical decoupling window (optical side window) 24-1 so that the optical decoupling window 24-1 is arranged between the optical bank 8 with the additional optical element 8-1 and the radiation emitting device 1. In this connection, e.g., reference is also made to FIGS. 8A-10C and the associated description.

In some embodiments, the housed radiation-emitting device 1 is configured such that the optical bank 8 with the additional optical elements 8-1, e.g. lenses, prisms, mirrors, apertures, etc., is arranged on the device substrate 2 and is located in the radiation direction of the radiation-emitting device 2. In this connection, e.g., reference is also made to FIGS. 8A-10C and the associated description.

In some embodiments, the housed radiation-emitting device 1 is configured such that it further comprises an element (conversion element) 9 effective for light color conversion of the emitted light so that the optical decoupling window 24-1 is arranged between the effective element 9 and the radiation-emitting device 1.

In some embodiments, the housed radiation-emitting device 1 is configured such that the cavity 32 comprises a reactive atmosphere and/or the cavity 32 exclusively contains inorganic substances. The cavity 32 may also be configured to be hermetically sealed against introduction of water vapor. This ensures, or at least supports, a long service life of, e.g., blue and green laser diodes.

In some embodiments, the housed radiation-emitting device 1 is configured such that an electronic driver circuit 3 is arranged in the cavity. The one electronic driver circuit 3 may be integrated into the mounting substrate 2, for example.

In some embodiments, radiation-emitting devices and photodetectors are located in the same cavities of the cap substrate.

In some embodiments, radiation-emitting devices and photodetectors are located in adjacent cavities of the cap substrate, configured such that the device substrate forms a mutual housing socket. According to embodiments, optical decoupling between adjacent cavities is not required.

In some embodiments, the housed optoelectronic device 1 comprises a detector element and an emitter element in a housing 5.

According to the above explanations, the manufacturing method 200 for hermetically housing an optoelectronic device 1 enables different embodiments and implementations of the resulting hermetically housed optoelectronic device 1', e.g.:

Capping of individual diodes 1 (or individual optoelectronic devices 1 in general) on a sub-mount 6 in a hermetically sealed housing 5, provided by bonding a cap 20' with at least one lateral optically neutral window area 24-1.

Capping of individual laser diodes 1 directly on a substrate 2 in a hermetically sealed housing 5, provided by bonding a cap 20' with at least one lateral optically neutral window area 24-1.

Capping of individual laser diodes 1 and individual passive optical elements in a hermetically sealed housing 5, provided by bonding a cap 20' with at least one lateral window area 24-1.

Capping of one or several laser diodes 1 with fast focus collimation through a mutual cylinder lens (top or side) within the hermetically sealed housing, optionally with one further lens each or with a mutual multi-cylinder lens 8 for slow axis collimation outside of the hermetic housing 5.

Capping of one or several laser diodes 1 with beam collimation through individual collective lenses within the hermetically sealed housing (top or side), optionally with a further lens each or a mutual multi-collective lens 8 for further beam collimation outside of the hermetic housing 5, optionally with an optical structure for beam superposition and optionally for static beam deflection.

Capping of one or several laser diodes 1 with beam collimation through individual collective lenses within the hermetically sealed housing (top or side), optionally with a further lens each or a mutual multi-collective lens 8 for further beam collimation outside of the hermetic housing 5, optionally with an optical structure for beam superposition and optionally for static beam deflection.

Capping of laser diodes on a sub-mount with an electronic driver circuit within the germetic housing.

Capping of one or several laser diodes 1 with or without sub-mount with or without fast axis collimation and light color conversion through a phosphorus body arranged at the outside and fixed as a mold body or dispensed and cured as phosphorous bound in a polymer (epoxy or silicon matrix).

The optically active devices arranged outside (=outside of the housing 5) may be soldered or fixed by an adhesive since organic outgassing cannot generate clouding in the beam exit.

Capping of at least one semiconductor-based light source 1 and at least one photodetector 1-2 in the hermetically sealed housing 5, provided by bonding (=method 200) of a glass cap 20' manufactured according to the above-mentioned methods 100, e.g., with an optically neutral window area facing away from the substrate 2.

For example, The devices 1 arranged in the cavity 32 and the capping 20' itself may be joined by means of metallic joining methods such as soldering, eutectic AuSn soldering, etc., so as to avoid organic outgassing in the housing 5. Soldering flux does not have to be used.

The above embodiments and further implementations may be applied for the inventive concept individually or in any combination.

In the following, exemplary process flows, or process sequences, for implementing the principle manufacturing method 200 illustrated in FIG. 7 are now described on the basis of FIGS. 8A-10C. In FIGS. 8A-10C, the drawing plane again extends in parallel to the x-z plane.

All subsequently described process alternatives to the method 200 are based on the underlying concept that, first, the molded cover substrate 20', i.e. the structured cap substrate with one or a plurality of cap elements 24, is created with the above method 100. Furthermore, a device substrate 2 having arranged thereon one or a plurality of optoelectronic devices 1 is provided (step 220). In a step 230, the molded cover substrate 20' and the device of the substrate 1 are bonded to each other, e.g. hermetically bonded, so as to hermetically house the optical device 1, i.e. to accommodate the same in a housing in a hermetically sealed way against the ambient atmosphere, or against environmental influences. A hermetic or hermetically sealed housing is considered to be a fluidically tight mechanic connection (capping) of the device substrate 2 and the molded cover substrate 20'.

Figure 8A:
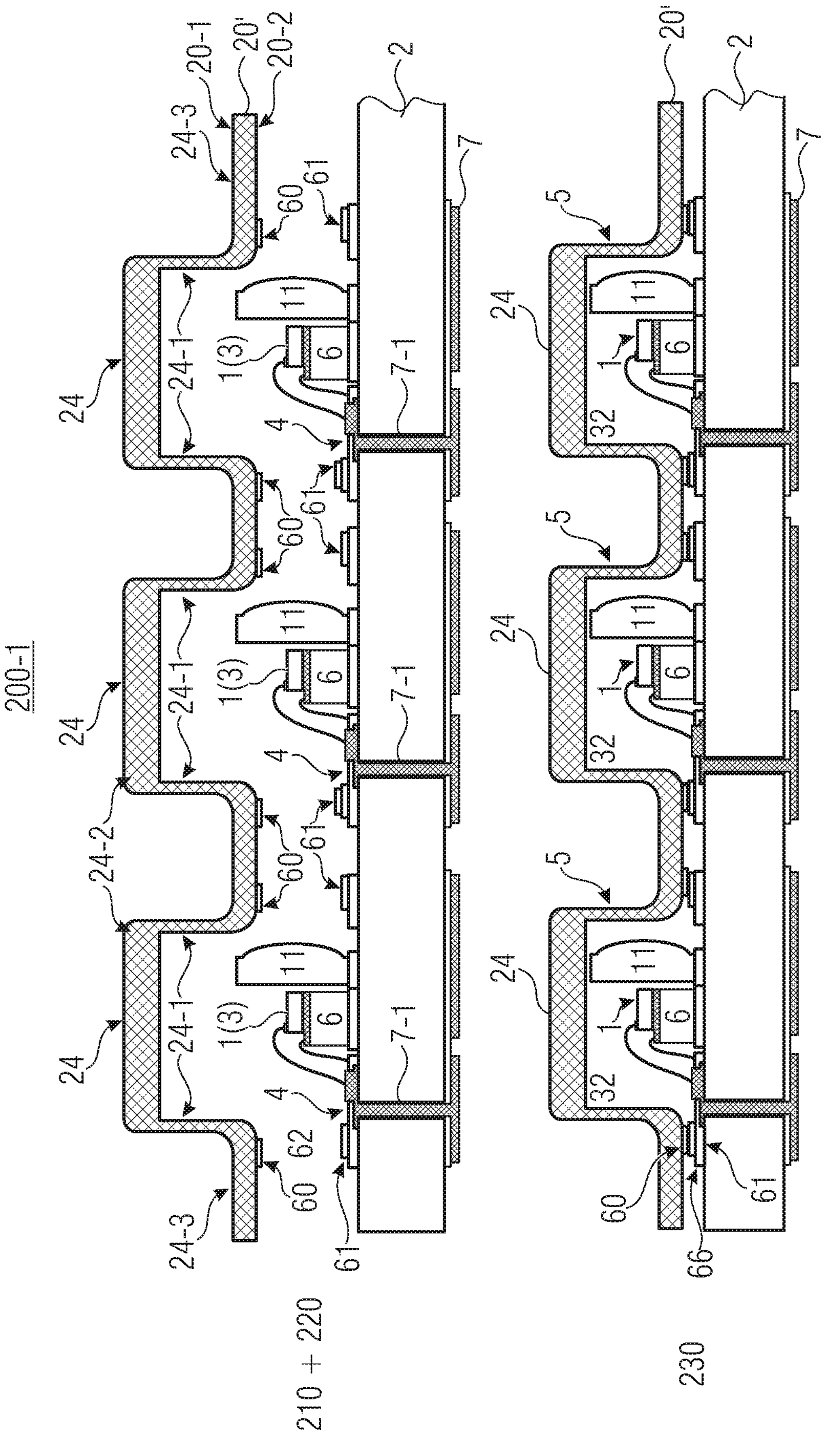
FIGS. 8A-10C shows exemplary fundamental process diagrams of the inventive method for manufacturing a hermetically housed optoelectronic device according to further embodiments.
Figure 8B:
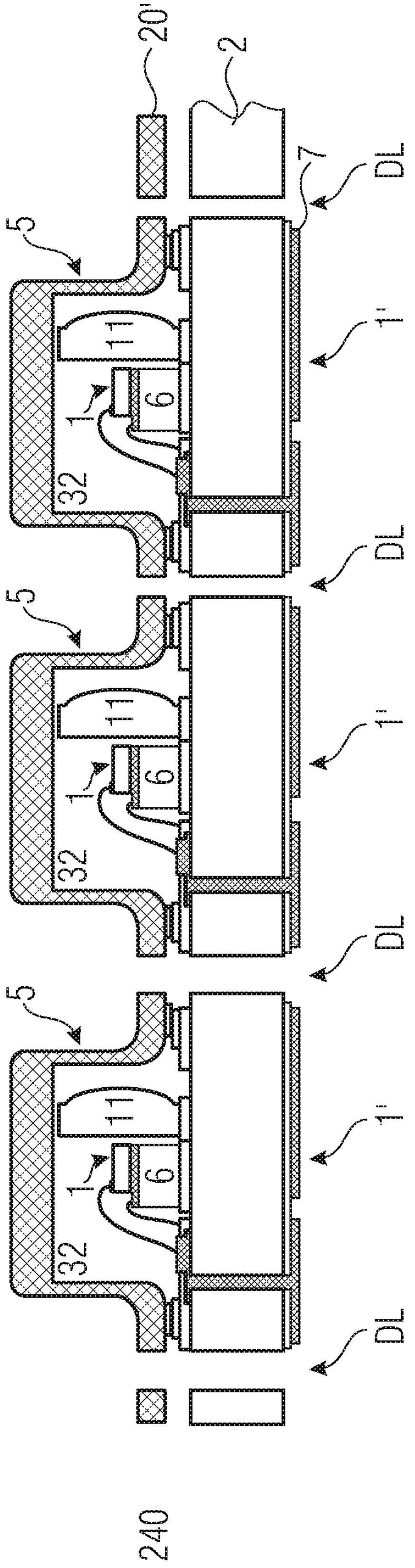

FIGS. 8A-8B now shows a first exemplary principle flow diagram 200-1 of the inventive method 200 for manufacturing a hermetically housed optical device 1' according to a further embodiment. In particular, FIGS. 8A-8B shows a sequence of the capping process 200-1 with optically neutral side windows 24-1 on the wafer level up to wafer dicing according to an embodiment in a variation with the vertical lateral window areas 24-1, wherein the optically neutral decoupling windows (side windows) 24-1 have an orientation of 90° with respect to the carrier substrate plane (x-y plane), and wherein the radiation-emitting device 1, e.g., comprises a radiation direction, or a main radiation direction (in case of a diverging, or expanding, beam) that is essentially parallel to the carrier substrate plane (x-y plane).

In the method 200 for manufacturing a hermetically housed optical device, e.g. an optoelectronic transmission and/or reception device, the following steps are now performed. First, the above-described method 100 is performed with the exemplary process sequences 100-1, 100-2, 100-3, 100-4, 100-5 for manufacturing a molded cover substrate (=structured cap substrate) 20'. In this case, the molded cover substrate 20' may comprise a plurality, or multitude, of cap elements 24. Furthermore, in a step 220, a device substrate 2, e.g. as a device wafer, is provided with a plurality of optoelectronic devices 1 arranged thereon. In this case, an optoelectronic device 1 may be assigned to each cap element 24. In the step of (hermetically) bonding 230 the molded cover substrate 20' with the multitude of cap elements 24 to the device substrate 2, which in turn comprises a multitude of optoelectronic devices 1, a multitude of housed optical devices 1' is obtained (on the wafer level).

For example, the step of bonding the device substrate 2 and the molded cover substrate 20' may be carried out along a bonding region 60 arranged therebetween, such as a bond frame. The bonding region 60 may comprise a metallization so as to form a frame structure, e.g. a continuous frame structure, on non-bulged regions 24-3 (=socket regions) of the molded cover substrate 20'. For example, the bond frame 60 may comprise a metallic solder material 66.

The step of bonding 230 the device substrate 2 and the cover substrate 20' may be carried out by means of direct laser welding, laser soldering, eutectic solder connecting, thermal compression bonding, glass frit bonding, reactive nano-metal layer soldering (RMS) or induction soldering along the bonding region 60.

Furthermore, a step of dicing 240 the multitude of housed optical devices 1' is carried out along a dicing line DL so as to obtain diced hermetically housed optical devices 1'. For example, the step of dicing 240 may be carried out by means of sawing or laser separation.

The method 200 for manufacturing a housed radiation-emitting device 1, e.g., may be carried out on the wafer level, wherein arranging and hermetically bonding 230 the substrates 2, 20', i.e. the device substrate 2 and the molded cover substrate 20', is carried out under a specified atmosphere. This may ensure that the housing 2, 20', or its inner volume (cavity) 32, is fully free of organic substances or water vapor so that the service life of the optoelectronic device 1, e.g., illumination diodes or laser diodes, is not effected. For example, dry air (=reactive atmosphere), nitrogen, or any other type of inertial atmosphere, is located in the cavity 32, but even a negative pressure or a full vacuum may be set up in principle and may additionally be maintained over long periods of time by introducing particular getter layers 4. A vacuum may be understood as a reduced atmospheric pressure (negative pressure) in the cavity 32 of approximately 100 Torr, 50 Torr, 5 Torr, or 1 Torr or pressure values below that. The cavity 32 may be configured in a hermetically tight way so as to oppose introduction of water vapor.

Furthermore, an intermediate carrier 6 for the radiation-emitting device 1 may be arranged between the device substrate 2 and the radiation-emitting device 1, so that the device substrate 2 carries the radiation-emitting device 1 indirectly (=via the intermediate carrier 6). In the embodiments, the housed radiation emitting device 1' is configured such that a conductor path 7 for electrically coupling the radiation-emitting device 1 is arranged on the side of the device substrate 2, and such that the conductor path 7 is led out of the cavity 32, e.g., laterally and/or downwards, between the cap substrate 20' and the device substrate 2. To this end, a TSV and/or TGV arrangement 7-1 (Through Silicon Vias (TSV) or Through Glass Vias (TGV)) may be used.

In the exemplary flow diagram 200-1 of the inventive method 200 for manufacturing a hermetically housed optical device 1' of FIGS. 8A-8B, a sequence of a capping process with planar side windows on the wafer level up to wafer dicing is shown in an exemplary variation with a lens 11 positioned in the housing 5. In the capping process, one or several laser diodes with a "fast focus collimation" through a mutual cylinder lens (collimation lens) 11 may be arranged within the hermetically sealed housing 5. For example, this lens 11 is soldered to the device substrate 2 so as to avoid organic outgassing in the proximity of the laser diode.

Figures 8C, 8D:
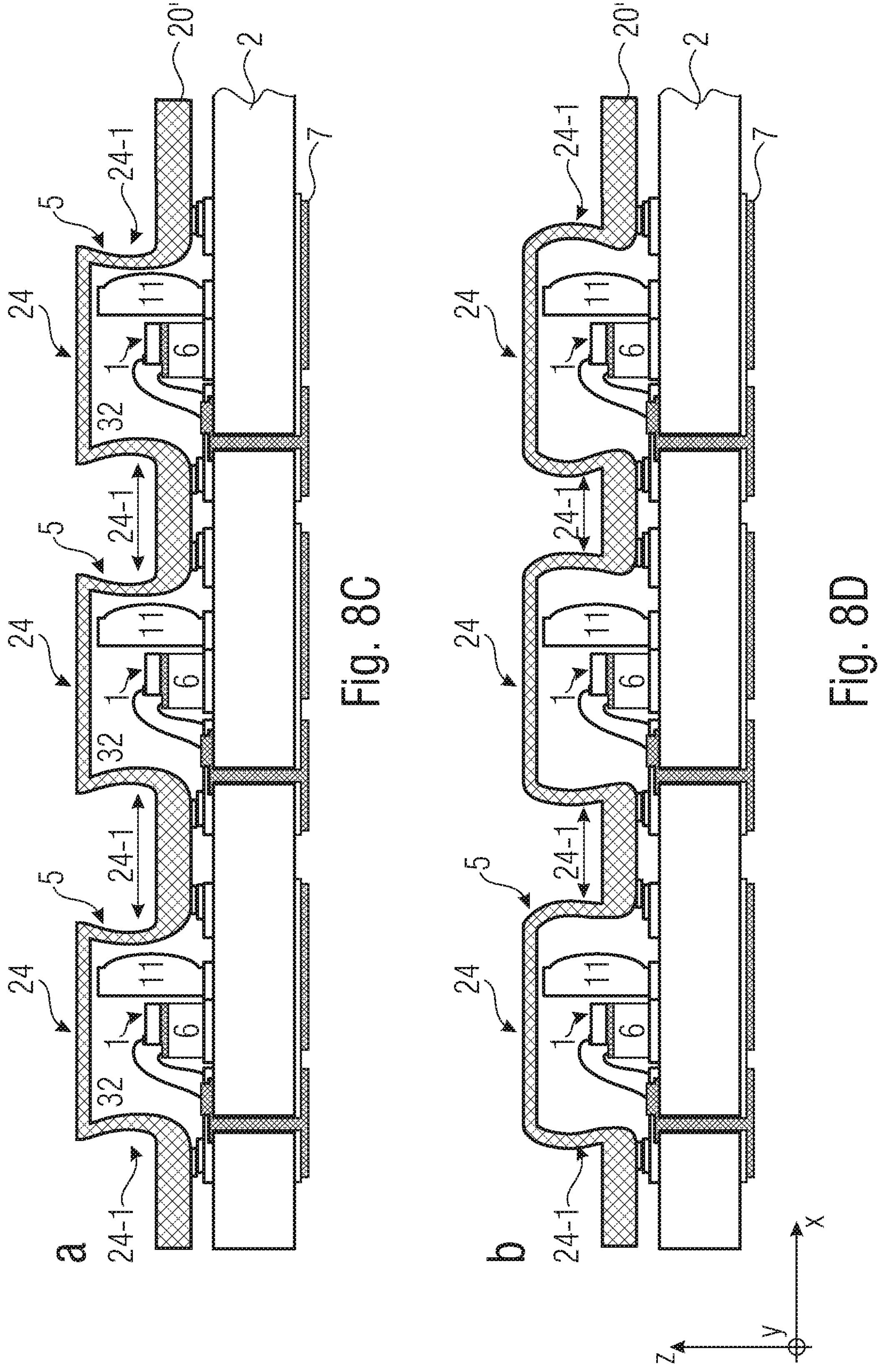

FIGS. 8C and 8D now show a further exemplary implementation of the flow diagram 200-1 of the inventive method 200 for manufacturing a hermetically housed optical device 1' according to a further embodiment. In particular, FIG. 8C shows the use of a molded cover substrate (=structured cap substrate) 20' with concave side windows 24-1 in the capping process 200 on the wafer level. FIG. 8D shows the use of a molded cover substrate 20' with convex side windows 24-1, 24-2 in the capping process 200 on the wafer level.

The above description of the process sequence 200-1 with the sequence of the capping process 200-1 in FIGS. 8A-8B may similarly and accordingly also be applied to the use of concave side windows 24-1 in FIG. 8C (wherein the optical decoupling window comprises a concave window geometry with an orientation of 90° with respect to the carrier substrate plane) and of convex side windows 24-1 in FIG. 8D (wherein the optical decoupling window comprises a convex window geometry with an orientation of 90° with respect to the carrier substrate plane). The same also applies for the subsequent description of further process sequences 200 with the sequence of the capping process 200-#, i.e. the description may be applied similarly and accordingly to the use of planar vertical concave or convex side windows 24-1.

Figure 9A:
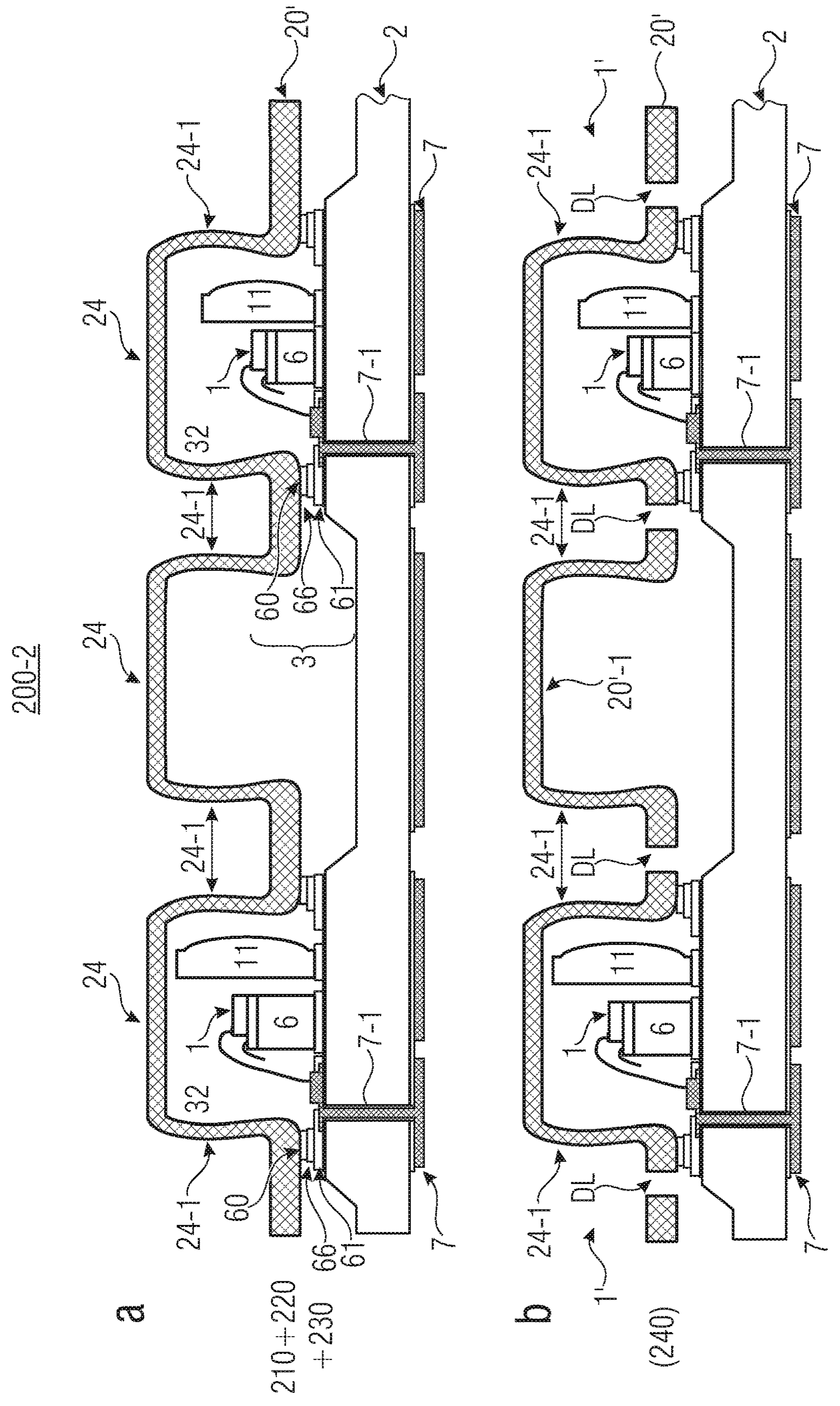
Figure 9B:
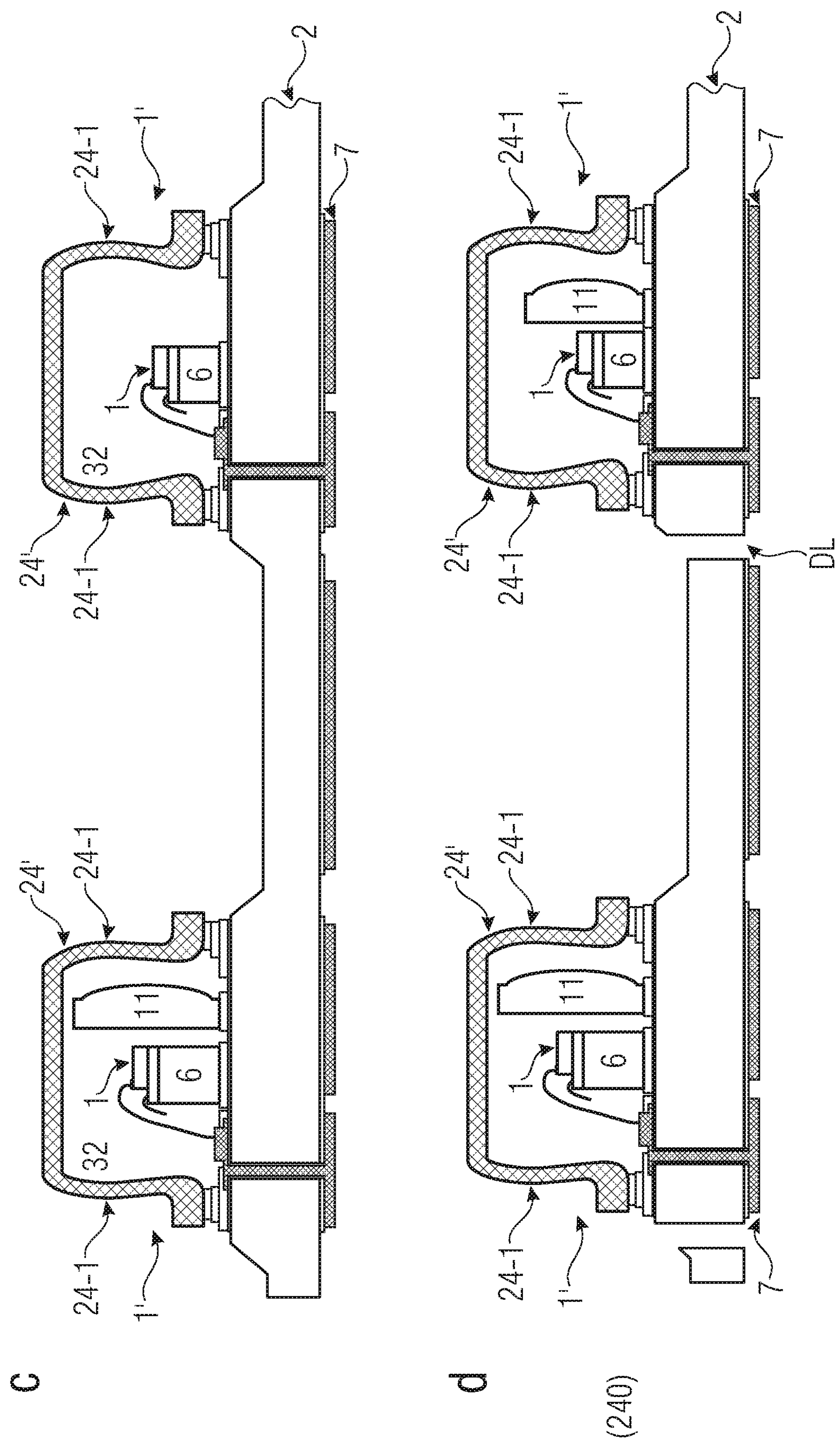
Figure 9C:
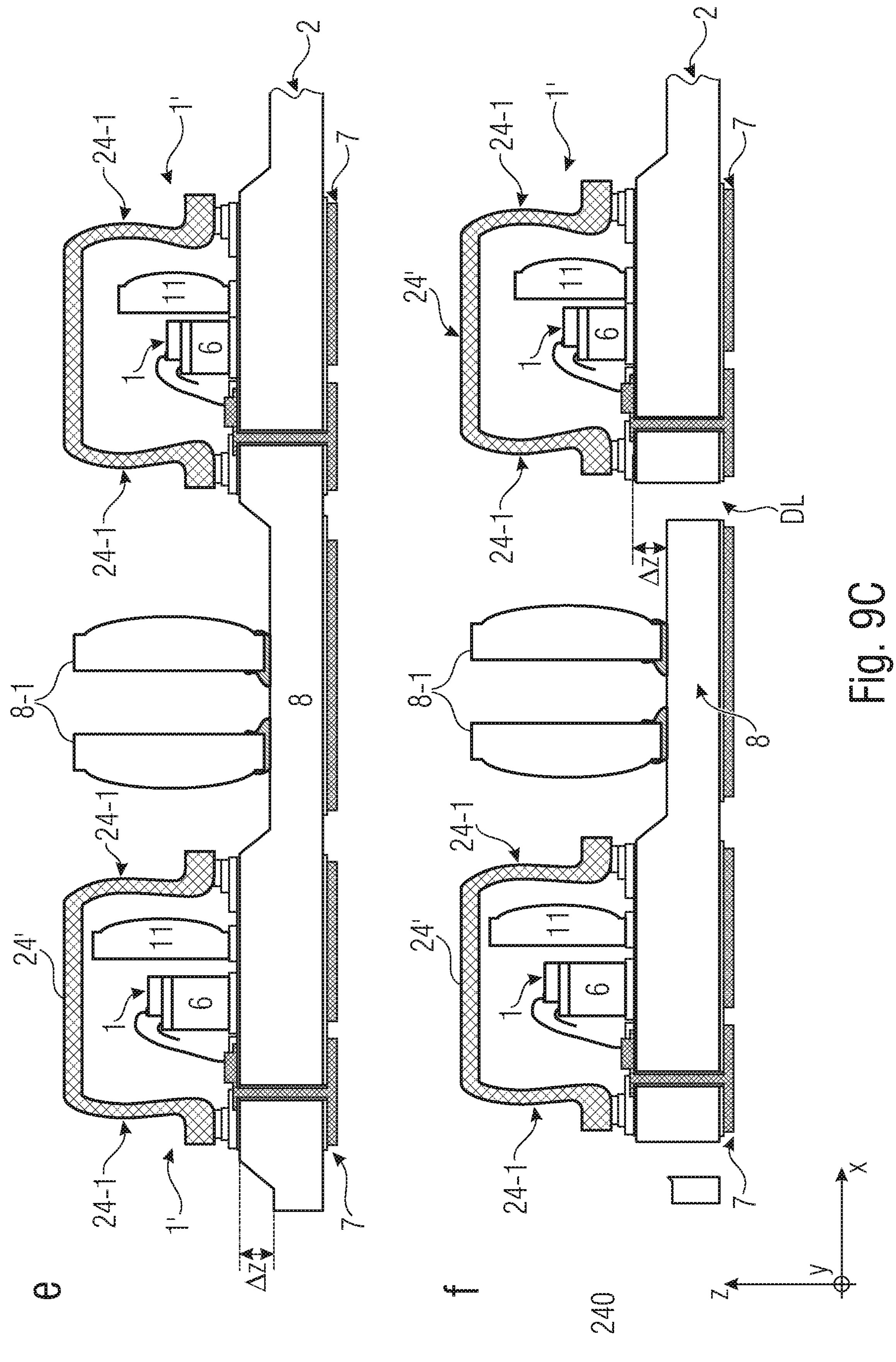

FIGS. 9A-9C now shows a further exemplary principle flow diagram 200-2 of the inventive method 200 for manufacturing a hermetically housed optical device 1' according to a further embodiment. In particular, FIGS. 9A-9C show a sequence of the capping process 202-2 with optical neutral side windows 24-1 on the wafer level up to wafer dicing according to an embodiment in a variation in which the radiation-emitting device 1, e.g., comprises a radiation direction, or a main radiation direction (in the case of an expanding beam) that is essentially in parallel to the carrier substrate plane (x-y plane).

FIGS. 9A-9C shows a sequence of a capping process with convex side windows on the wafer level up to wafer dicing. The description may be applied accordingly to the use of planar vertical or concave side windows 24-1. The carrier substrate 2 is equipped with an optical bank 8-1. For example, lenses 11 are soldered within the hermetic housing 5, and additional optical elements 8-1 are mounted on an open optical bank 8, e.g. by means of an adhesive.

In the method 200 for manufacturing a hermetically housed optical device, e.g. an optoelectronic transmission and/or reception device, the following steps are performed. Thus, first, the above-described method 100 with the exemplary process sequences 100-1 . . . 100-5 for manufacturing a molded cover substrate (=structured cap substrate) 20' is performed. Here, the molded cover substrate 20' may comprise a plurality, or multitude, of cap elements 24. Furthermore, in a step 220, a device substrate 2, e.g. as a device wafer, is provided with a plurality of optoelectronic devices one arranged thereon. In this case, an optoelectronic device 1 may be assigned to one cap element 24 each. In the step of (hermetically) bonding 230 the molded cover substrate 20' with the multitude of cap elements 24 to the device substrate 2, which in turn comprises a multitude of optoelectronic devices 1, a multitude of housed optical devices 1' is obtained (on the wafer level) (=FIG. 9A).

Furthermore, a step of dicing 240 the multitude of housed optical devices 1' is performed so as to obtain diced hermetically housed optical devices 1'. For example, the step of dicing 240 may be carried out by means of sawing or laser separation.

In the step of dicing 240, as is illustrated in FIG. 9A at "a", an intermediate region 20'-1 of the cap substrate 20' is separated at the dicing line DL, e.g. by means of sawing or laser separation, and is removed from the arrangement in FIG. 9B at "c". In the arrangement of FIG. 9B at "c", i.e., the optoelectronic devices 1 are each hermetically housed on the device substrate 2 individually with a cap element 24'.

As is exemplarily illustrated in FIGS. 9B-9C at "d"-"f", the step of dicing 240 the multitude of housed optoelectronic devices 1' may be divided into different partial process sequences. According to an embodiment, the housed radiation-emitting device 1' may be configured such that, on the side of the device substrate 2, an optical bank 8 with the additional optical element 8-1 is placed in front of the optically neutral decoupling window (optical side window) 24-1, so that the optical neutral decoupling window 24-1 is arranged between the optical bank 8 and the radiation-emitting device (optoelectronic device) 1.

1. Alternative—process sequence according to FIGS. 9A-9C at "a", "b", "c", "d", and "f": As is exemplarily illustrated in FIG. 9B at "c", the housed optoelectronic devices 1' may be diced so as to obtain the diced hermetically housed optoelectronic devices 1'. According to the first alternative, at the diced device substrates 2', (at least) one optical bank 8 each is arranged so as to be placed in front of the decoupling window 24-1, i.e. outside of the housing 5 with the radiation-emitting device (optoelectronic device) 1. Thus, the arrangement of the diced hermetically housed optical devices 1' with the optical bank 8 arranged in front on the device substrate 8 is obtained as illustrated in FIG. 9C at "f".
2. Alternative—process sequence according to FIGS. 9A-9C at "a", "b", "c", "d", and "f" As exemplarily illustrated in FIG. 9B at "c", the individual housed optoelectronic devices 1' are obtained on the mutual device substrate 2. According to the second alternative, on the device substrate 2, an optical bank 8 with the additional optical element 8-1 is arranged in front of the decoupling window 24-1, i.e. outside of the housing 5 with the radiation-emitting device (optoelectronic device) 1, as is illustrated in FIG. 9C at "e". As is exemplarily illustrated in FIG. 9C at "f", the housed optoelectronic devices 1' are now diced so as to obtain the diced hermetically housed optoelectronic devices 1'. Thus, the arrangement of the diced hermetically housed optical devices 1' with the optical bank 8 arranged in front on the device substrate 8 is again obtained as illustrated in FIG. 9C at "f".

That is, FIGS. 9A-9C at "a"-"f" show a sequence of a capping process with optical neutral side windows 24-1 on the wafer level up to wafer dicing. The carrier substrate 2 is equipped with an optical bank 8 with the additional optical element 8-1. Joining processes with high temperature requirements are performed first on the carrier substrate. Capping is carried out on the wafer level with a glass cap wafer. The standard sequence of FIGS. 9A-9B at "a"-"c" is carried out, with the process sequence being branched by substrate dicing in FIG. 9A-9c at "a"-"b"-'c"-"e"-"f" (1st alternative) or FIG. 9"a-"b-"c-"d-"f (2nd alternative). Here, the process sequence branches: the sequence a-b-c-d-f shows the mounting of the optics on the optical bank 8 in the case of the upstream wafer dicing, whereas sequence a-b-c-e-f shows the mounting of the optics on the optical bank 8 in the case of the downstream wafer dicing. Optionally, in addition to the semiconductor emitters 1, monitor diodes for monitoring the laser power, lenses 11 or other optical elements are mounted, e.g. soldered, within the hermetic housing 5. This also applies when the caps are placed individually, but are all hermetically joined with the carrier substrate in one joining process step.

The optical functions required for beam collimation and beam combination may be integrated, or arranged, on an open connected optical bank 8 outside of the hermetic housing 5.

Thus, FIG. 9C at"f" shows a distributed arrangement of the optical elements 8, 11, wherein a part of the optical functions is built as the lens elements 11 within the hermetic enclosed housing 5. To this end, advantageously, organics-free bonding techniques on the basis of soft soldering are used. Further optical elements 8-1 required are built on the connected optical bank 8.

Furthermore, FIGS. 9A-9C at "a"-"f" exemplarily show an embodiment in which the device substrate 2, e.g. in this case a silicon carrier chip, has been lowered in the area of the optics 8 (optical bank) by a lowering height "Δz" by etching so as to provide more vertical installation space for the optics 8. In this case, the optics 8 may be arranged as the optical bank 8 on the device substrate 2 by means of adhesive bonding. As is illustrated in FIG. 9C at "f", the plane of the optical bank 8 is located on another (vertically) lower height plane than the mounting plane for the laser diodes 1, or the sealing frame 3 (=60, 61, 66).

According to further embodiments, the plane of the optical bank 8 with the additional optical element 8-1 may also be on another vertically higher height plane than the mounting plane for the laser diodes 1, or the sealing frame 3. A raised mounting plane may also be formed in the carrier wafer (e.g. as a mesa structure).

In the capping process of FIGS. 9A-9C, (corresponding to FIGS. 8A-8D), as a molded cover substrate (=structured cap substrate) 20', a molded cap substrate 20' with concave or planar vertical side windows 24-1 may be used as well.

FIGS. 9A-9C at "a"-"f" show how the optical functions required for beam collimation and beam combination integrated on an open connected optical bank outside of the hermetic housing are in principle.

Figure 10A:
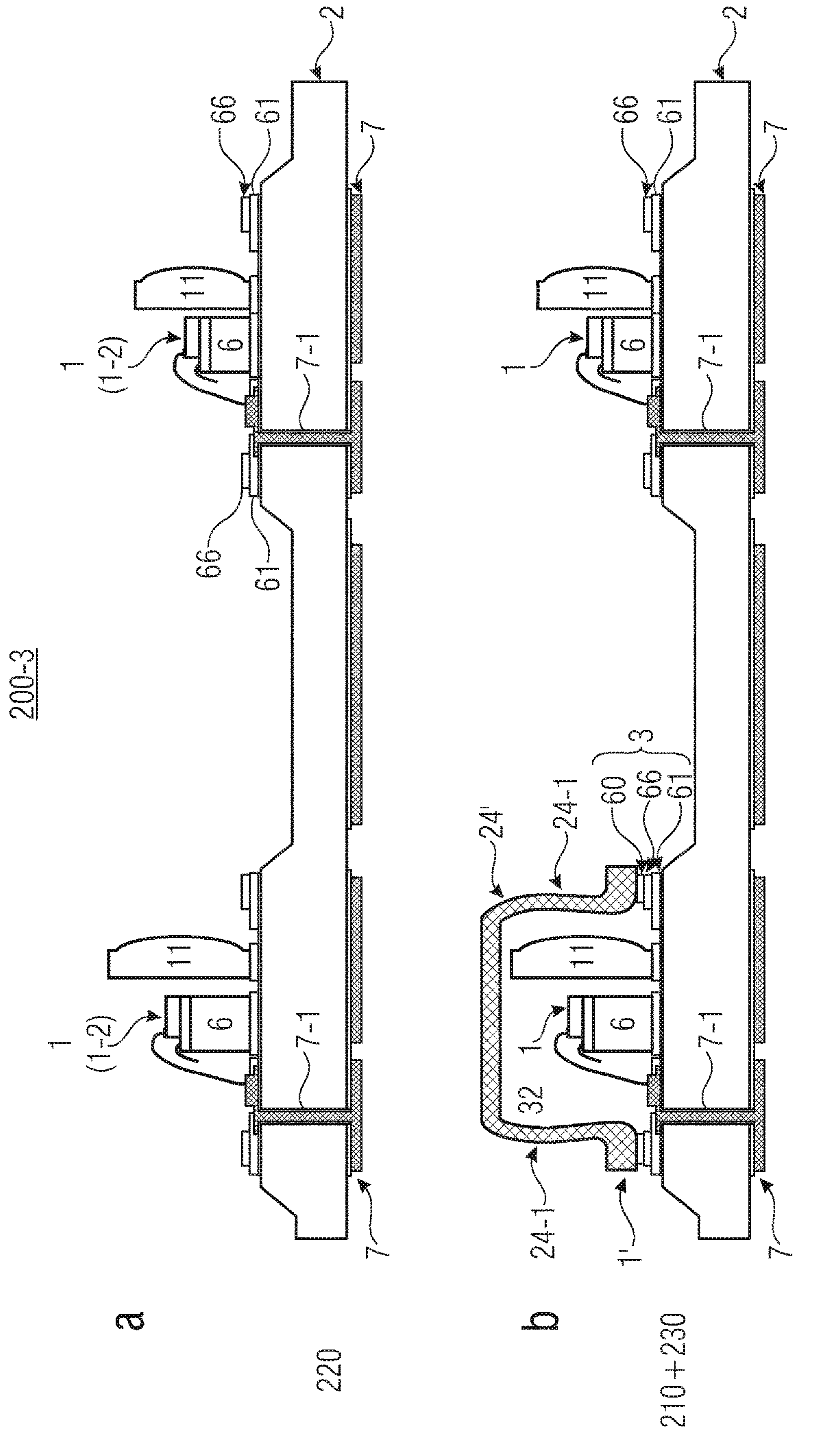
Figure 10B:
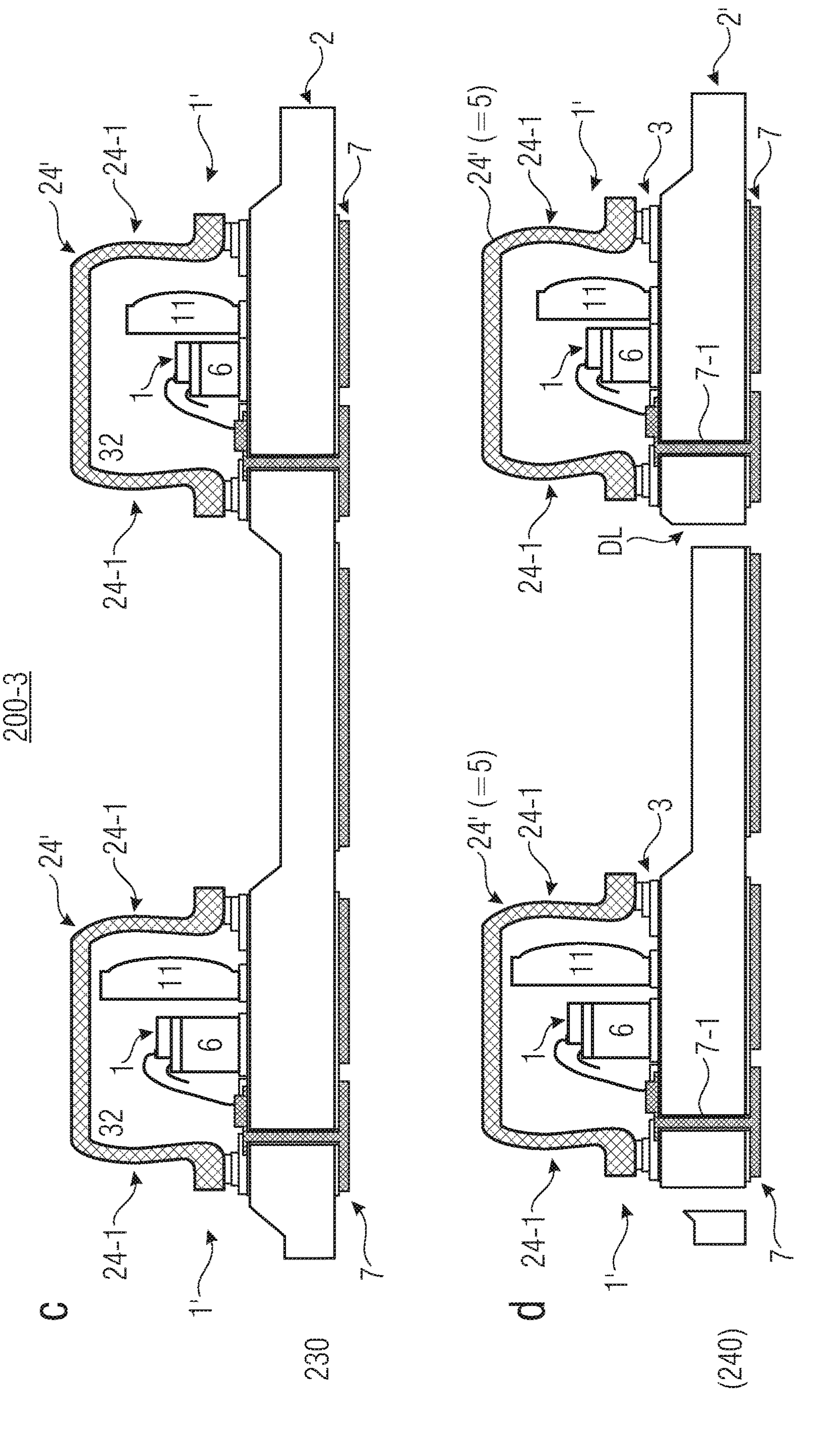
Figure 10C:
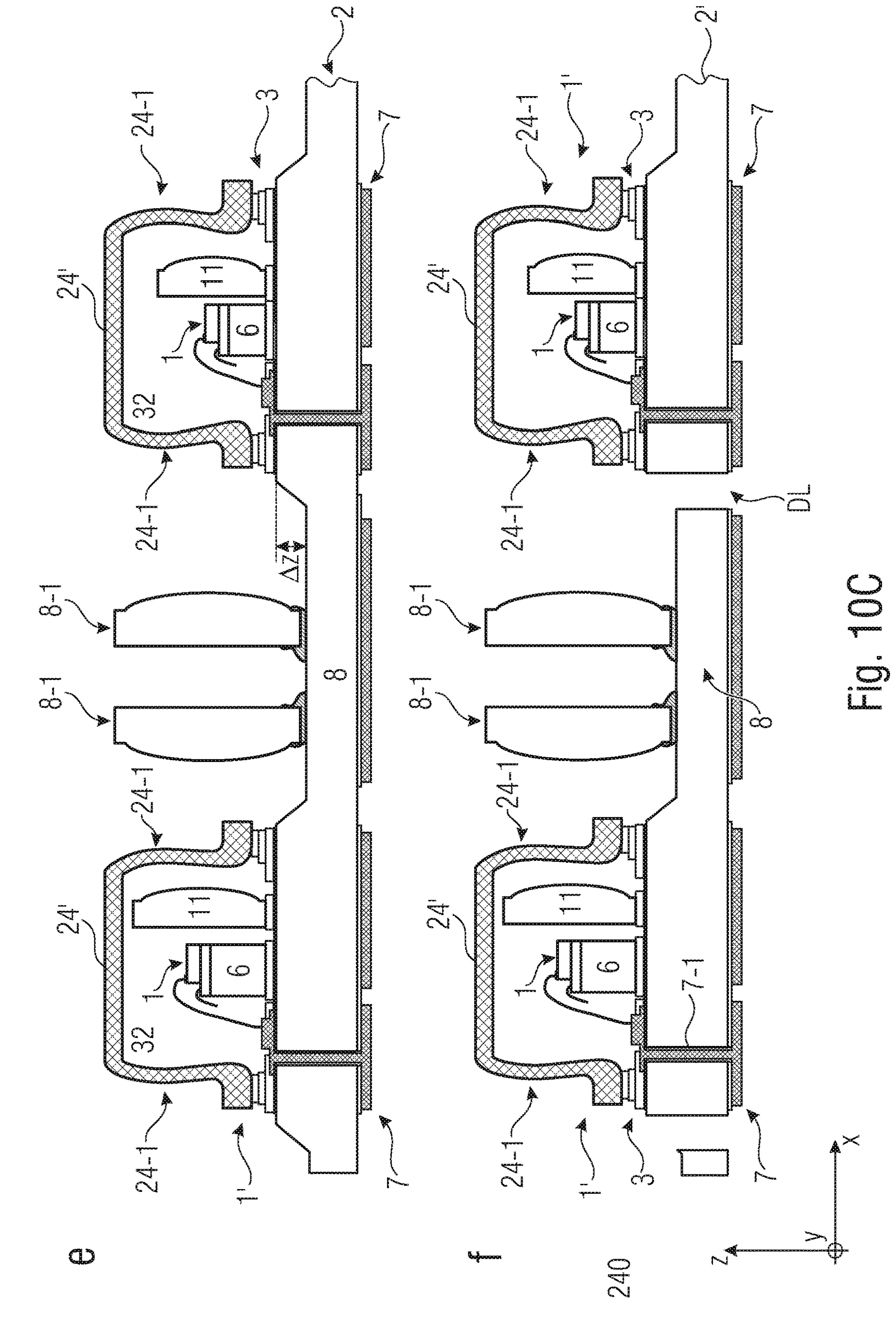

FIGS. 10A-10C now shows a further exemplary principle flow diagram 2-3 of the inventive method 200 for manufacturing a hermetically housed optical device 1' according to a further embodiment. In particular, FIGS. 10A-10C shows a sequence of the capping process 200-3 with optically neutral side windows 24-1 on the wafer plane up to wafer dicing according to an embodiment, wherein the optically neutral decoupling windows (side windows) 24-1 comprise, e.g., a (vertical) orientation of 90° with respect to the carrier substrate plane (x-y plane), and wherein the radiation-emitting device comprises a radiation direction, or main radiation direction (in case of a diverging beam) that is essentially parallel to the carrier substrate plane (x-y plane), for example.

FIGS. 10A-10C shows a sequence of a capping process with convex side windows on the wafer plane up to the wafer dicing. The carrier substrate 2 is equipped with an optical bank 8-1. For example, lenses 11 are soldered within the hermetic housing, and additional optical elements 8-1 are mounted on the open optical bank 8, e.g. by means of an adhesive.

In the method 200 with the flow diagram 200-3 for manufacturing a hermetically housed optical device, e.g. an optoelectronic transmission and/or reception device, the following steps are now performed. Thus, first, the above-described method 100 with the exemplary process sequence 100-1 . . . 100-5 for manufacturing a molded cover substrate (=structured cap substrate) 20' is performed, wherein the molded cover substrate 20' is diced so as to obtain diced cap elements 24', and to provide them for the subsequent bonding step. Thus, the molded cover substrates 20' may each comprise a diced cap element 24'. Furthermore, in a step 220, a device substrate 2, e.g. as a device wafer, is provided with a plurality of optoelectronic devices 1 arranged thereon. In this case, a diced cap element 24' may be assigned to an optoelectronic device 1 each on the device substrate 2 (device wafer). Thus, in the step of (hermetically) bonding 230, the diced cap elements 24' of the molded cover substrate 20' are bonded to the device substrate 2, which comprises a multitude of optoelectronic device 1, so as to hermitically house the optoelectronic devices, and to obtain a multitude of housed optical device 1' on the device substrate 2.

Furthermore, a step of dicing 240 the multitude of housed optical devices 1' is performed so as to obtain diced hermetically housed optical devices 1'. For example, the step of dicing 240 may be carried out along the dicing line DL by means of sawing or laser separation.

Thus, in the process sequence 200-3 of FIGS. 10A-10C, individual capping of optoelectronic device 1 with the diced cap elements 24' takes place, wherein, in contrast to the process sequence 200-4 of FIGS. 9A-9C, removal of a center region 20'-1 of the cap substrate 20' is not required. As is exemplarily illustrated in FIGS. 10A-10C at "c", the individually housed optoelectronic devices 1' are obtained on the mutual device substrate 2.

As is exemplarily illustrate in FIGS. 10A-10 C at "d"-"f", the step of dicing 240 the multitude of housed optoelectronic devices 1' may be divided into different partial process sequences. According to an embodiment, the housed radiation-emitting device 1' may now be configured such that, on the side of the device substrate 2, an optical bank 8 with the additional optical element 8-1 is placed in front of the optical decoupling window (optical side window) 24-1 so that the optical decoupling window 24-1 is arranged between the optical bank 8 and the radiation-emitting device (optoelectronic device) 1.

The above description of the process sequence 200-2 with respect to FIGS. 8A-8B at "d"-"f" with different alternatives may equally and accordingly be applied to the process sequence 200-3 in FIGS. 10A-10C at "d"-"f" as well.

FIGS. 10A-10 C at "a"-"f" therefore show a sequence of a capping process with optically neutral side windows 24-1 on the wafer level up to wafer dicing. The carrier substrate 2 is equipped with an optical bank 8. Joining processes with high temperature requirements are first performed on the carrier substrate. Capping is carried out on the wafer level by means of individual glass caps. The standard sequence of FIGS. 10*a-c* is carried out, with the process sequence being branched by substrate dicing in FIGS. 10A-10C at "a"-"b"-"c"-"e"-"f" (1$^{st}$ alternative) or FIGS. 10A-10C at "a"-"b"-"c"-"d"-"f" (2$^{nd}$ alternative). Here, the process sequence branches: the sequence a-b-c-d-f shows the mounting of the optics on the optical bank 8 in the case of the upstream wafer dicing, whereas sequence a-b-c-e-f shows the mounting of the optics on the optical bank 8 in the case of the downstream wafer dicing. Optionally, in addition to the semiconductor emitters 1, monitor diodes 1-2 for monitoring the laser power, lenses or other optical elements are mounted, e.g. soldered, within the hermetic housing 24' (=5). Additional optical elements 8-1 are mounted on the open optical bank by means of adhesive. This also applies when the caps are placed individually, but are all hermetically joined with the carrier substrate in one joining process step.

In the capping process of FIG. 10A-10 C, cap elements 24' with convex side windows 24—may be used. Similarly, cap elements 24' with concave or planar side windows 24-1 may be used.

FIGS. 10A-10 C at "a"-"f " show a distributed arrangement of optical elements, wherein a part of the optical functions is built within the hermetically enclosed housing under the glass cap. To this end, e.g., organics-free bonding techniques on the basis of soft soldering are used. Further optical elements required are built on the connected optical bank.

Thus, embodiments describe a method 200 for housing in a hermetically sealed way radiation-emitting and radiation-detecting devices 1, e.g. laser diodes or LEDs or PIN diodes, APD, SPAD, silicon photomultiplier, which may be referred to with WLP-IVA (wafer level packages—with integrated vertical optical apertures). The optical window region 24-1 that enables lateral to vertical beam decoupling and coupling to with respect to the carrier substrate may be particularly favorable. Window regions with a reflecting mirror coating 65 are areas that are inclined, planar, and bulged with respect to the base plane of the cap substrate 20', in the sense of the present description. Lenses 8, 11 are passively imaging elements, e.g. uniaxial cylinder lenses, rotation-symmetrical collective lenses and free-form lenses, in the sense of the present description.

Mounting the laser diodes 1, and possibly further optical elements and photodetectors 1-2, e.g., may be carried out on a semiconductor wafer as a substrate, e.g. a silicon wafer, and the capping process may be performed together for all devices on the substrate that are mounted up to this step by bonding a cap substrate with window regions mostly with an identical arrangement. If additional optical elements 8-1 are to be mounted on an optical bank 8, this step advantageously takes place after separating the cap substrate, which is why the regions of the optical bank are freely accessible for mounting. For reasons of installation engineering, increasing the yield, and also keeping the heat introduction low, individual capping may be realized by placing and sealing individual (premeasured) glass caps. The optical bank 8 remains exposed and may be loaded directly with further optical elements 8-1. Separating or dicing the carrier substrate into individual chips, in particular individual devices, is carried out only afterwards for both process variations.

Alternatively, mounting the laser diodes may be done on an individual piece of an already diced semiconductor wafer, here referred to as individual substrate, e.g. a sawed-out chip from a carrier wafer, and the capping process may be carried out for the mounted devices on the individual substrate by bonding a glass cap already diced from a cap substrate and having at least one optical window.

According to an embodiment, a hermitically housed optical device 1' manufactured with the present manufacturing method 100, 200 comprises an optical device 1 arranged on the device substrate 2', and a molded cover substrate 20' providing a hermetically sealed cover for the optical device 1 within which the optical device 1 is housed, wherein the molded cover substrate 20' comprises a cap element 24' with a (laterally planar, bulged inwards or bulged outwards) sidewall region 24-1 between a socket region 24-3 and a cap region 24-2.

According to an embodiment of the hermetically housed optical device 1', the sidewall region 24-1 and/or the cap region 24-2 of the cap element 24' of the molded cover substrate 20 comprise a material that is permeable for transmission or reception radiation of the optical device 1, and is provided for coupling and/or decoupling electromagnetic radiation.

According to an embodiment of the hermetically housed optical device 1', the hermetically sealed cover 2', 24' (with the cavity 32) comprises a reactive atmosphere and/or the cavity 32 exclusively contains inorganic substances, and/or the hermetically: sealed cover 2, 24' (cavity 32) is hermetically sealed against the introduction of water vapor.

Accordingly, the housed optoelectronic device 1 may be provided according to the method 200 for manufacturing a housed optoelectronic device 1' on the wafer level, with the following steps: manufacturing a cap substrate, providing a device substrate in the form of a wafer with a multitude of radiation-emitting devices, arranging the substrate on each other so that substrates are bonded along an intermediate bonding frame, and dicing the housed radiation-emitting devices.

Accordingly, embodiments of the present invention describe a method and a bonding technique for packaging in a hermetically sealed way radiation-emitting and/or radiation-receiving devices 1, e.g. laser diodes or LEDs, which may be referred to as WLP-IVA (wafer level packages—with integrated vertical optical apertures). In particular, the optical (optically neutral) window region 24-1 may be advantageous, and, e.g. it may enable lateral beam decoupling with respect to the carrier substrate. In the sense of the invention, the optical window region 24-1 is characterized by a low influence on the beam propagation so that a divergence additionally applied to the beam is in the range of less than ±0.5° or less than ±1.0° when passing through the window 24-1.

The beam aberration through the window 24-1 does not only result in a shift of the focus position as the only aberration, wherein this resulting aberration currently contributes to the aberration to the largest extent. However, the further aberrations that occur all scale with the refractive force of the window, so that a sufficiently thin window becomes (approximately) aberration-free. A further (important) fact is that, due to manufacturing reasons, the inner and outer areas of the window 24-1 become more and more identical, when the base material for the manufacturing of the window 24-1 becomes thinner and thinner.

To this end, the cover substrate 20 may have a thickness of 100 μm to 1500 μm or from 300 μm to 800 μm so as to obtain a thickness of the window elements 24-1, i.e. the regions of the window elements 24-1 effective for light passages, from 20 μm to 1200 μm or from 20 μm to 300 μm. A window thickness of 20 μm to 300 μm is provided for the optical passage window 24-1, for example.

Imaging errors or aberrations are considered to be deviations from ideal optical imaging by an optical system, causing a blurred or distorted image. If aberrations cause a wave front deformation of less than 100 nm or less than 150 nm (RMS=root-mean-square=standard deviation) (as a sum of all aberrations), they may be considered to be negligible.

For example, mounting the optoelectronic device 1, e.g. laser diodes and possibly further optical elements, may be carried out on a semiconductor wafer 2' as a substrate, e.g. a silicon wafer, and the capping process may be carried out together for all mounted devices on the substrate by means of bonding a (mutual) cap substrate 20' with window regions 24-1. Separating, or dicing, into individual chips, in particular into individual housings, is carried out only afterwards.

According to an embodiment, thus, a wafer arrangement with a multitude of housed radiation-emitting devices with the following features, a device substrate in the form of a wafer configured as a mutual device substrate for the radiation-emitting devices arranged thereon, and a mutual cap substrate comprising the cap substrates for the radiation-emitting devices are provided, wherein the substrates are arranged with respect to each other such that the cap substrate and the device substrate are bonded along an intermediate bond frame.

Alternatively, mounting the electronic device 1, e.g. laser diodes, may be carried out on an individual piece of an already diced semiconductor wafer, here referred to as individual substrate, e.g. a sawed-out chip 2' from a silicon wafer, and the capping process may be carried out for the device mounted on the individual substrate by bonding a glass cap with an optical window already diced from a cap substrate.

Figure 11A:
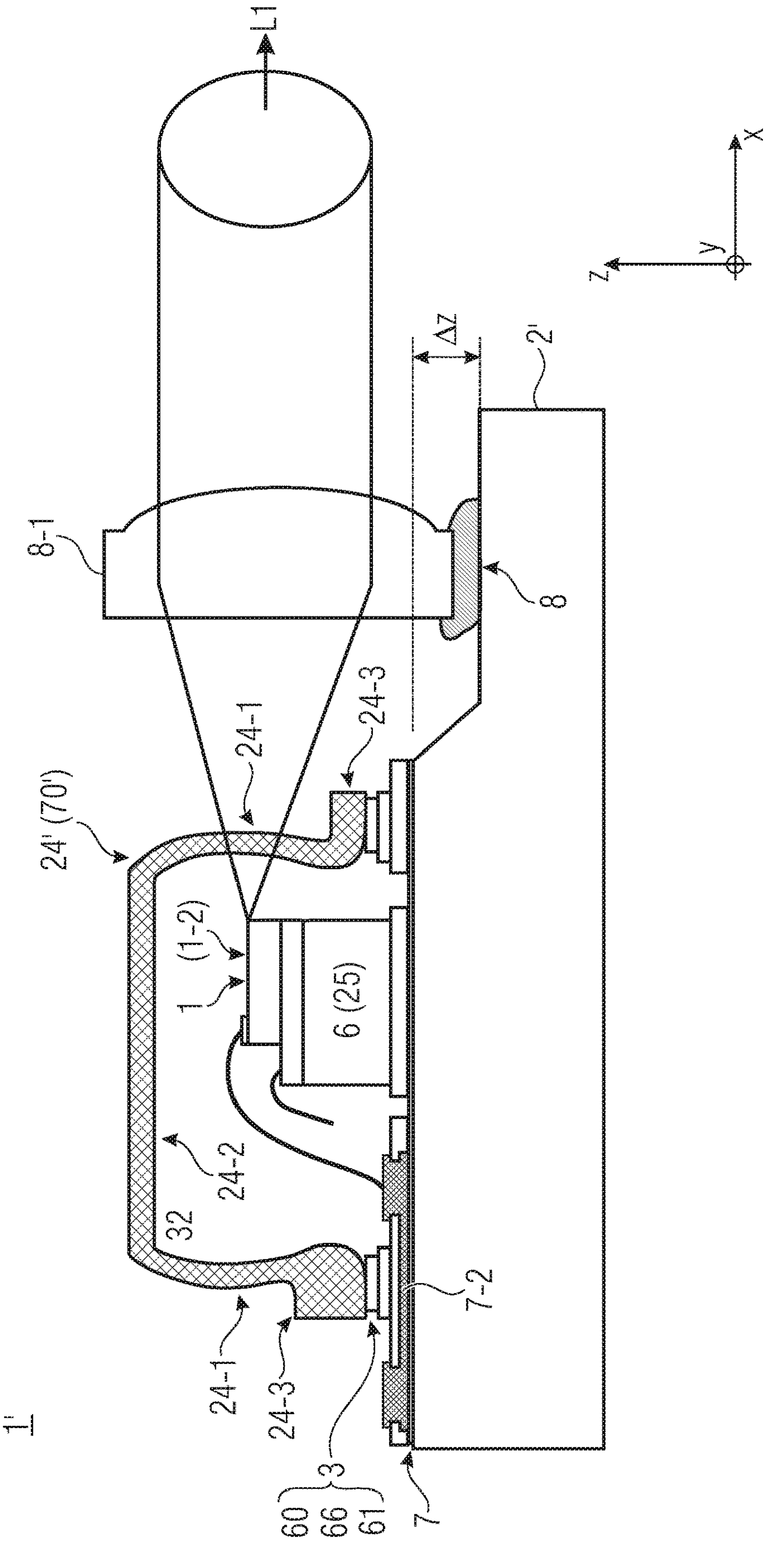
FIGS. 11A-16 show exemplary embodiments for a hermetically housed optoelectronic device according to further embodiments, e.g., each manufactured with the manufacturing method described herein.
Figure 11B:
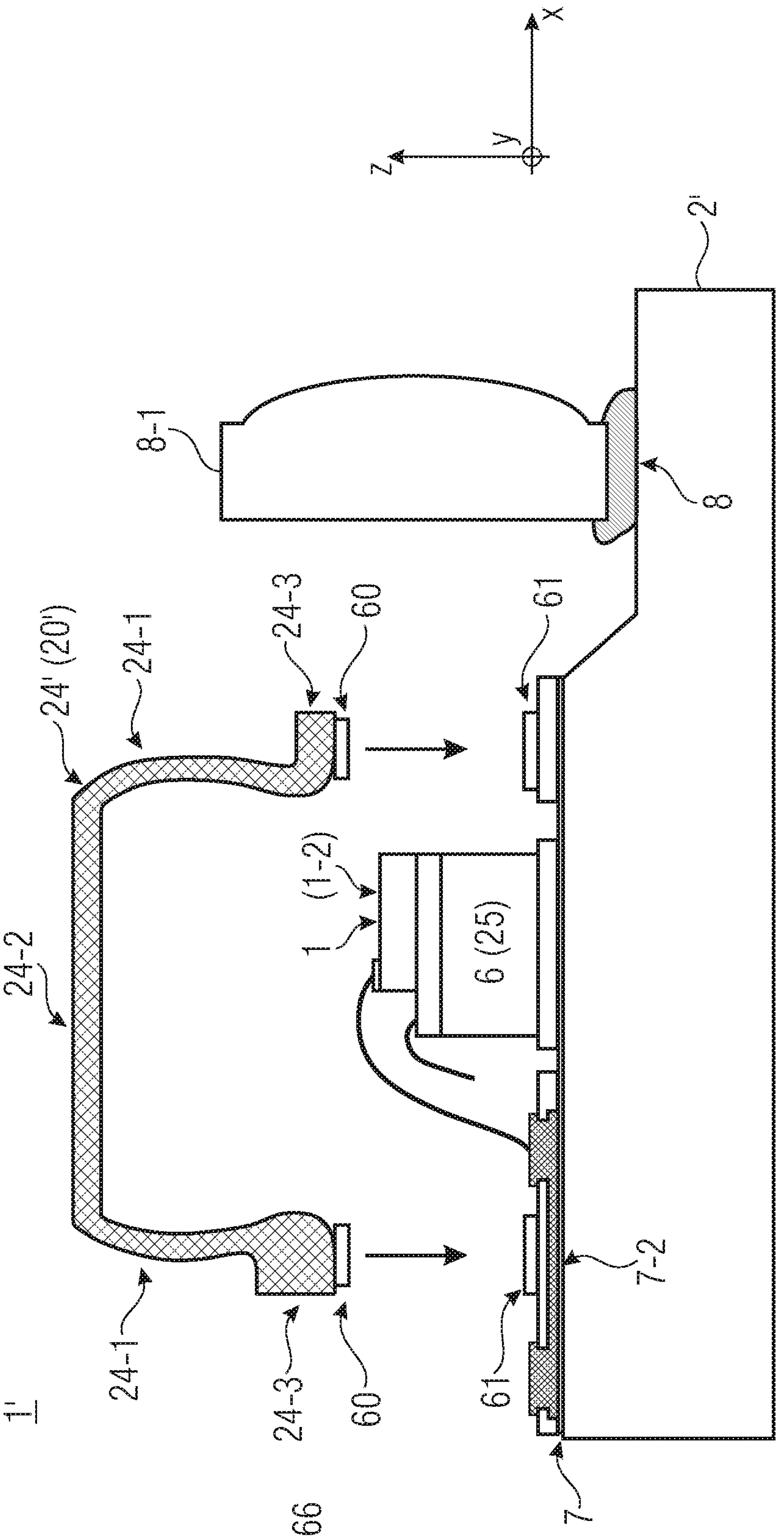

FIGS. 11A-11B now show a further exemplary embodiment for a hermetically housed optoelectronic device 1' according to an embodiment, e.g., manufactured by means of the above-described method 200.

As is exemplarily illustrated in FIGS. 11A-B, the hermetically housed optoelectronic device 1, e.g., manufactured by means of the manufacturing method 200 comprises an optical device 1 arranged on the diced device substrate 2', and further comprises a molded cover substrate 20', or a diced cap element 24', providing a hermetically sealed cover, or housing, for the optical device 1. The optical device 1 is accommodated within the housing. The molded cover substrate 20' may comprise a (bulged) cap element 24' with a (vertically plane) bulged (towards the inside or the outside) sidewall region 24-1 between a ceiling region 24-2 and a socket region 24-3. A (convex) sidewall region 24-1 bulged towards the outside is illustrated in FIGS. 11A-B.

According to an embodiment, the sidewall region 24-1 and/or the ceiling region 24-2 of the cap element 24' of the molded cover substrate 20' comprise a material that is permeable for transmission and/or reception radiation of the optoelectronic device 1, and that is provided for coupling and/or decoupling electromagnetic radiation (of the transmission or reception radiation).

According to an embodiment, the hermetically sealed cover 24' with the cavity 32 comprises a reactive atmosphere and/or the cavity 32 exclusively contains inorganic substances. According to an embodiment, the hermetically sealed cover 24' with the cavity 32 is hermetically sealed against introduction of water vapor. In the embodiment shown in FIGS. 11A-B, a hermetically sealed region is generated with a seal, e.g., on a height plane, wherein a variation with an optical bank 8 with the additional optical element 8-1 on the surface level of the carrier wafer 2' is exemplarily illustrated.

FIGS. 11A-B show an embodiment in which a lowered optical bank 8 is arranged on the diced device substrate 2' for mounting passive optical devices 8, 26, for example. The plane of the optical bank 8 with the additional optical element 8-1 may on another height plane than the mounting plane for the devices 1, such as the laser diodes, or the sealing frame. The device substrate may be lowered in the region of the optics 8 (optical bank) by a lowering height "Δz", e.g., by etching. A raised mounting plane may also be formed in the carrier wafer 2', e.g. in the form of a laser structure.

For example, adhesives are not used within the glass cap 24'. Outside of the same, lenses, prisms, mirrors, apertures, etc., e.g. as part of the optical bank, are advantageously assembled with a UV adhesive. Several optical elements 8-1 (lenses, prisms, mirrors, apertures, etc.) may be located on the same optical bank 8.

This arrangement with lateral vias 7-2 may be used for one or several devices 1, e.g. laser diodes, and may be arranged so that axis-parallel beams or beams L1 crossing in a point form as a result. In addition, the active devices 1 may also be electrically contacted via a flip-chip technique.

The arrangement is obtained by assembling, capping and dicing on the wafer level. The optical bank is on the same substrate for mounting passive optical devices. The plane of the optical bank may be on another height plane than the mounting plane for the laser diodes, or the sealing frame. Adhesives are not used within the glass cap. Outside of the same, lenses, prisms, mirrors, apertures, etc., are advantageously/exemplarily assembled with a UV adhesive. Obviously, several optical elements may be located on the same optical bank. This arrangement may be used for one or several laser diodes arranged such that axis-parallel beams or beams crossing in a point form as a result.

FIG. 11B exemplarily shows an embodiment in which a hermetically housed optoelectronic device 1' is generated from diced carrier substrates 2' and diced glass caps 24' on an individual substrate level.

FIGS. 11A-B therefore show an embodiment in which the device substrate 2', e.g. a silicon carrier chip, has been lowered in the region of the optics 8-1 by etching so as to provide more vertical installation space for the optics 8-1. Here, e.g., the optics 8-1 are arranged on the optical bank 8 by means of adhesive connections.

FIGS. 11A-B show a further embodiment in which further electronic components may be integrated into the laser housing, i.e. in the cavity 32, which is advantageous for some applications. Specifically, this may be (at least) one additional photodiode 1-2 for monitoring the power of the radiation-emitting device 1, e.g. a laser, or driver circuits 25 for the radiation-emitting device 1. In FIGS. 11A-B, a driver IC 25 and such a monitor photodiode 1-2 are shown in the cavity. FIGS. 11A-B therefore show an embodiment in which an electronic driver circuit 25 is arranged in a cavity 32.

In the subsequent description of further embodiments of the hermetically housed optoelectronic device 1', the respective differences (=alternative or/and additional elements) compared to the arrangement of FIGS. 11A0B are essentially illustrated and the technical effects resulting therefrom are described. Thus, the above description of FIGS. 11A-B may also be applied accordingly to the subsequent description of the further embodiments.

The following describes further exemplary embodiments for a hermetically housed optoelectronic device 1, e.g., manufactured with an above-described method 200.

In the subsequent description of the embodiments of the hermitically housed optoelectronic device, differences (=alternative and/or additional elements) compared to the further arrangements are essentially illustrated and the technical effects resulting therefrom are described. Thus, the description of an embodiment of the hermetically housed optoelectronic device may be applied accordingly to the description of the further embodiments as well.

Figure 12:
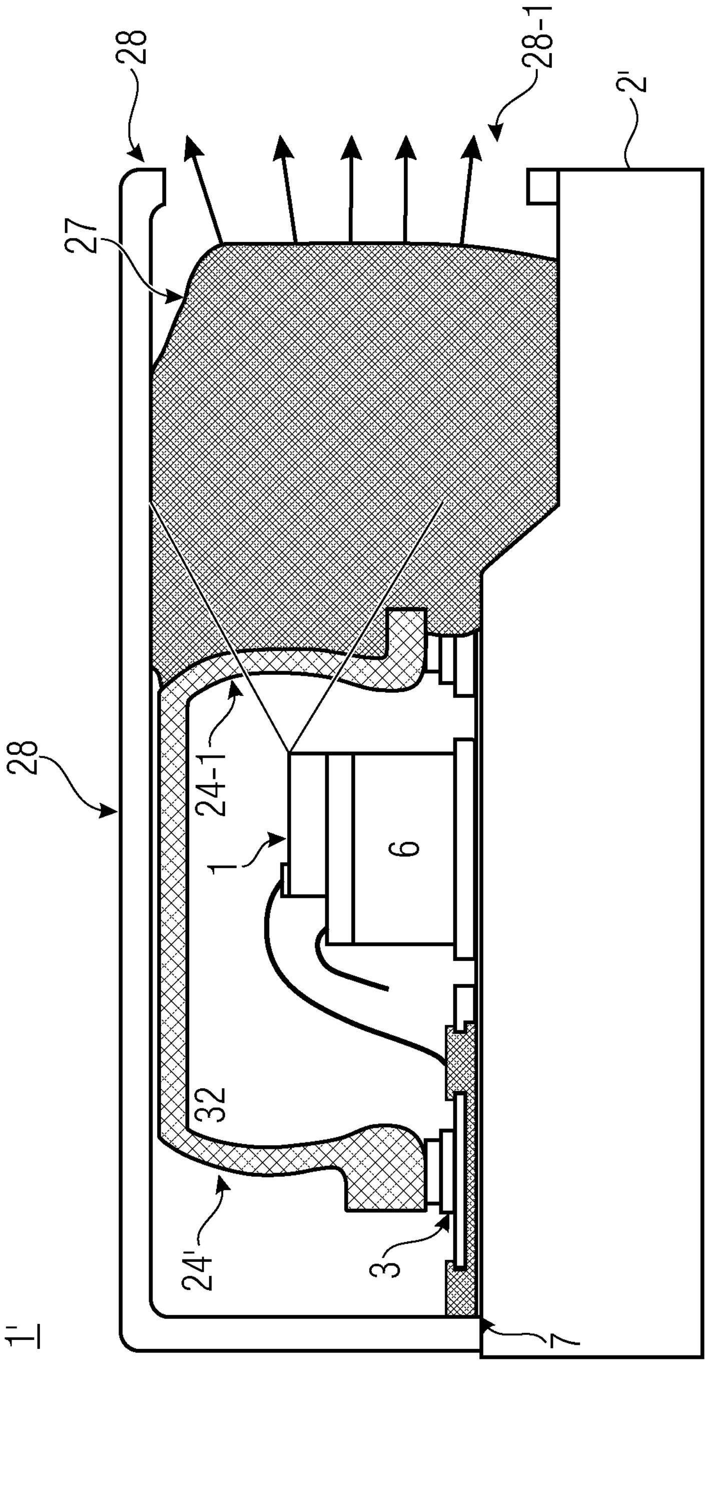

FIG. 12 shows an embodiment in which lateral beam decoupling of the optoelectronic device 1, e.g. a laser diode, into a phosphorus converter 27 is carried out so as to generate another light colour and to dissolve the laser coherence. If the lasers 1 are structured to emit upwards, the phosphorous converter would be applied as a layer that covers upwards, and the outer housing 24' would be equipped accordingly with an upper window opening 24-2.

FIG. 12 therefore shows an embodiment with a light conversion element (conversion medium) 27 that may be attached when using a short-wave laser diode as a radiation-emitting (optoelectronic) device 1 in the cavity 32 formed by the cap substrate 24' and the device substrate 2'. For example, the conversion medium 27 may be deposited outside of the hermetically sealed laser housing 24' as an additional epoxy resin containing corresponding phosphors. The housed radiation-emitting device 1' according to FIG. 12 is therefore configured such that it comprises an element 27 that is effective for light colour conversion of the emitted light L1 so that the optical decoupling window 24-1 is arranged between the effective element 27 and the radiation-emitting device 1.

As is further exemplarily illustrated in FIG. 12, an outer tap, or a housing 28, may be provided for the hermetically housed optoelectronic device 1', wherein the housing 28 is arranged at the substrate 2' and surrounds the hermetically housed optoelectronic device 1' and the light conversion element 27 except for an optical exit window 28-1. For example, the outer cap 28 is provided to provide further protection and/or hermetic shielding of the entire hermetically housed optoelectronic device 1' against the surrounding area.

Figure 13:
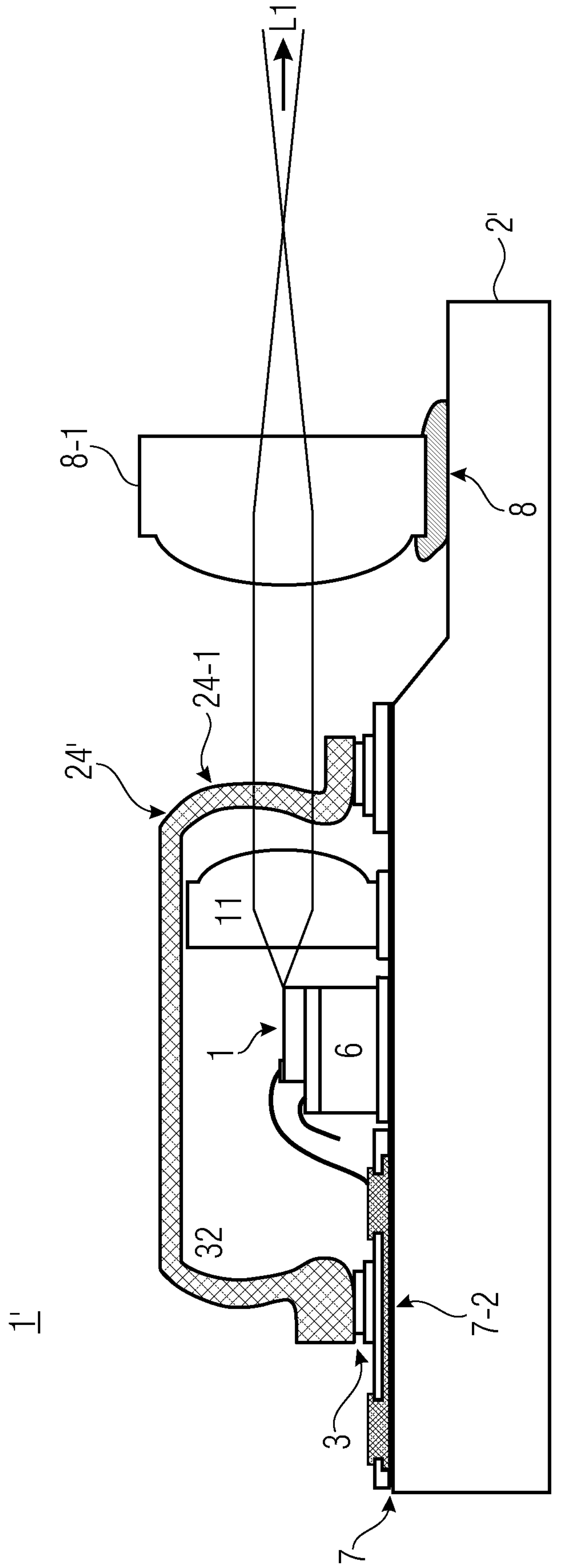

FIG. 13 now shows a further exemplary embodiment for a hermetically housed optoelectronic device 1' according to an embodiment, wherein the arrangement 1' comprises a first lens 11 within the hermetically capped region 32. For example, this lens 11 is soldered so as to avoid organic outgassing in the proximity of the optoelectronic device 1, e.g. a laser diode. The carrier substrate 2' comprises hermetic lateral passages 7-2 that may be used for laser contacting through wire bonds and also through flip-chip connection techniques, for example.

Thus, the housed radiation-emitting device 1', as illustrated in FIG. 13, is configured such that, on the side of the device substrate 2', an optical bank 8 is placed in front of the optical decoupling window 24-1 so that the optical decoupling window 24-1 is arranged between the optical bank 8 and the radiation-emitting device 1. In the embodiment shown, the housed radiation-emitting device 1' is configured such that the optical bank 8 is arranged on the device substrate 2' and is located in the radiation direction of the radiation-emitting device FIG. 14 now shows a further exemplary embodiment for a hermetically housed optoelectronic device 1' according to an embodiment, wherein the housed radiation-emitting device 1' is configured such that a conductor path 7 for electrically coupling the radiation-emitting component 1 is arranged on the side of the device substrate 2, and such that the conductor path 7 is led out of the cavity 30 downwards through the device substrate 2. To this end, e.g., a TSV and/or TGV arrangement 7-1 (Through Silicon Vias (TSV) or Through Glass vias (TGV)) may be used. This arrangement may be used for laser contacting through wire bonds and through flip-chip connection techniques as well.

Figure 15:
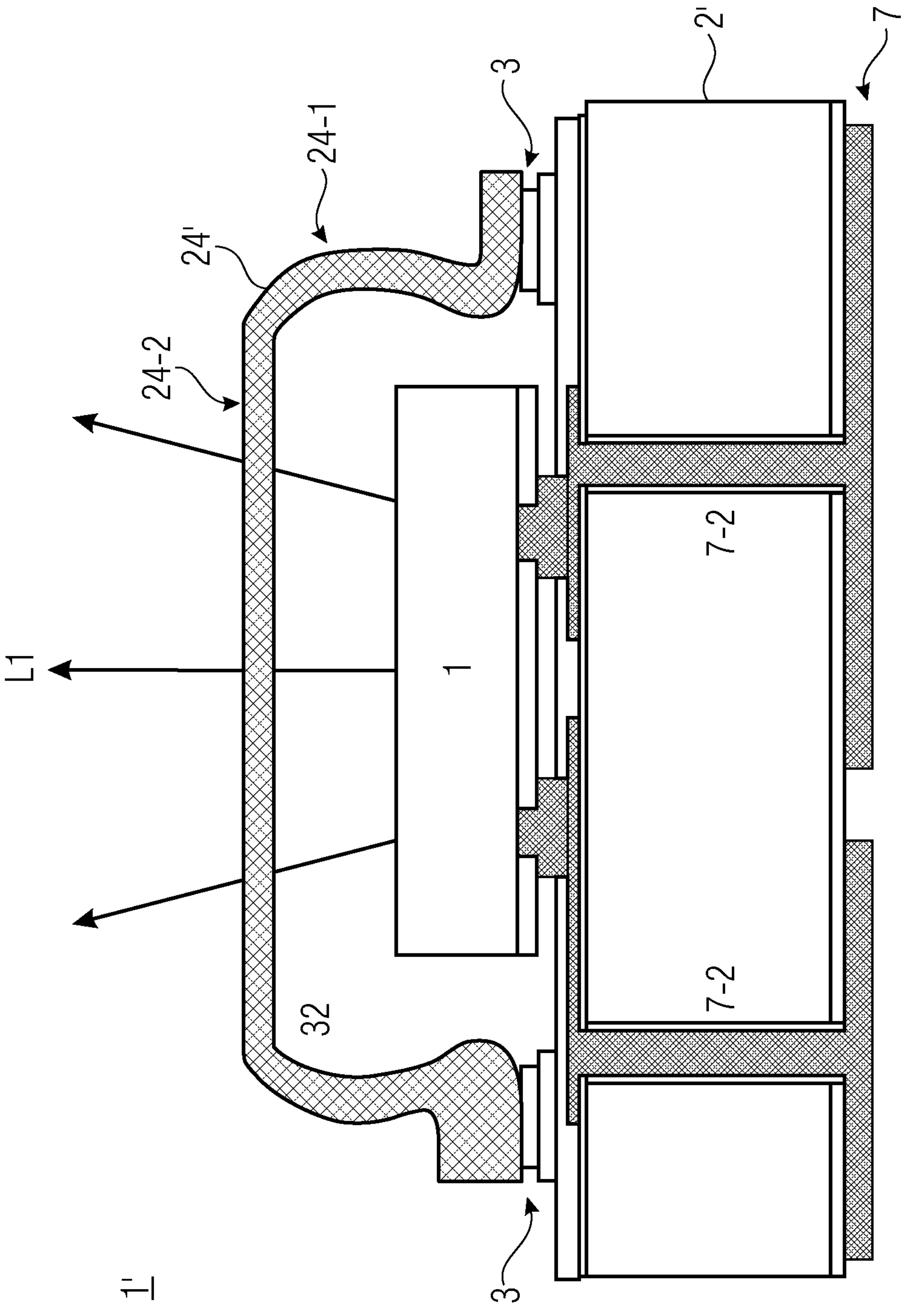

FIG. 15 now shows a further exemplary embodiment for a hermetically housed optoelectronic device 1' according to an embodiment, wherein the upper sidewall 24-2 of the cap element 24' comprises a material that is permeable for transmission and/or reception radiation of the optical device 1, and is provided for coupling and/or decoupling electromagnetic radiation L1.

Thus, the upper window area 24-2 (ceiling window) is provided for coupling and/or decoupling, e.g., wherein the radiation-emitting device 1 comprises a radiation direction, or main radiation direction (in case of a diverging beam), with the decoupled light beam L1 that is essentially perpendicular to the carrier substrate plane (x-y plane). In the arrangement of FIG. 15, the glass caps 24' (regardless of the geometry of the side windows 24-1) also enable optical decoupling and/or optical coupling towards the upside, or facing away from the carrier substrate 2' (e.g. vertically).

Thus, FIG. 15 shows an apparatus 1' on the basis of a carrier substrate with hermetic electric passages 7-2 through the substrate 2' (Through Silicon Vias, TSV). The contact areas 7 on the bottom side of the carrier substrate 2' enable further processing as a FMD device. Several laser diodes 1 may be placed adjacently in parallel below a glass cap. The glass caps 24' (regardless of the geometry of the side windows 24-1) also enable optical decoupling and/or optical coupling towards the upside, or facing away from the carrier substrate 2' (e.g. vertically).

Figure 14:
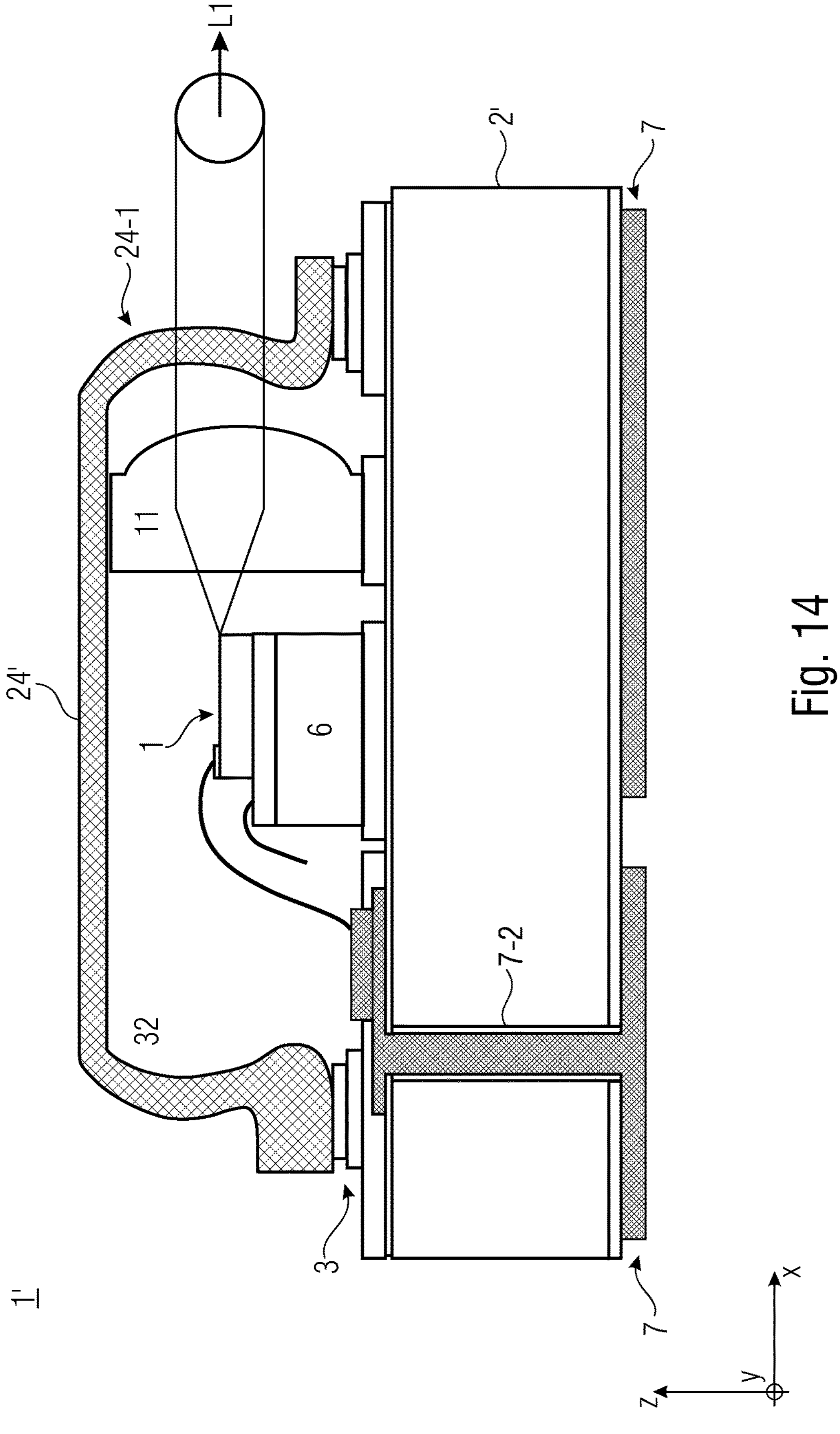

According to FIGS. 14 and 15, an embodiment with an advantageous implementation of the electric contactings 7, 7-2 is shown. For a particularly compact structure of the laser diode housing 2', 24', i.e. the housed optoelectronic device 1', the electric connections may be guided through the device substrate 2' in the form of vertical passages 7-2. The required contact pads 7, as shown in FIGS. 14 and 15, may be provided with a metallization on the rear side that may be soldered. When these contact regions are configured to have a large surface area, these areas are also suitable to ensure cooling (heat dissipation) of the housing. Otherwise, in the embodiment according to FIGS. 14 and 15, the cap substrate 20', i.e. the glass cap 24', and the device substrate 2', e.g. in this case a silicon chip, are again bonded to each other via a bond frame 3 so that a hermetic cavity 3 is provided for the optoelectronic device 1, in this case a laser diode, for example. For example, the optical areas are again provided with an anti-reflection coating 64 (ARC).

Figure 16:
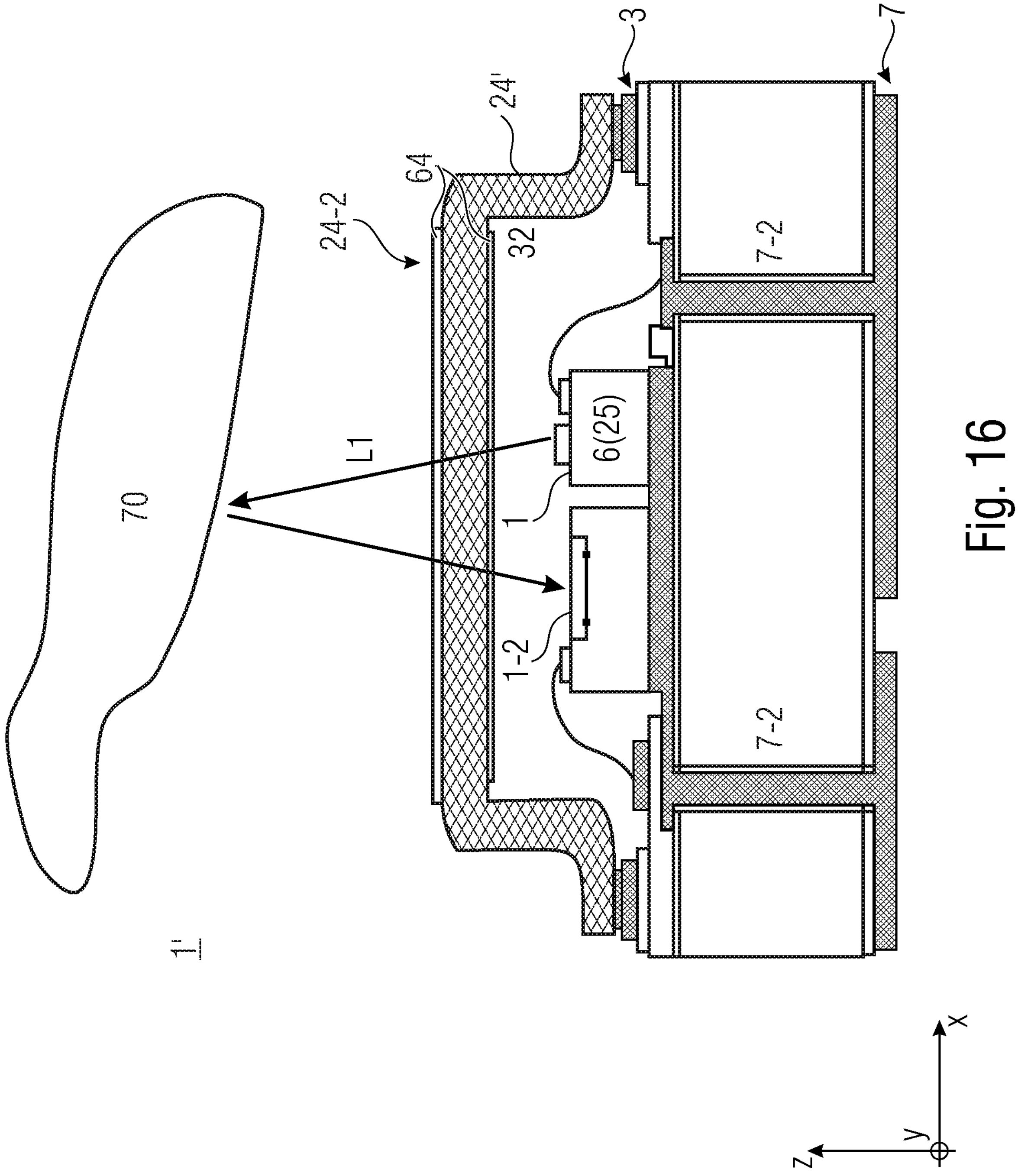

FIG. 16 now shows a further exemplary embodiment for a hermetically housed optoelectronic device 1' according to an embodiment, e.g., manufactured with an above-described method 200. According to an embodiment of the hermetically housed optoelectronic device 1', the cover substrate 20' may optionally be configured such that the upper sidewall 24-2 of the cap element 24' comprises a material that is permeable for transmission and/or reception radiation of the optical device 1, and is provided for coupling and/or decoupling electromagnetic radiation L1.

For example, the housed optoelectronic device 1' comprises a radiation-emitting semiconductor device 1, such as an optoelectronic transmission device, and a radiation-sensitive semiconductor device 1-2, such as an optoelectronic reception device, or a photodiode. The radiation-emitting device is comprises a radiation direction, or main radiation direction (in case of a diverging beam) with the decoupled light beam L1 facing away from the carrier substrate plane (x-y plane).

FIG. 16 therefore shows an embodiment in which further electronic components are integrated into the housing 24' for the laser 1, i.e. in the cavity 32. For example, this is suitable for applications in which one or several additional photodiodes 1-2 are to be provided for monitoring the performance of the radiation-emitting device 1, e.g. the laser 1, or the driver circuits for the radiation-emitting devices 1. In this case, the reception element 1-2 may capture the radiation reflected from the object 70. For example, the optical areas of the window elements 24-2 are again provided with an anti-reflection coating 64.

Thus, in FIG. 16, the drive IC 25 with the transmission element 1, and the monitor photodiode 1-2 are shown in the cavity 32. In the embodiment shown in FIG. 16, the electronic driver circuit 25 is arranged as part of the transmission element 1 in the cavity 32 of the cap element 24'.

Thus, FIG. 16 shows a "top looking" arrangement 1', e.g. for an approximation sensor with radiation and reception of reflected radiation L1 at an object 70 through the upper glass area 24-2 (possibly with compensation layers 64). The sidewalls 24-1 of the cap 24 are part of the housing, but are not used for an optical function. The device 1' may be manufactured according to any one of the above-presented capping methods.

FIGS. 11A-16 show embodiments in which several optoelectronic (e.g. radiation-emitting) devices may be formed in the same housing. This is an example for an implementation for mounting several laser diodes in a housing, e.g. a RGB laser source. For example, three radiation-emitting devices 1 are each mechanically coupled to a device substrate 2' via intermediate carriers. This achieves a favourable heat dissipation. The radiation-emitting devices 1 are each electrically coupled by means of conductor paths 7 and lateral passages 7-2 that are guided out of the cavity 30 through a hermetically sealed bonding frame. It may be favourable to place the respective optical components for the beam conditioning outside of the hermetically sealed housing 5 and in front of the optical window, i.e. the optical areas. For example, these optical components may be cylinder lenses or other types of lenses. Then, these optical components may also include substances that are undesired in the hermetically sealed cavity, such as organic substances.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device. Depending on the specific implementation requirements, embodiments of the invention may be implemented in hardware or in software, or at least partially in hardware and at least partially in software.

In the previous detailed description, different features were partially grouped in examples so as to rationalize the disclosure. This type of disclosure is not to be interpreted as the intention that the claimed examples comprise more features than explicitly indicated in each claim. Rather, as the following claims express, the subject-matter may be found in fewer than all features of an individual disclosed example. Consequently, the following claims are hereby incorporated into the detailed description, wherein each claim may be its own separate example. While each claim may be its own separate example, it is to be noted that, even though dependent claims in the claims refer back to a specific combination with one or several other claims, other examples may also include a combination of dependent claims with the subject-matter of each other dependent claim or a combination of each feature with another dependent or independent claim. Such combinations are to be included, unless it is specifically indicated that a specific combination is not intended. Furthermore, it is intended that a combination of features of a claim with every other independent claim is included, even if this claim is not directly dependent on the independent claim.

Even though specific embodiments were illustrated and describes herein, a person skilled in the art will appreciate that a multitude of alternative and/or equivalent implementations can be replaced for the specific embodiments shown and illustrated, without deviating from the subject-matter of the present application. This application text is to cover all adaptations and variations of the specific embodiments described and discussed herein. This is why the subject-matter of the invention is limited only by the wording of the claims and the equivalent embodiments of the same.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Method, comprising:

providing a mold substrate and a cover substrate that are bonded to each other, wherein a surface region of the mold substrate and/or of the cover substrate is structured so as to form an enclosed cavity between the cover substrate and the mold substrate, tempering the cover substrate and the mold substrate so as to decrease the viscosity of the glass material of the cover substrate, and providing an overpressure in the enclosed cavity compared to the surrounding atmosphere so as to cause, on the basis of the decreased viscosity of the glass material of the cover substrate and the overpressure in the enclosed cavity compared to the surrounding atmosphere, bulging of the glass material of the cover substrate starting from the enclosed cavity up to a stop area, spaced apart from the cover substrate, of a stop element so as to acquire a molded cover substrate with a cap element; and removing the stop element and the mold substrate from the molded cover substrate.

2. Method according to claim 1 for manufacturing a cap substrate for housing one or a plurality of optical devices, wherein the molded cover substrate forms the cap substrate with the one cap element.

3. Method according to claim 1, wherein the cover substrate comprises a single homogenous material so as to form the molded cover substrate from this single homogenous material.

4. Method according to claim 1, wherein providing a mold substrate and a cover substrate comprises:

providing a mold substrate with a structured surface region arranging a cover substrate on the structured surface region of the mold substrate, wherein the cover substrate comprises a glass material, and bonding the cover substrate to the mold substrate so as to form the enclosed cavity between the cover substrate and the mold substrate.

5. Method according to claim 1, wherein providing a mold substrate and a cover substrate comprises:

providing a mold substrate;

arranging a cover substrate with a structured surface region on the mold substrate, wherein the cover substrate comprises a glass material, and bonding the cover substrate to the mold substrate so as to form the enclosed cavity between the cover substrate and the mold substrate.

6. Method according to claim 1, wherein bonding the cover substrate to the mold substrate is carried out in an atmosphere with a defined atmospheric ambient pressure so as to enclose a defined atmospheric pressure into the enclosed cavity.

7. Method according to claim 1, wherein to cover substrate and/or the mold substrate are configured to form the enclosed cavity with a plurality of enclosed cavity regions between the cover substrate and the mold substrate, wherein the enclosed cavity regions are arranged so as to be fluidically separated from each other, or wherein gas exchange channels are further provided between the cavity regions closed off from the ambient atmosphere so as to fluidically couple them to each other to acquire a common defined atmospheric pressure in the coupled cavity regions.

8. Method according to claim 1, wherein tempering and providing an overpressure is performed as glass flow process in a negative-pressure furnace to acquire in the enclosed cavity a defined atmospheric overpressure compared to the surrounding atmosphere.

9. Method according to claim 1, further comprising:

cooling the stop element, the mold substrate, and the molded cover substrate, and subsequently removing the mold substrate by means of an etching process.

10. Method according to claim 8, further comprising:

subsequently removing the stop element by means of an etching processing.

11. Method according to claim 1, wherein, in tempering and providing an overpressure, the cover substrate is bulged-out in the region of the enclosed cavity up to a height specified by the distance of the stop area to the cover substrate.

12. Method according to claim 1, wherein the region, opposite to the cavity or the cavity regions, of the stop area of the stop element is configured to be planar and parallel to the main surface region of the cover substrate so as to form a planar ceiling region of the cap element in tempering and providing an overpressure.

13. Method according to claim 1, wherein, in cooling the molded cover substrate in the temperature range of above 650° C., an atmospheric overpressure is caused in the enclosed cavities compared to the surrounding atmosphere so as to generate a bulging of the sidewall regions of the cap element of the molded cover substrate towards the outside.

14. Method according to claim 13, wherein tempering and providing an overpressure is performed in a negative-pressure furnace, wherein the atmospheric overpressure in the enclosed cavities compared to the surrounding atmosphere is acquired by a decreased atmospheric pressure in the negative-pressure furnace.

15. Method according to claim 1, wherein, in cooling the molded cover substrate in a temperature range above 650° C., an atmospheric negative pressure in the enclosed cavities compared to the surrounding atmosphere is caused so as to generate a bulging of the side wall regions of the cap element of the molded cover substrate towards the inside.

16. Method according to claim 15, wherein tempering and providing an overpressure is performed in a negative-pressure furnace, wherein the atmospheric negative pressure in the enclosed cavities compared to the surrounding atmosphere is further acquired through an increased atmospheric pressure in the negative-pressure furnace.

17. Method according to claim 1, wherein the stop element is configured as reusable tool and comprises a non-stick coating for the glass material of the cover substrate at least at the region, opposite the cavity, of the stop area or at the entire stop area.

18. Method according to claim 1, comprising:

applying a metallization as a frame structure on bonding regions at non-bulged regions of the molded cover substrate.

19. Method according to claim 1, applying an anti-reflection coating on a region of the cap element of the molded cover substrate.

20. Method according to claim 1, wherein, in tempering and providing an overpressure, the side windows and the cap region or the side windows and the socket regions are bulged-out with the glass material of the cover substrate starting from the enclosed cavity up to the spaced-apart stop area of the stop element 40.

21. Method for manufacturing a hermetically housed optical device, comprising:

performing the method for manufacturing a molded cover substrate according to claim 1, providing a device substrate with an optical device arranged thereon, and bonding the molded cover substrate with the device substrate so as to house the optical device.

22. Method according to claim 21, further comprising:

performing the method for manufacturing housed optical devices on the wafer level, wherein multitude of optical devices are arranged on the device substrate, and wherein the molded cover substrate comprises a multitude of cap elements.

23. Method according to claim 21, further comprising bonding the device substrate and the cover substrate along an intermediate bonding region.

24. Method according to claim 23, wherein the bonding region comprises a metallization to configure a frame structure on non-bulged regions of the molded cover substrate, further comprising: bonding the molded cover substrate and the device substrate by means of a bond frame comprising a metallic solder material.

25. Method according to claim 23, further comprising:

bonding the device substrate and the cover substrate by means of direct laser welding, laser soldering, eutectic solder bonding, thermocompression bonding, glass frit bonding, reactive nano-metal layer soldering, or induction soldering along the bonding region.

26. Method according to claim 21, further comprising:

dicing the molded cover substrate so as to acquire diced cap elements, and bonding the diced cap element to a device substrate so as to acquire a housed optical device.

27. Method according to claim 21, further comprising:

bonding the molded cover substrate with the multitude of cap elements to the device substrate comprising a multitude of optical devices so as to acquire a multitude of housed optical devices; and dicing the multitude of housed optical devices to acquire diced hermetically housed optical devices.

28. Method according to claim 21, further comprising:

dicing the molded cover substrate to acquire diced cap elements, dicing the device substrate to acquire diced devices, and bonding the diced cap element to the diced devices to acquire a housed optical device.

29. Hermetically housed optical device manufactured with the manufacturing method according to claim 21, comprising:

an optical device arranged on the device substrate; and a molded integral cover substrate providing a hermetically sealed cover for the optical device, within which the optical device is housed, wherein the molded cover substrate comprises a cap element with a bulged sidewall region between a socket region and a ceiling region.

30. Hermetically housed optical device according to claim 29, wherein the sidewall region and/or the ceiling region of the integral cap element of the molded cover substrate comprises a material that is permeable for transmission and/or reception radiation of the optical device, and for coupling and/or decoupling electromagnetic radiation.

31. Housed radiation-emitting device according to claim 29, wherein the hermetically sealed cover comprises a reactive atmosphere and/or the cavity exclusively comprises inorganic substances, and/or wherein the hermetically sealed cover is hermetically sealed against the introduction of water vapor.

* * * * *